(12) United States Patent
Hofmeister et al.

(10) Patent No.: US 8,662,812 B2
(45) Date of Patent: Mar. 4, 2014

(54) LOAD LOCK FAST PUMP VENT

(71) Applicant: Brooks Automation, Inc., Chelmsford, MA (US)

(72) Inventors: Christopher Hofmeister, Holderness, NH (US); Martin R. Elliot, Pepperell, MA (US); Alexander Krupyshev, Chelmsford, MA (US); Joseph Hallisey, Pepperell, MA (US); Joseph A. Kraus, Pepperell, MA (US); William Fosnight, Saratoga Springs, NY (US); Craig J. Carbone, Lunenburg, MA (US); Jeffrey C. Blahnik, Pepperell, MA (US); Ho Yin Owen Fong, Santa Clara, CA (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 13/625,704

(22) Filed: Sep. 24, 2012

(65) Prior Publication Data
US 2013/0078057 A1    Mar. 28, 2013

Related U.S. Application Data

(63) Continuation of application No. 12/123,365, filed on May 19, 2008, now Pat. No. 8,272,825.

(60) Provisional application No. 60/938,922, filed on May 18, 2007.

(51) Int. Cl.
*H01L 21/67* (2006.01)
*F16K 25/00* (2006.01)

(52) U.S. Cl.
USPC .......................................... 414/217; 251/193

(58) Field of Classification Search
USPC ............................ 414/217, 935; 251/193
See application file for complete search history.

(56) References Cited

U.S. PATENT DOCUMENTS

| | | |
|---|---|---|
| 4,715,921 A | 12/1987 | Maher et al. |
| 4,919,327 A | 4/1990 | Elluin et al. |
| 4,947,789 A | 8/1990 | Hussla et al. |
| 5,000,682 A | 3/1991 | Heidt et al. |
| 5,139,459 A | 8/1992 | Takahashi et al. |

(Continued)

FOREIGN PATENT DOCUMENTS

| | | |
|---|---|---|
| DE | 19633798 | 2/1998 |
| WO | 9919530 | 4/1999 |
| WO | 03/003416 | 1/2003 |
| WO | 03034163 | 12/2003 |

*Primary Examiner* — James Keenan
(74) *Attorney, Agent, or Firm* — Perman & Green, LLP; Colin C. Durham

(57) ABSTRACT

A semiconductor processing tool is disclosed, the tool having a frame forming at least one chamber with an opening and having a sealing surface around a periphery of the opening, a door configured to interact with the sealing surface for sealing the opening, the door having sides perpendicular to the door sealing surface and perpendicular to a transfer plane of a substrate, and at least one drive located on the frame to a side of at least one of the sides that are substantially perpendicular to the door sealing surface and substantially perpendicular to the transfer plane of the substrate, the drive having actuators located at least partially in front of the sealing surface and the actuators being coupled to one of the sides of the door for moving the door from a sealed position. The at least one drive is located outside of a substrate transfer zone.

20 Claims, 37 Drawing Sheets

(56) References Cited

U.S. PATENT DOCUMENTS

| | | |
|---|---|---|
| 5,199,483 A | 4/1993 | Bahng |
| 5,455,082 A | 10/1995 | Saito et al. |
| 5,695,564 A | 12/1997 | Imahashi |
| 5,746,434 A | 5/1998 | Boyd et al. |
| 5,902,088 A | 5/1999 | Fairbairn et al. |
| 5,914,493 A | 6/1999 | Morita et al. |
| 5,972,161 A | 10/1999 | Kim et al. |
| 6,016,611 A | 1/2000 | White et al. |
| 6,045,620 A | 4/2000 | Tepman et al. |
| 6,053,980 A | 4/2000 | Suda et al. |
| 6,056,266 A | 5/2000 | Blecha |
| 6,089,543 A | 7/2000 | Freerks |
| 6,107,212 A | 8/2000 | Fujita |
| 6,110,232 A | 8/2000 | Chen et al. |
| 6,122,566 A | 9/2000 | Nguyen et al. |
| 6,254,328 B1 | 7/2001 | Wytman |
| 6,318,945 B1 | 11/2001 | Hofmeister |
| 6,323,463 B1 | 11/2001 | Davis et al. |
| 6,390,449 B1 | 5/2002 | Ishigaki et al. |
| 6,410,889 B2 | 6/2002 | Davis et al. |
| 6,488,262 B1 | 12/2002 | Oka |
| 6,494,670 B2 | 12/2002 | Kroeker |
| RE38,318 E * | 11/2003 | Brenes .......................... 251/175 |
| 6,672,864 B2 | 1/2004 | Wang et al. |
| 6,688,375 B1 | 2/2004 | Turner et al. |
| 6,764,265 B2 | 7/2004 | Kunze et al. |
| 6,885,206 B2 | 4/2005 | Halley |
| 6,916,009 B2 | 7/2005 | Blecha |
| 6,918,731 B2 | 7/2005 | Talmer |
| 7,193,682 B2 * | 3/2007 | Yonekawa ...................... 355/53 |
| 7,207,766 B2 | 4/2007 | Kurita et al. |
| 7,822,324 B2 | 10/2010 | Anwar et al. |
| 8,047,231 B2 * | 11/2011 | Nishiba .................... 137/625.46 |
| 8,206,075 B2 * | 6/2012 | White et al. ................... 414/217 |
| 8,288,288 B1 * | 10/2012 | Gage et al. ..................... 438/715 |
| 8,448,917 B2 * | 5/2013 | Nagai et al. ................... 251/193 |
| 2003/0012624 A1 | 1/2003 | Kinnard et al. |
| 2003/0167612 A1 | 9/2003 | Kraus et al. |
| 2004/0091349 A1 | 5/2004 | Tabrizi et al. |
| 2005/0045846 A1 | 3/2005 | Iwabuchi |
| 2005/0183823 A1 | 8/2005 | Yonekawa |
| 2006/0026857 A1 | 2/2006 | Kim et al. |
| 2006/0245852 A1 | 11/2006 | Iwabuchi |
| 2007/0209593 A1 | 9/2007 | Aggarwal et al. |
| 2007/0274810 A1 | 11/2007 | Holtkamp et al. |
| 2008/0038095 A1 | 2/2008 | Ostermann et al. |

\* cited by examiner

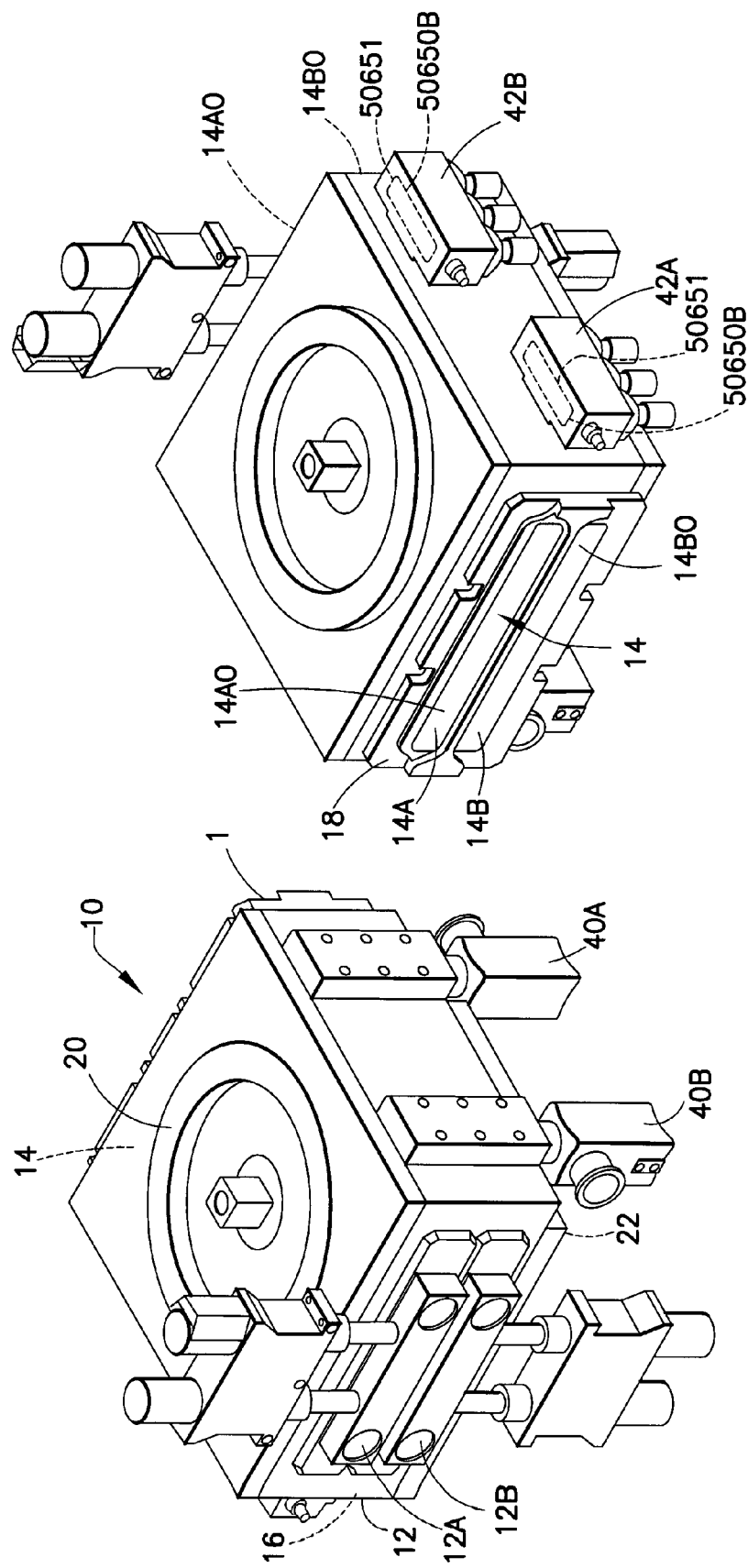

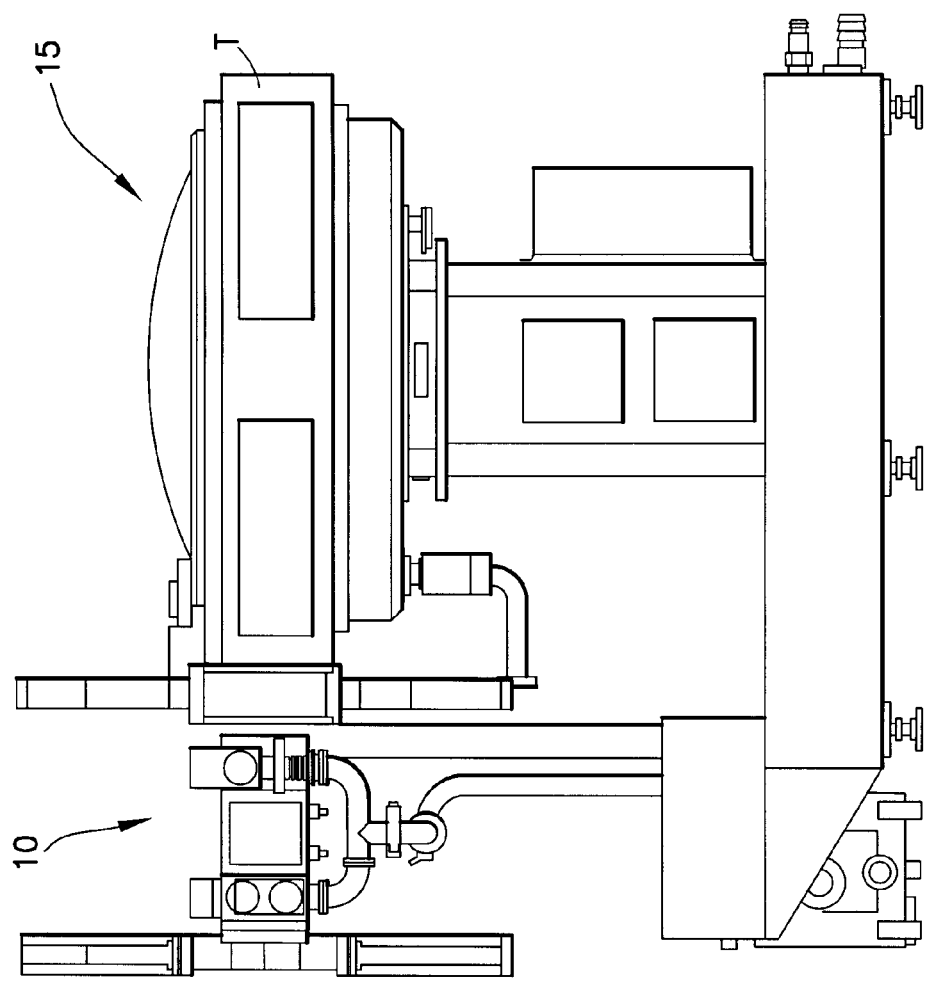

LOAD LOCK FAST PUMP VENT

CROSS-REFERENCE TO RELATED APPLICATION(S)

This application is a continuation of U.S. Non-provisional patent application Ser. No. 12/123,365, filed May 19, 2008 (now U.S. Pat. No. 8,272,825), which claims the benefit of U.S. Provisional Patent Application No. 60/938,922, filed on May 18, 2007, the disclosure of which is incorporated by reference herein in its entirety.

BACKGROUND

1. Field

The exemplary embodiments generally relate to controlled atmosphere environments and, more particularly, to increasing throughput in those environments.

2. Brief Description of Related Developments

Increased efficiencies are sought in the production electronics, and particularly in the production of semiconductor devices that form an even increasing part of electronics.

To optimize throughput of hot wafers using static loadlock cooling shelves, through a cluster tool while minimizing the part count and complexity of the assembly, particularly eliminating any motion/device inside the loadlock. To achieve higher throughputs in a cluster tool, multiple loadlocks modules are used conventionally. This increases equipment complexity and cost to end users.

Generally in semiconductor processing systems atmospheric doors are utilized to seal the wafer slit opening between, for example, a load lock and an atmospheric interface such as that found on an Equipment Front End Module (EFEM) or load port module. The atmospheric doors are generally pneumatically driven in a move vertically into place over the slit opening. The atmospheric doors are then driven into contact with the load lock seal contact surface surrounding the slit opening to seal the opening from an outside atmosphere.

In sealing against the load lock contact surface, worn door seals, faulty door motion and foreign debris can damage the load lock contact surface causing leaks into the load lock chamber when the load lock chamber is pumped down. The repair of the load lock seal contact surface is time and labor extensive in that the surface must be re-machined or sanded to create the original surface condition. The reworking of the seal contact surface can take many hours and cause extensive down time of the processing tool. Where the seal contact surface is beyond repair the load lock is replaced.

It would be advantageous to have an atmospheric door contact surface on a load lock that can be quickly replaced to minimize process tool downtime.

Protection of the substrate from particle contamination during transfer from, for example a process module to a load port module and vice versa in an important task for the manufacture of semiconductor substrates. In order to minimize substrate contamination all of the moving parts of the substrate transport module are generally positioned below the substrate path.

Generally, atmospheric doors and slot valves used on substrate processing equipment including, but not limited to, load locks are located below the substrate transfer plane to minimize substrate airborne particle contamination. In the case of, for example, a stacked or double load lock atmospheric doors and slot valves are mounted on the load lock upside down above the substrate transfer plane such that the door actuators are located in the substrate transfer zone. Having the door actuators above the substrate transfer plane creates a high probability of substrate particle contamination due to the door actuators.

It would be advantageous to have an atmospheric door that has actuators that are not located above substrate transfer plane or within the substrate transfer zone such that substrate particle contamination is minimized.

SUMMARY OF THE EXEMPLARY EMBODIMENTS

In one aspect of the disclosed embodiment, a semiconductor processing tool is disclosed. The semiconductor processing tool having a frame forming at least one chamber with an opening and having a sealing surface around a periphery of the opening, a door configured to interact with the sealing surface for sealing the opening, the door having sides substantially perpendicular to the door sealing surface and substantially perpendicular to a transfer plane of a substrate transferred through the opening, and at least one drive located on the frame to a side of at least one of the sides that are substantially perpendicular to the door sealing surface and substantially perpendicular to the transfer plane of the substrate transferred through the opening, the at least one drive having actuators located at least partially in front of the sealing surface and the drive actuators being coupled to at least one of the sides of the door for moving the door to and from a sealed position. The at least one drive is located outside of a substrate transfer zone for transferring substrates into and out of the at least one chamber through the opening.

BRIEF DESCRIPTION OF THE DRAWINGS

The foregoing aspects and other features of the exemplary embodiment are explained in the following description, taken in connection with the accompanying drawings, wherein:

FIGS. 1A-1B are schematic perspective views of a substrate processing chamber module, incorporating features in accordance with an exemplary embodiment shown from different perspective directions;

FIG. 6 is an elevation view of the module connected to another section of a processing tool in accordance with another exemplary embodiment;

DETAILED DESCRIPTION

Figure 1D:
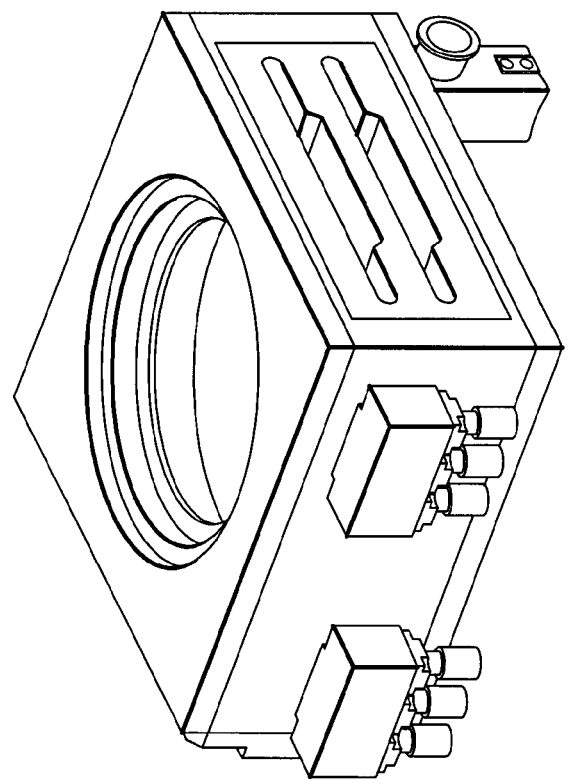
FIGS. 1C-1E are other schematic perspective views of the module from other directions.

Referring to FIGS. 1A-1B, there is respectively shown schematic perspective views of a substrate processing module 10 incorporating features in accordance with an exemplary embodiment. Although the embodiments disclosed herein will be described with reference to the embodiments shown in the drawings, it should be understood that the embodiments can be embodied in many alternate forms. In addition, any suitable size, shape or type of elements or materials could be used.

As may be realized from FIGS. 1A-1B, the module 10 may have a general configuration allowing the module to be mated to a desired number of sections of a processing tool capable of performing one or more desired processes (such as material deposition, etching, lithography, ion implant, cleaning, polishing, etc) to substrates. The substrates may be of any suitable type such as 200 mm, 300 mm, 450 mm dia semiconductor wafers, reticles, pelicles or panels for flat panel displays. The module in the exemplary embodiment shown in FIGS. 1A-1B, may be a load lock module, though in alternate embodiments the module may be of any suitable type. The configuration of the module in the exemplary embodiment illustrated is exemplary and in alternate embodiments the load lock module may have any other desired configuration.

Figure 2:
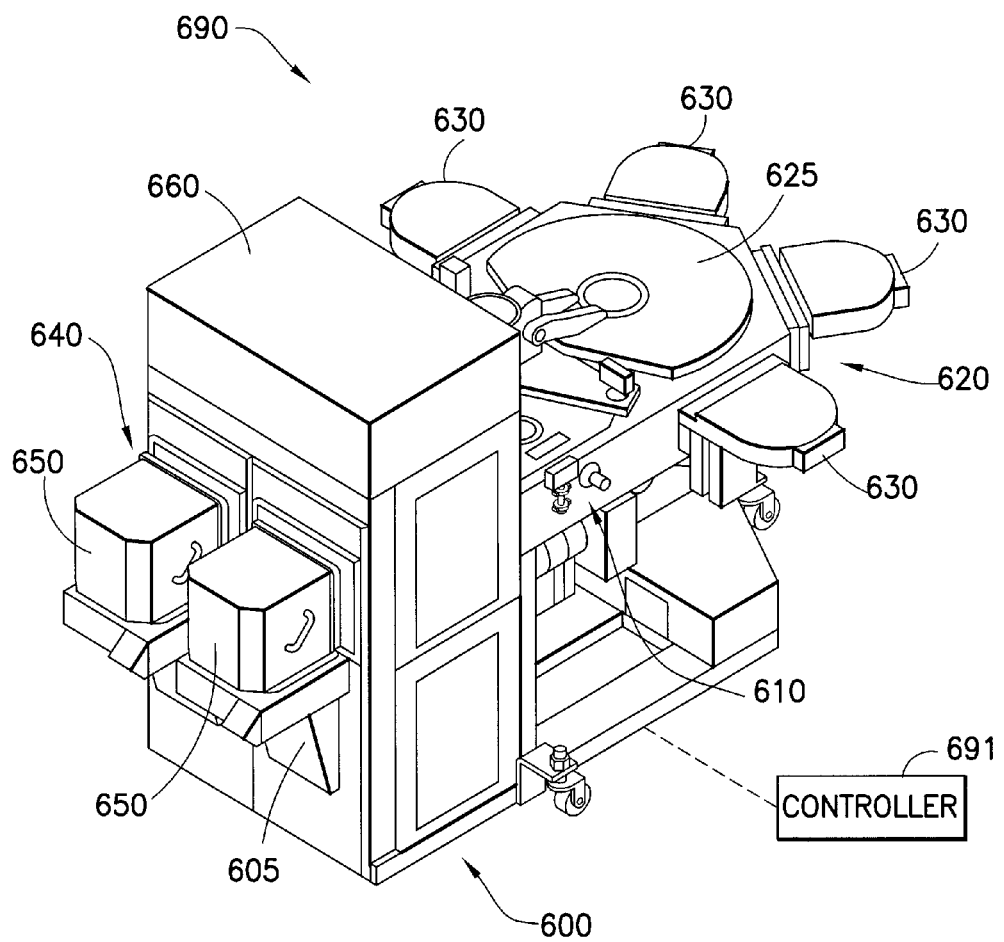
FIGS. 2 and 3 illustrates schematic views of substrate processing tools incorporating aspects of the exemplary embodiments.
Figure 3:
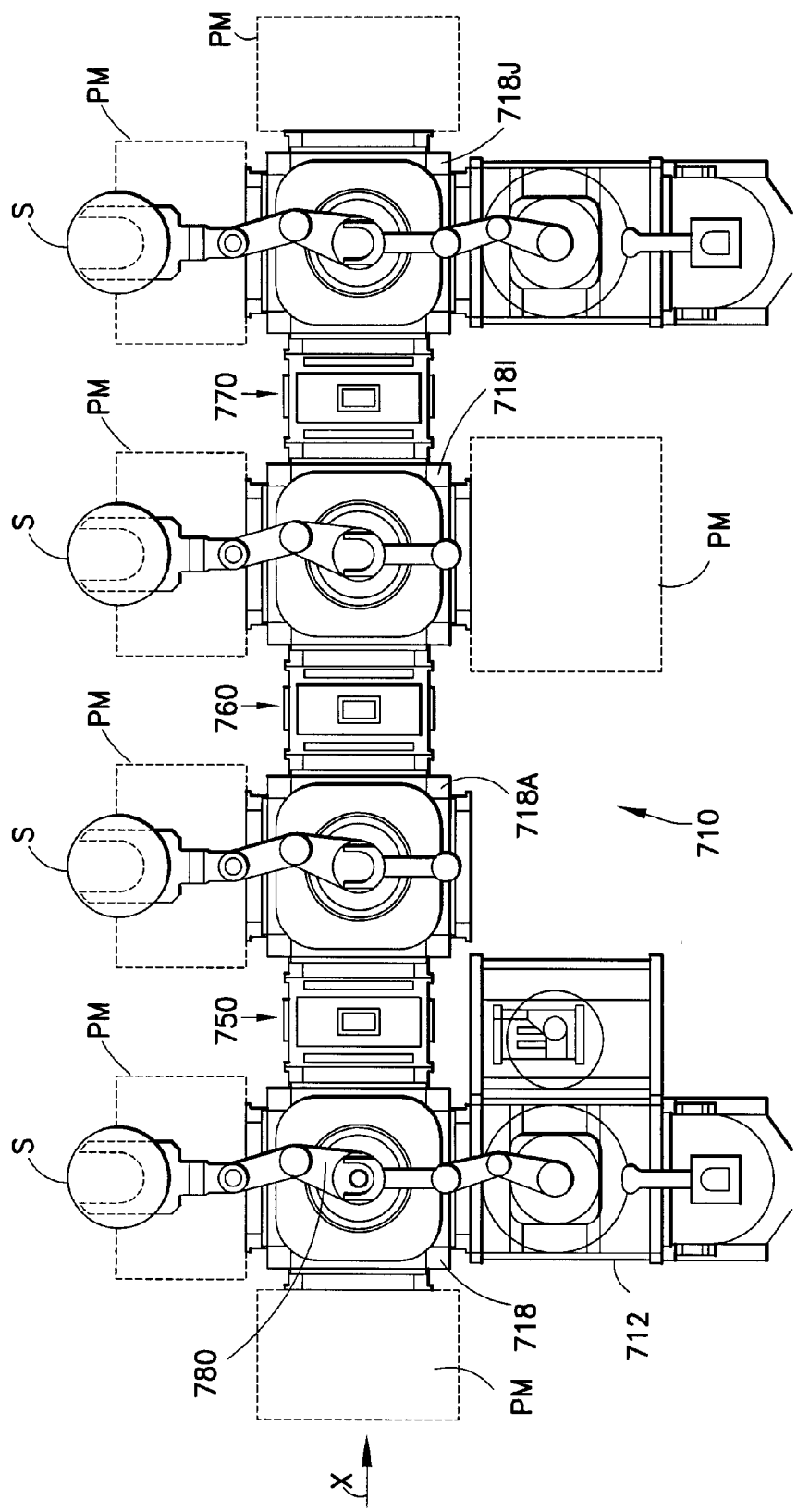

In one embodiment, the load lock module(s) 10 may communicate between different sections of a processing tool as can be seen in FIGS. 2 and 3. Each of the different sections, for example, may have different atmospheres (e.g. inert gas on one side and vacuum on the other, or atmospheric clean air on one side and vacuum/inert gas on the other). As can be seen in FIG. 2, a processing apparatus, such as for example a semiconductor tool station 690 is shown in accordance with an exemplary embodiment. Although a semiconductor tool is shown in the drawings, the embodiments described herein can be applied to any tool station or application employing robotic manipulators. In this example the tool 690 is shown as a cluster tool, however the exemplary embodiments may be applied to any suitable tool station such as, for example, a linear tool station such as that shown in FIG. 3 and described in U.S. patent application Ser. No. 11/442,511, entitled "Linearly Distributed Semiconductor Workpiece Processing Tool," filed May 26, 2006, the disclosure of which is incorporated by reference herein in its entirety. The tool station 690 generally includes an atmospheric front end 600, a vacuum load lock 610 and a vacuum back end 620. In alternate embodiments, the tool station may have any suitable configuration. The components of each of the front end 600, load lock 610 and back end 620 may be connected to a controller 691 which may be part of any suitable control architecture such as, for example, a clustered architecture control. The control system may be a closed loop controller having a master controller, cluster controllers and autonomous remote controllers such as those disclosed in U.S. patent application Ser. No. 11/178,615, entitled "Scalable Motion Control System," filed Jul. 11, 2005, the disclosure of which is incorporated by reference herein in its entirety. In alternate embodiments, any suitable controller and/or control system may be utilized.

In the exemplary embodiments, the front end 600 generally includes load port modules 605 and a mini-environment 660 such as for example an equipment front end module (EFEM). The load port modules 605 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In alternate embodiments, the load port modules may be configured as 200 mm wafer interfaces or any other suitable substrate interfaces such as for example larger or smaller wafers or flat panels for flat panel displays. Although two load port modules are shown in FIG. 2, in alternate embodiments any suitable number of load port modules may be incorporated into the front end 600. The load port modules 605 may be configured to receive substrate carriers or cassettes 650 from an overhead transport system, automatic guided vehicles, person guided vehicles, rail guided vehicles or from any other suitable transport method. The load port modules 605 may interface with the mini-environment 660 through load ports 640. The load ports 640 may allow the passage of substrates between the substrate cassettes 650 and the mini-environment 660. The mini-environment 660 generally includes a transfer robot (not shown) for transporting the substrates from the cassettes 650 to, for example, the load lock 610. In one embodiment the transfer robot may be a track mounted robot such as that described in, for example, U.S. Pat. No. 6,002,840, the disclosure of which is incorporated by reference herein in its entirety. The mini-environment 660 may provide a controlled, clean zone for substrate transfer between multiple load port modules.

The vacuum load lock 610 may be substantially similar to module 10 of FIGS. 1A-1F and may be located between and connected to the mini-environment 660 and the back end 620. The substrate holding chamber(s) of the load lock 610 generally includes atmospheric and vacuum slot valves in a manner substantially similar to valves 12, 13 (see FIG. 4A) described below. As may be realized, while the slot valves are shown in the drawings as being in-line or about 180 degrees from each other, in alternate embodiments the slot valves may be located about 90 degrees apart so as to form a substrate transport path having substantially about a 90 degree angle. In still other alternate embodiments the slot valves may have any suitable spatial relationship with each other. Each slot valve of the chamber(s) may be independently closable by a suitable door(s) of the slot valve. The slot valves may provide the environmental isolation employed to evacuate the load lock 610 after loading a substrate from the atmospheric front end 600 and to maintain the vacuum in the transport chamber 625 when venting the lock with an inert gas such as nitrogen. Referring to FIG. 2, in one exemplary embodiment the load lock 610 may also include an aligner for aligning a fiducial of the substrate to a desired position for processing. In alternate embodiments, the vacuum load lock may be located in any suitable location of the processing apparatus and have any suitable configuration including any suitable substrate processing equipment.

The vacuum back end 620 generally includes transport chamber 625, one or more processing station(s) 630 and a transfer robot (not shown). The transfer robot may be located within the transport chamber 625 to transport substrates between the load lock 610 and the various processing stations 630. The processing stations 630 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 630 are connected to the transport chamber 625 to allow substrates to be passed from the transport chamber 625 to the processing stations 630 and vice versa.

Referring now to FIG. 3, another exemplary substrate processing tool having different sections is shown 710. In this example, the processing tool is a linear processing tool where the tool interface section 712 is mounted to a transport chamber module 718 so that the interface section 712 is facing generally towards (e.g. inwards) but is offset from the longitudinal axis X of the transport chamber 718. The transport chamber module 718 may be extended in any suitable direction by attaching other transport chamber modules 718A, 718I, 718J to interfaces 750, 760, 770 as described in U.S. patent application Ser. No. 11/442,511, previously incorporated herein by reference. The interfaces 750, 760, 770 may be substantially similar to the load lock 10 described herein. Each transport chamber module 718, 719A, 718I, 718J includes a suitable substrate transport 780 for transporting substrates throughout the processing system 710 and into and out of, for example, processing modules PM. As may be realized, each chamber module may be capable of holding an isolated or controlled atmosphere (e.g. N2, clean air, vacuum). In alternate embodiments, the transport chamber modules 718, 719A, 718I, 718J may include features of the load lock 10 as described herein.

Figure 1C:
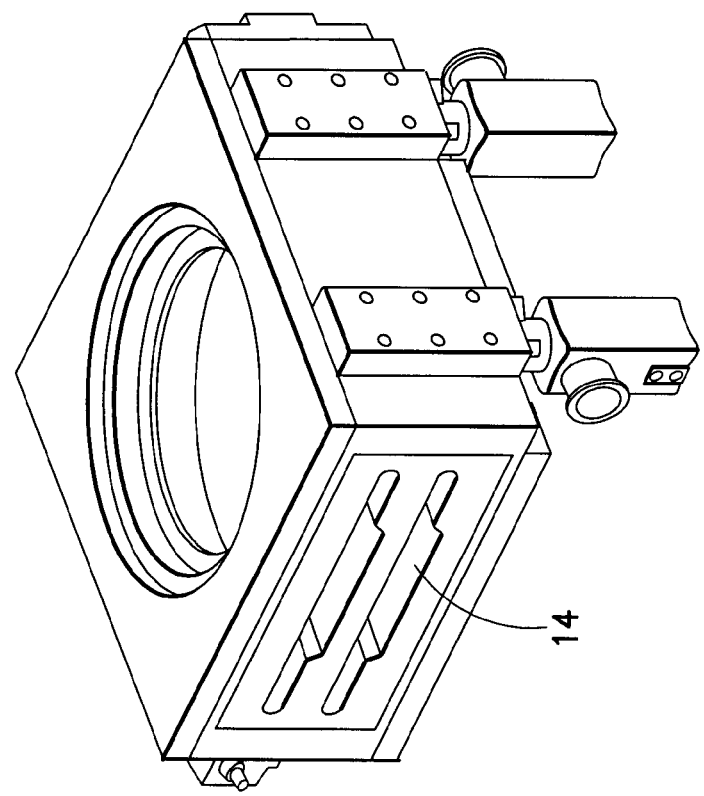
Figure 1E:
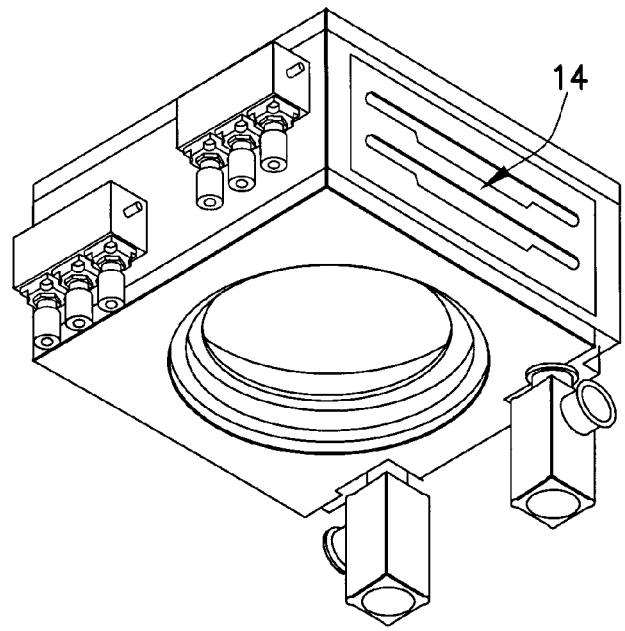

Referring back to FIGS. 1A and 1B, as noted above, the load lock module 10 may communicate between different sections (not shown) of a processing tool each for example with different atmospheres (e.g. inert gas on one side and vacuum on the other, or atmospheric clean air on one side and vacuum/inert gas on the other). The load lock modules 10 may define a number of substrate holding chambers 14A, 14B therein (collectively referred to as chambers 14), as will be described further below, for example each capable of being isolated and capable of having the chamber atmospheres cycles to match atmospheres in the tool sections adjoining the module. Although only two substrate holding chambers 14A, 14B are shown in the figures, it should be understood that the load lock modules 10 may have more or less than two substrate holding chambers. In the exemplary embodiment the load lock module chamber(s) 14 may be compact allowing for rapid cycling of the chamber atmosphere as will be described in greater detail below. Referring now also to FIGS. 1C-1E, the substrate holding chamber(s) 14 may have substrate transport opening(s) 16, 18 on the sides of the module. The location of the transport openings 16, 18 shown in the figures is merely exemplary, and in alternate embodiments the chamber may communicate with openings in any other desired sides of the modules (such as the adjacent sides). Each transport opening of the chamber(s) may be independently closable by a suitable door(s) slot valves 12, 13.

Figure 4A:
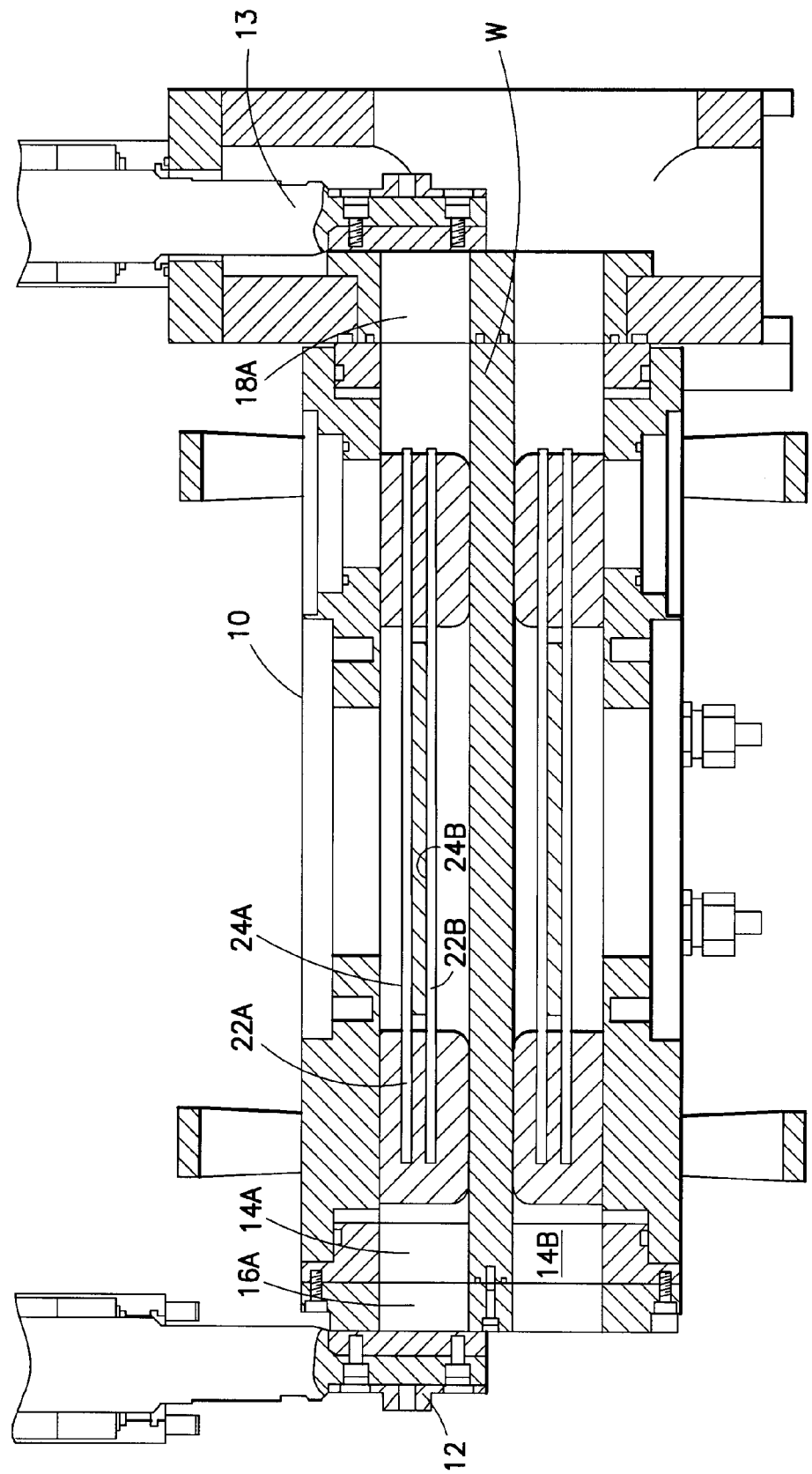
FIGS. 4A-4B are respectively a cross-sectional view and enlarged partial cross sectional view of the module.
Figure 4B:
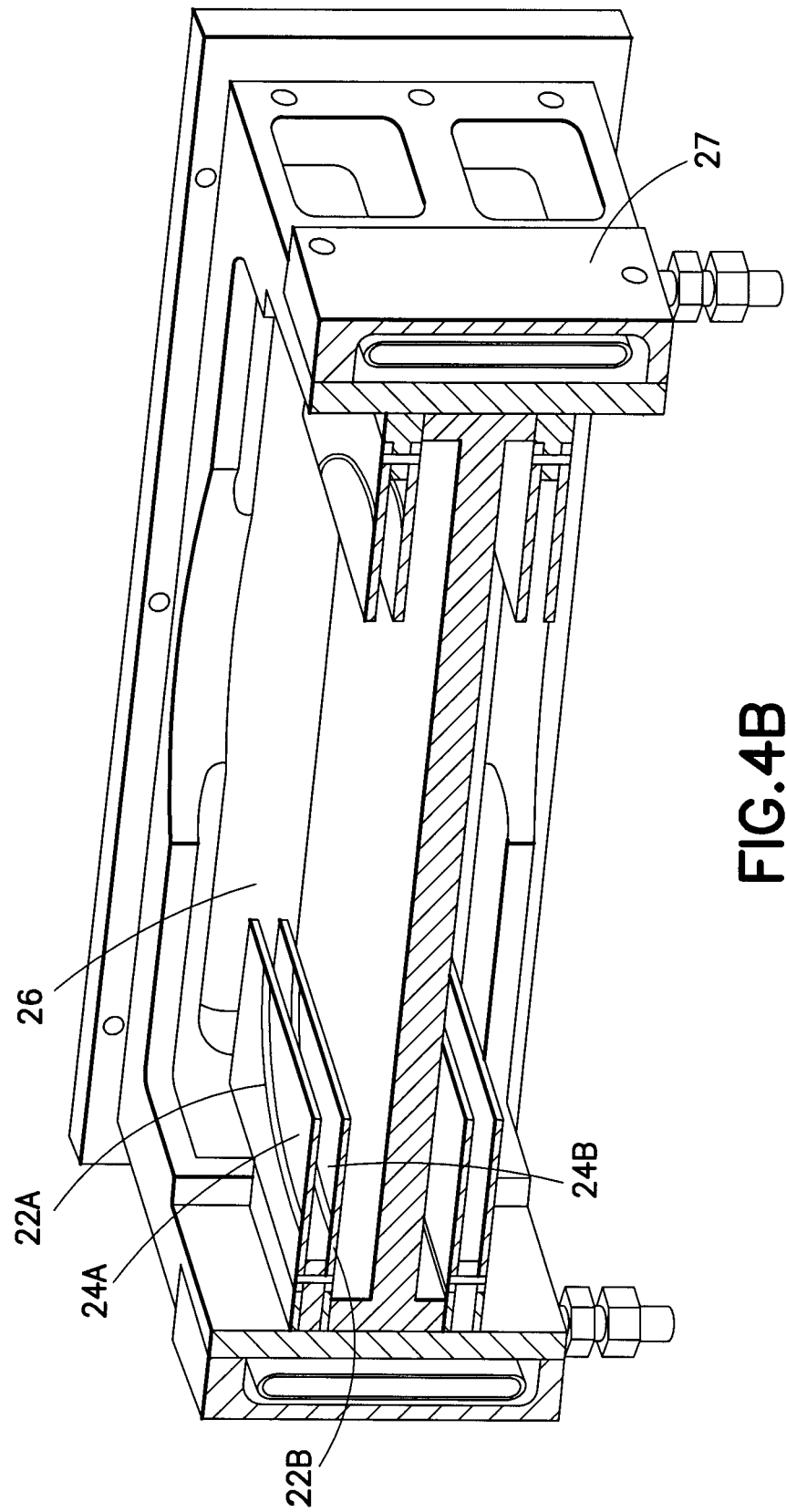

Referring now also to FIGS. 4A-4B, respectively showing cross-sectional view of the module 10, in the exemplary embodiment the internal module may define two or more independently isolable and cyclable substrate holding chambers 14A, 14B. In the exemplary embodiment, the chambers are disposed in a stacked arrangement. Both chambers may be compact chambers, as will be described below. In alternate embodiments, the integral module may have more or fewer chambers. In the exemplary embodiments, the chambers may each have independently closable transport openings, such as by suitable valves 12, 13 (for example atmospheric and vacuum slot valves), in common sides of the module. Accordingly, the transport direction of substrates through each chamber are along substantially parallel axes. In alternate embodiments, the chambers may have corresponding transport openings on different sides of the modules. In the exemplary embodiment, the valves (which for example may be configured as removably connectable (e.g. bolt on) modules, may be located exterior to the chamber portions defined by the module.

Still referring to FIGS. 4A-4B, as described above, in the exemplary embodiment the interior of the module 10 may define two or more independently isolatable and/or cyclable substrate holding chambers 14A, 14B disposed in a stacked arrangement. In alternate embodiments the chambers may be disposed side by side or in any other suitable spatial relationship relative to each other. Both chambers 14A, 14B may be compact chambers, as noted above. In alternate embodiments, the integral module may have more or fewer chambers. In the exemplary embodiments, the chambers may each have independently closable transport openings 14AO, 14BO (see FIG. 1B), such as by suitable valves 12, 13 (for example atmospheric and vacuum slot valves), in respective sides of the module. Accordingly, the transport directions of substrates through each chamber are along substantially parallel axes. In one exemplary embodiment, the chambers 14A, 14B may be configured so that the transport direction of substrates through each of the chambers 14A, 14B is bi-directional. In other exemplary embodiments, the chambers may be configured so that a transport direction of substrates through one of the chambers 14A, 14B is different than a transport direction of substrates through the other one of the chambers 14A, 14B. As a non-limiting example, chamber 14A may allow for the transfer of substrates from a front end unit to a processing chamber of a back end of a processing tool while chamber 14B allows for the transfer of substrates from the processing chamber to the front end unit. In alternate embodiments, the chambers may have corresponding transport openings on different sides of the modules as described above with respect to FIGS. 2 and 3. Each of the chambers 14A, 14B and their respective slot valves 12, 13 may be independently operable so that, for example, as substrates are cooled in one chamber 14A, 14B, substrates can be placed in or removed from the other chamber 14A, 14B.

In the exemplary embodiment the valves 12, 13, which for example, may be configured as removably connectable (e.g. bolt on or other suitable releasable connection) modules, may be located exterior to the chamber portions 14A, 14B defined by the module 10. In alternate embodiments, the valve modules may be removably integrated within a wall of the module 10 as will be described below in greater detail. In other alternate embodiments the valves or a portion of the valves may not be removable from the module 10.

Figure 1F:
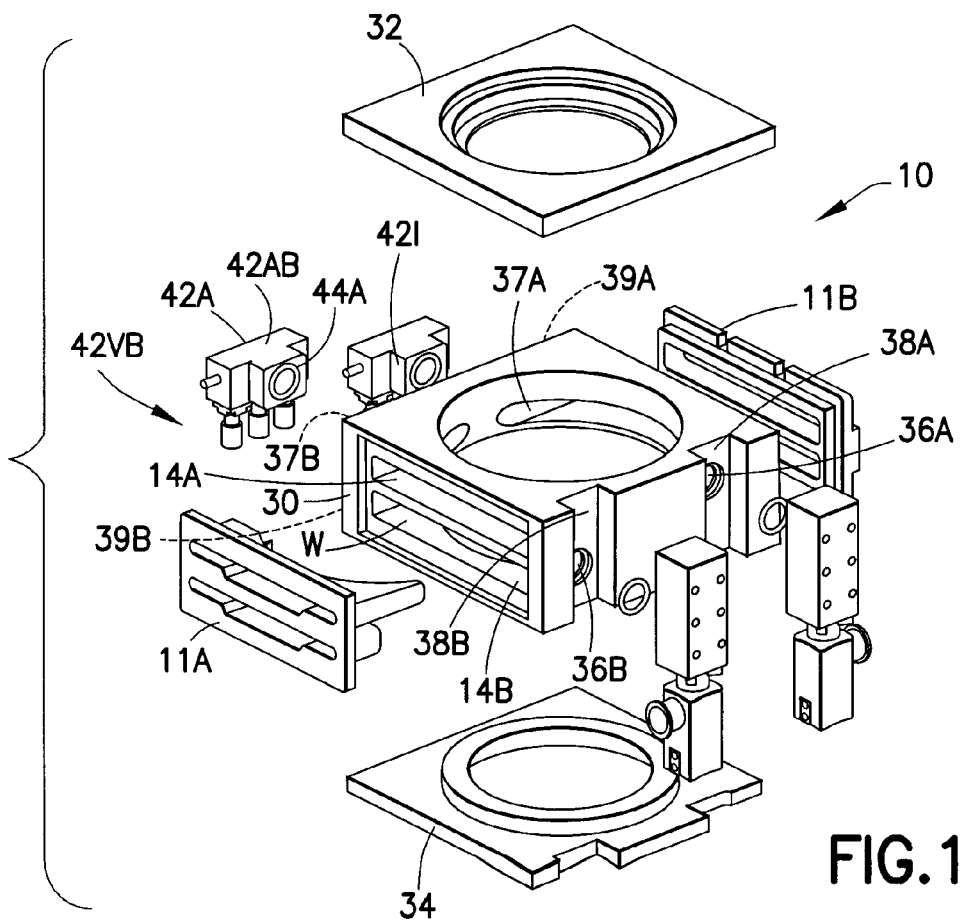
FIG. 1F is an exploded view of the module.

Referring also to FIG. 1F, there is shown an exploded view of the module 10 (upper and bottom closures 20, 22 are not shown for clarity). In the exemplary embodiment, the module may comprise a general core or skeletal frame section 30, and top and bottom cover section 32, 34. In the exemplary embodiment, the frame section 30 may be a one piece member (e.g. of unitary construction) made of any suitable material such as aluminum alloy. In alternate embodiments, the frame section may be an assembly, and may be made of any suitable materials or number of sections. As seen in FIG. 1F, in the exemplary embodiments the frame section 30 may generally define the module exterior surfaces as well as the bounds of the chambers defined therein. A web member W, as seen in FIGS. 1F and 4A, may section the module 10 to form the chamber stack. In alternate embodiments the chamber may have more than one web member W. In other alternate embodiments the chamber stack may be formed in any suitable manner. For example, the module 10 may have a general opening into which a chamber sub-module may be fit where the chamber sub-module includes a chamber stack having any suitable number of chambers. As may be realized, the chambers 14A, 14B may be respectively closed at the top and bottom by closures 32, 34 which may be mated to the frame 30 using any desirable connection including, but not limited to, mechanical, electrical and/or chemical fasteners. Interfaces for the slot valves 12, 13 may be mated to the frame 30 in any suitable manner, such as that shown in the figures and described below in greater detail. As may be realized, the load lock module 10 is a communication module serving for through transfer of substrates between tool sections linked by the load lock module 10. Accordingly, the height of the module 10 may be related to the height of adjoining sections or modules, and may be dependent on such factors as the z axis travel of substrate transport apparatus in the adjoining module (responsible for through put via the load lock module and which in turn may be delimited by such factors as size or z-drive and/or structural consideration of the module). An example of the relationship between through module 10 and rotating module 15 illustrated in FIG. 6 which shows load lock module 10 mated to a substrate transport chamber 7 of a cluster tool. As may be realized, providing module 10 with a larger height than the available z-travel of the transport apparatus, may result in an unstable load lock volume increasing pump down/vent times. Similarly, providing a module height smaller than the available z-travel fails to use the whole travel bandwidth available from the transport apparatus, and thus unduly restricted through put of the load lock module. In the exemplary embodiment, the features of the load lock chamber (s) 14A, 14B, result in a configuration with a height that enables a stack of load lock chambers to be defined within the module 10. As noted before, and shown in FIGS. 4A-4B, in the exemplary embodiments two load lock chambers 14A, 14B are formed in stacked arrangement in the module 10, though in alternate embodiments the load lock chamber stack in the unitary module may include more (or less) load lock chambers, such as three or more. As may be realized, providing multiple independent load lock chambers 14A, 14B, within the compact space envelope of the common module 10, generates multiple independent and unconstrained transport paths through the common module 10, with a commensurate increase in through put of the module 10. In the exemplary embodiment illustrated in FIGS. 1A-1E, each load lock chamber 14A, 14B may be generally similar to each other. In one exemplary embodiment the load lock chambers 14A, 14B may have opposite hand configurations along the mid-plane separating the load locks. In alternate embodiments, the load locks may be different, such as to handle different sizes and or types of substrates. The module 10, as shown in FIG. 1F, may have a modular arrangement, enabling the load lock to be built out in similar or different configurations by installing desired modules. In the exemplary embodiment, the load lock chambers 14A, 14B may have a height sufficient to hold a number of stacked substrates (in FIGS. 4A-4B two substrates are shown, for example, in each chamber). In alternate embodiments, the load lock chambers 14A, 14B may be capable of holding more or fewer stacked substrates as desired.

Referring again to FIGS. 4A-4B, in the exemplary embodiment each of the load lock chambers 14A, 14B may have a heating or cooling device, or both, to heat or cool the substrates held in the load lock as the load lock atmosphere is cycled. A suitable example of a load lock having cooling/heating features will be described below. As seen in FIG. 4A, in the exemplary embodiment, each load lock may have support shelves 22A, 22B for thermally operating on the substrates via conduction for example. In the exemplary embodiment, the support shelves 22A, 22B may be configured for cooling the substrates, such as for example during load lock venting. For example, the support shelves may be connected to a suitable thermal sink such as for example, cooling block 27 in any desired manner to define a substrate cooling surface 24A, 24B, for example on the upper surface of each support shelf 22A, 22B. In one example, the cooling block 27 may include radiative fins (not shown) for providing heat transfer from the substrate cooling surface 24A, 24B while in other examples, the cooling block may have a cooling fluid flowing therein for drawing heat from the substrate cooling surface 24A, 24B. In still other examples, the cooling block 27 may have a combination of radiative fins and cooling fluid flow. In alternate embodiments the support shelves may have a substrate heating surface. In still other alternate embodiments the load lock may be configured to heat the gas or gases within the load lock as described herein.

Figure 5A:
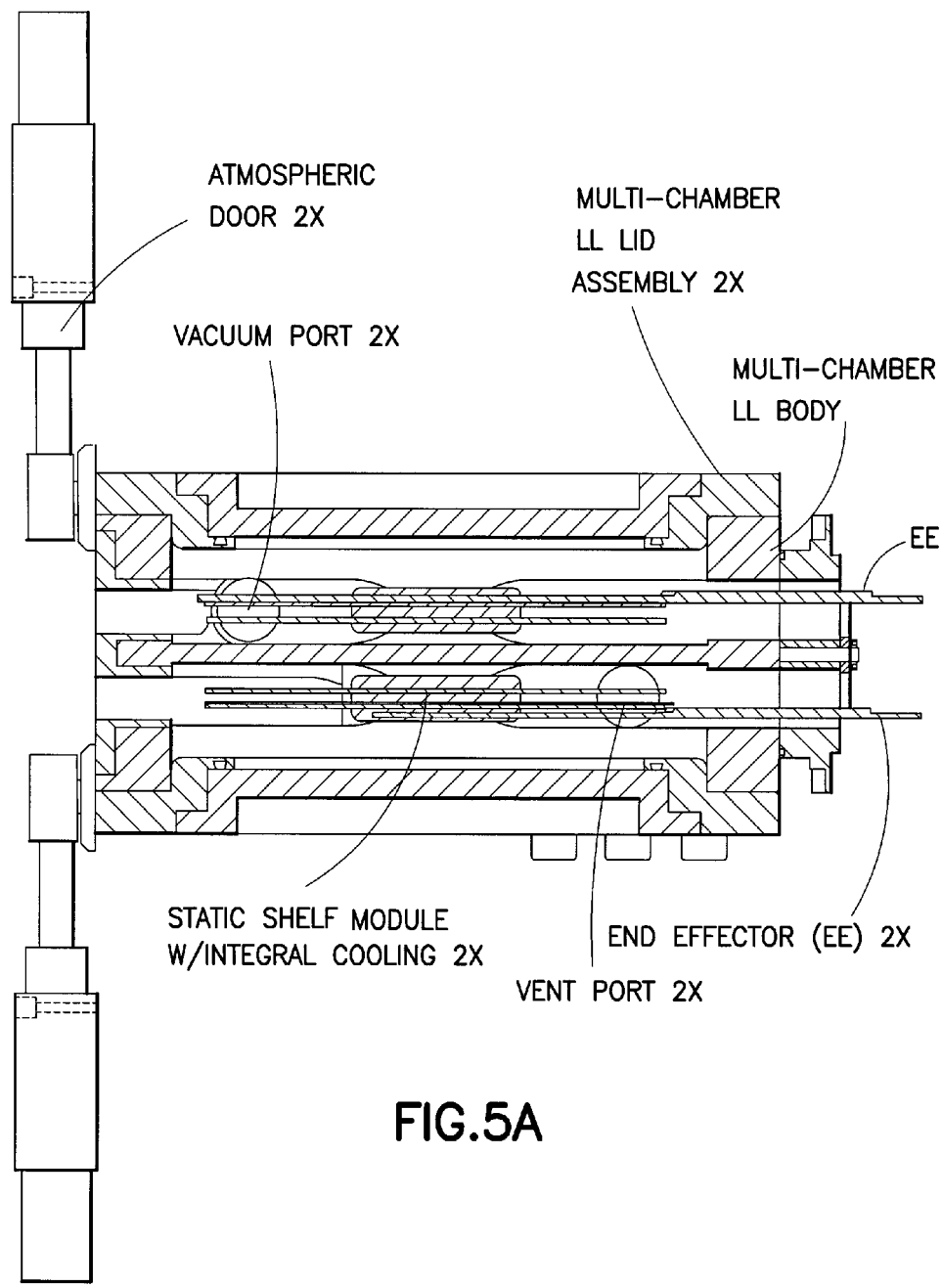
FIGS. 5A-5B are other cross sectional views of the module and a substrate transport apparatus in accordance with another exemplary embodiment.

In the exemplary embodiment, each load lock has two support shelves 22A, 22B with cooling surfaces 24A, 24B (though as noted before more or fewer wafer cooling surfaces may be provided). As may be realized, thermal exchange via conduction between substrates and cooling surfaces of support shelves 22A, 22B may be effected by seating the substrate(s) on the cooling surface(s) 24A, 24B of the support shelves 22A, 22B. In the exemplary embodiment, the support shelves may be a solid state device (e.g. without actuale/moving mechanical components). As may be realized, this provides the support shelves 22A, 22B with a minimized profile and pitch (and hence contributing to the compact height of the load lock chamber). By way of example, the support shelves 22A, 22B may be fixed or stationary relative to the frame section 30 and have a pitch of about 10 mm, sufficient to allow substrates to be picked from and placed directly in a seated position onto the cooling surface 24A, 24B with the end effector EE of a transport apparatus transferring substrates to and from the load lock chambers 14A, 14B (see also FIGS. 5A-5B and 6). In alternate embodiments the shelves may have any suitable pitch. In other exemplary embodiments the support shelves 22A, 22B may be movable relative to the frame section 30 so that the pitch of the shelves can be adjusted depending on a predetermined distance between the shelves 22A, 22B. As seen best in FIG. 4B, the support shelves 22A, 22B may be arranged to form a pass-through gap 26 for the end effector EE. In the exemplary embodiment, the support shelves 22A, 22B may be sectioned forming gap 26 in between sufficient to accommodate the end effector blade. As may be realized, the gap 26 allows end effector z motion to pick and place substrates on the cooling surface. By way of example, the end effector EE may be capable of substantially simultaneously placing substrates on the cooling surfaces 24A, 24B of the support shelves 22A, 22B (in one of the stacked load locks). For example the substrates may be simultaneously cooled, as the load lock chamber is being vented. The cooled substrates may be substantially simultaneously picked and transported from the load lock 22A. As the substrates are cooled in one load lock chamber 14A, 14B, operations in the other load lock chamber 14A, 14B (of the load lock module 10) may be performed in a substantially unconstrained manner. In alternate embodiments, the operations performed in each of the load lock chambers may be chronologically linked to each other in any suitable manner.

Referring again to FIGS. 1A-1B, in the exemplary embodiment each load lock chamber 14A, 14B (see also FIGS. 4A, 4B) may have corresponding vacuum control valves 40A, 40B and vent valves 42A, 42B (such as with or without a diffuser) enabling independent cycling of the respective load lock atmospheres. In the exemplary embodiment, the vacuum control valves 40A, 40B and vent valves 42A, 42B may be arranged in modules that may be interchangeable with each other as will be described below. Referring now again to FIG. 1F, in the exemplary embodiment section 30 may have ports 36A, 36B, 37A, 37B, formed therein. The ports may define respective vacuum ports 36A, 36B, and vent ports 37A, 37B in each of the load lock chambers 14A, 14B. The arrangement of the vent and vacuum ports shown in the figures is exemplary, and in alternate embodiments the vent and vacuum ports may have any other suitable arrangement. In the exemplary embodiment, vacuum ports 36A, 36B may be located on one side of the module 10, and the vent ports 37A, 37B may be located in a different side of the module 10. In alternate embodiments the vent and vacuum ports may be located on the same side of the module. As seen in FIG. 1F the vacuum and vent ports 36A, 37A, 36B, 37B for the respective load locks 14A, 14B may be vertically offset from each other. In alternate embodiments the vacuum and vent ports may be vertically in line with each other or have any other suitable spatial relationship with each other. Each of the ports may have a suitable mating interface (e.g. surrounding the port) to facilitate connection of the desired vacuum or vent valve to the port (and hence the module). In the exemplary embodiment, two or more of the mating interfaces 38A, 38B, 39A, 39B, for the respective ports may be configured to have a substantially similar mating arrangement (e.g. mapping flanges, sealing surfaces, bolting pattern) allowing any valve with a complementing mating interface to mate with the mating interface of either port. By way of example, as seen best in FIGS. 1B and 1F, the vent valves may be integrated into vent valve modules 42A, 42B, each having a similar mating interface 42I allowing either module to be interchangeably mounted to the vent port interface of either chamber. In the exemplary embodiment, the vent valve modules 42A, 42B, which may have a pressure casing or boot of unitary construction, may include vent valve bodies 42VB providing different flow rates or control configurations (e.g. a throttling valve and/or different capacity case valves). It is noted that while the exemplary embodiments may be described with respect to separate vent and vacuum ports, in other exemplary embodiments, the valves may be configured to vent and pump out the chamber through a single port. For example, the valves may be configured with suitable valving characteristics to switch between a vacuum source and a venting source. In other alternate embodiments each module may have a vent and vacuum port so that the chamber(s) can be vented and/or pumped down with a single vent/vacuum module.

In the example shown, the vent valve module casing 42A, 42B allows installation of, for example, three valve bodies 42VB that may have a common source and common exhaust. The valve module 42A, 42B, as may be realized, may be configurable to provide any desired number of valve bodies 42VB to achieve any desired predetermined valving profile. In alternate embodiments, the module body 42A, 42B may be capable of accommodating more or fewer valves therein. Different exemplary embodiments of the vent modules 42A, 42B, 42A' are shown in FIGS. 1A-1F, and 8A-8D. As may be realized, the embodiments of the vent modules shown in the Figures are for illustrative purposes only and the vent modules may have any suitable module body 42AB configuration for connecting the vent modules to, for example, the gas inlet, valve bodies 42VB, and diffuser 44A. The different modules however, with different module bodies 42AB and valves 42VB included therein, may share a common mating interface arrangement 42I and hence allow interchangeability of the vent modules 42A, 42B, 42A' at the load lock chamber 10. In the exemplary embodiment, the vent valve module 42A, 42B may also include a suitable diffuser 44A, which for example may be positioned so that, upon mounting of the valve module 42A, 42B to the vent port 37A, 37B of the load lock chamber, the diffuser 44A may be located substantially at or near the exhaust plane of the vent port into the load lock chamber. In one embodiment the vent valve module 42A, 42B may be configured to accept and/or secure the diffuser 44A in a recess (or other suitable cavity or slot in the module body 42AB). In alternate embodiments, the diffuser may be incorporated or fit into, for example, a wall of the load lock 10 at for example, vent ports 36A, 37A, 36B, 37B.

Figure 7A:
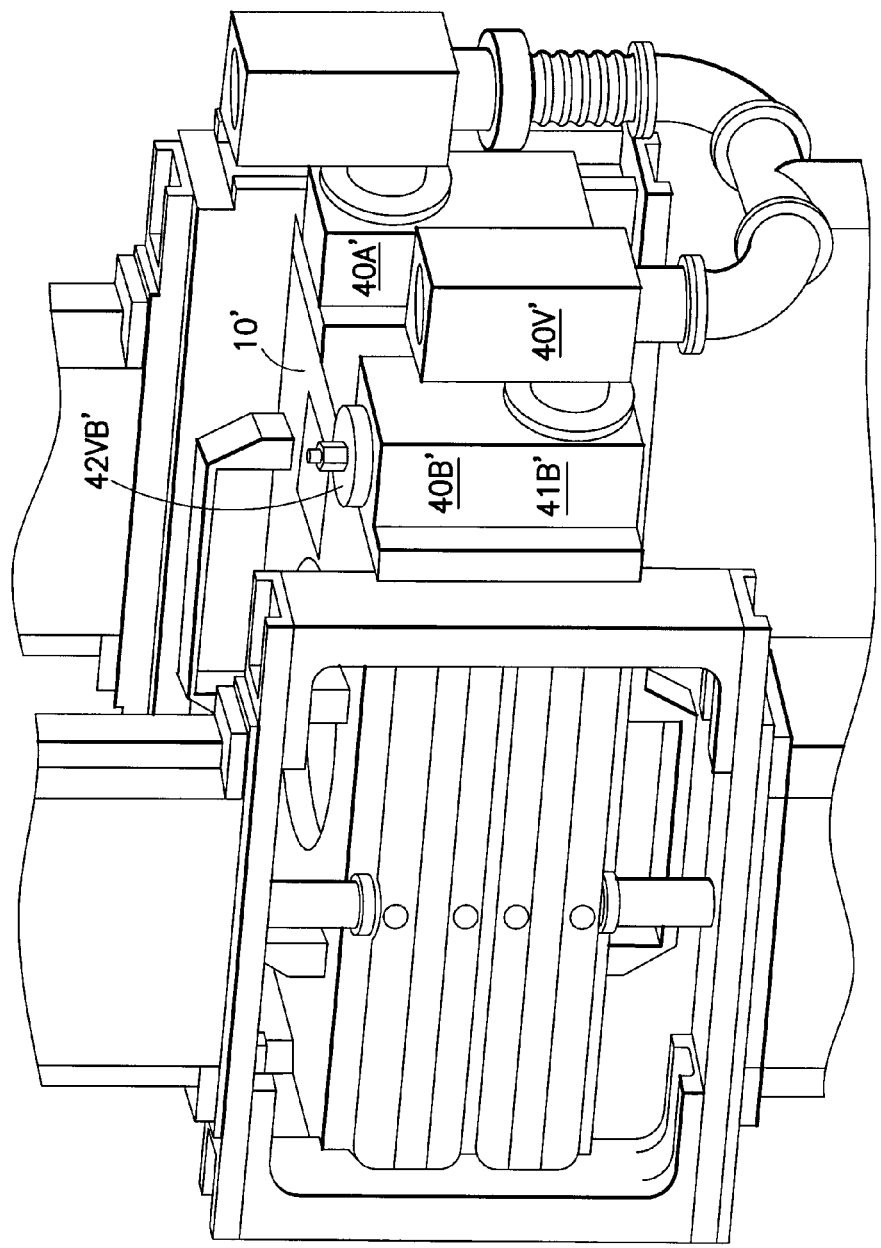
FIGS. 7A-7B, respectively are another partial perspective view and cross-sectional view of the chamber module in accordance with another exemplary embodiment.
Figure 7B:
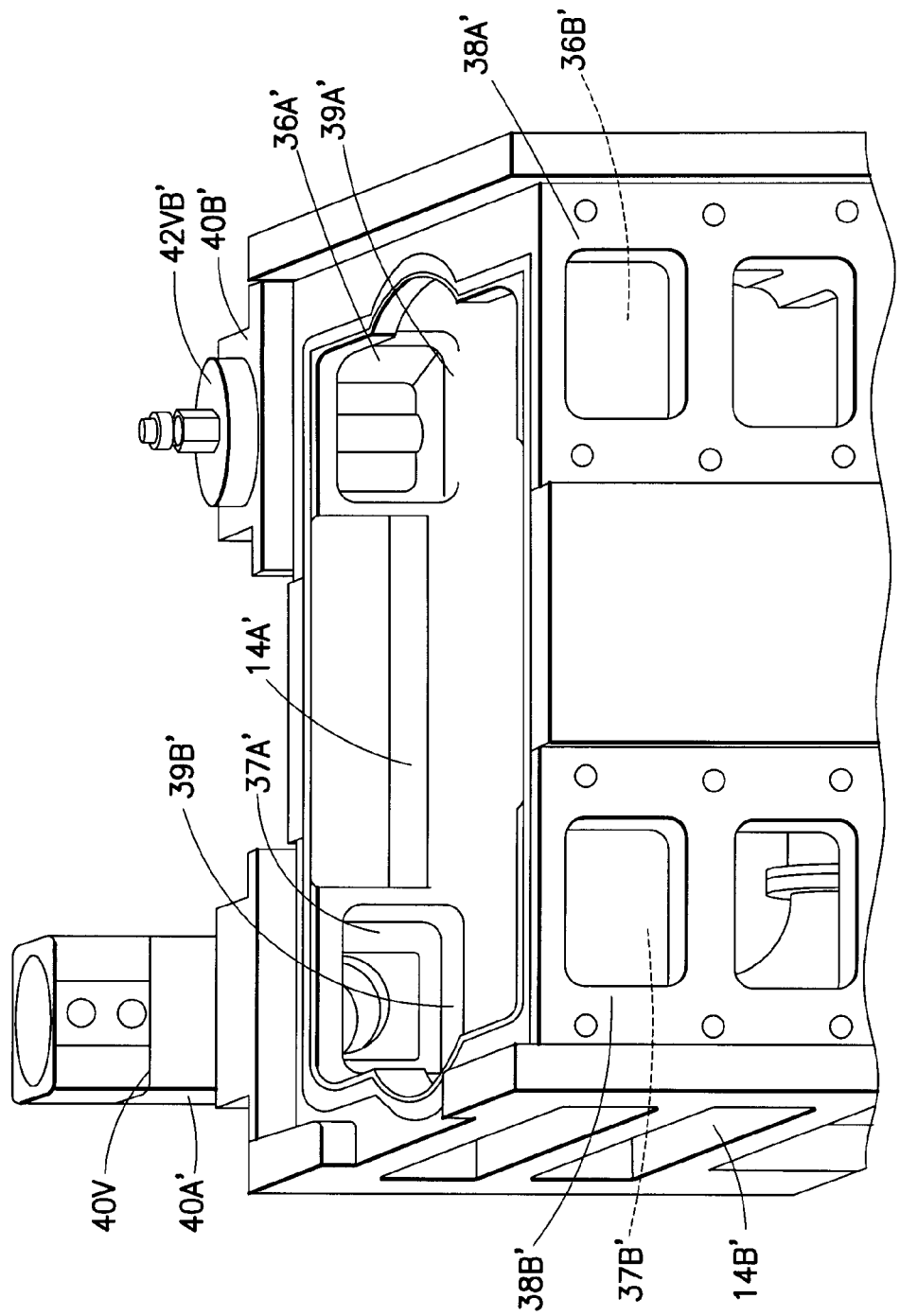
Figure 8A:
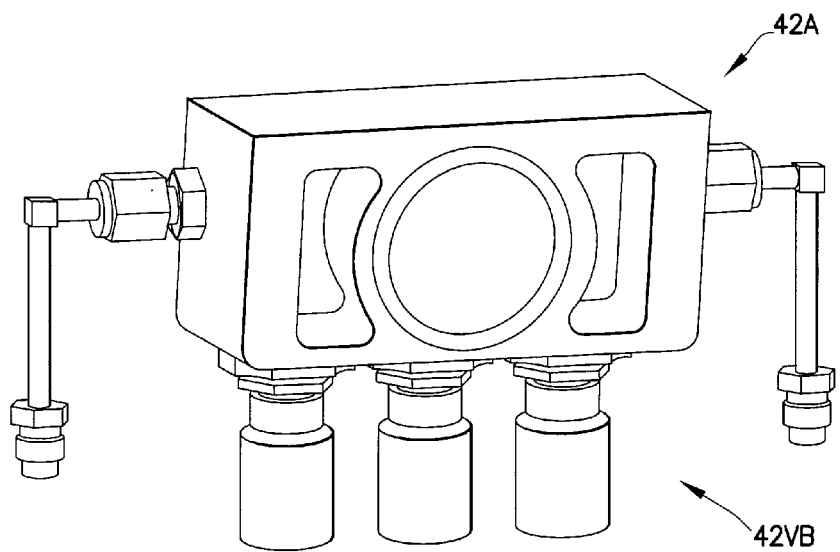
FIGS. 8A-8D are different schematic perspective views of valve modules in accordance with other exemplary embodiments.
Figure 8B:
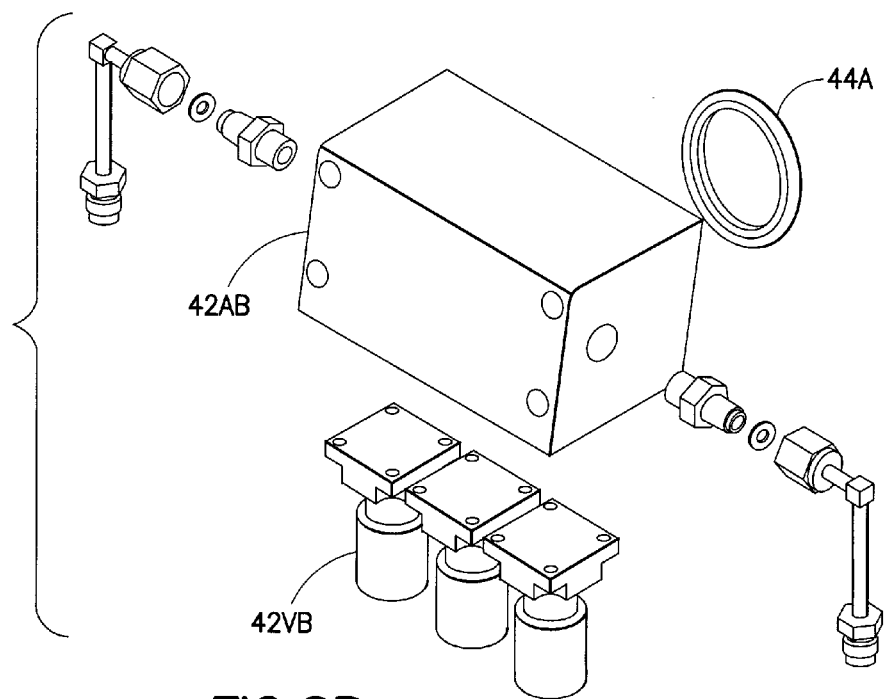
Figure 8C:
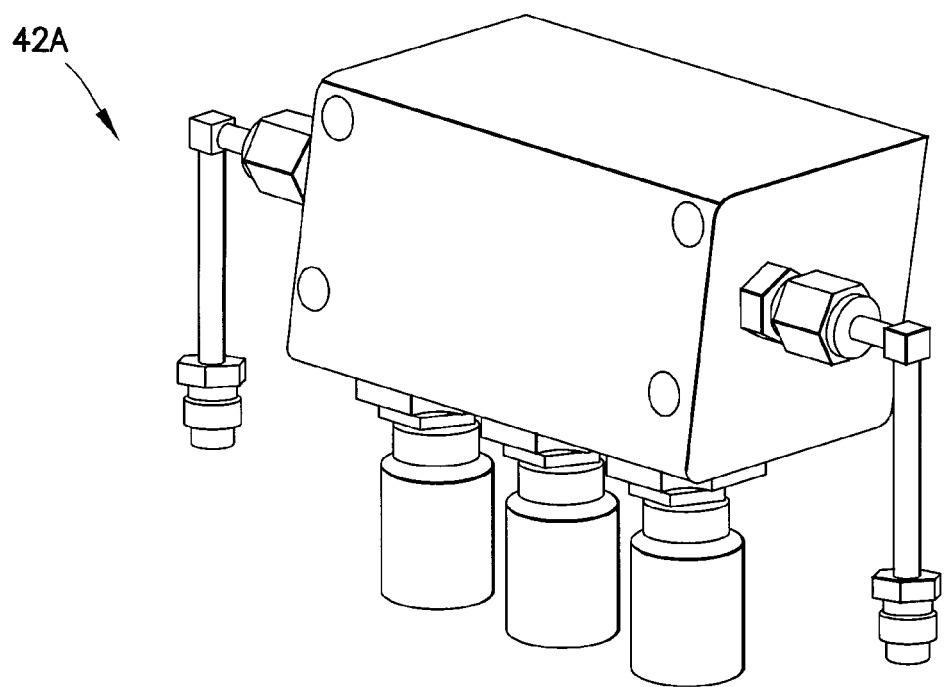
Figure 8D:
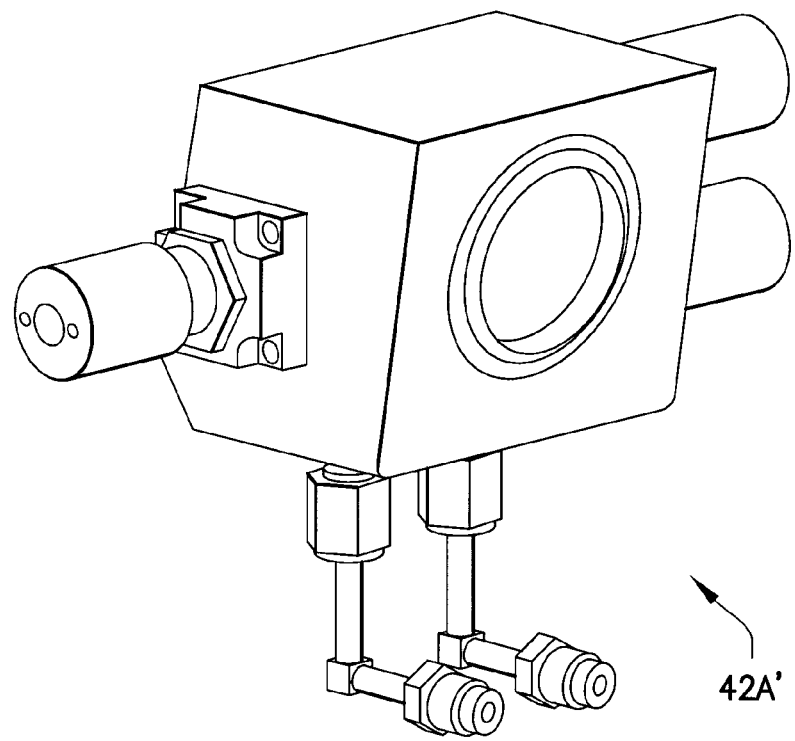

Referring now to FIGS. 7A-7B, there is respectively shown a perspective view and cross-sectional view of the module 10' in accordance with another exemplary embodiment. Module 10' may be substantially similar to module 10 described previously. In the exemplary embodiment shown, the vacuum control valves and vent valve(s) may be integrated into a single module 40A', 40B'. As seen best in FIG. 7B, the module structure may have ports 36A', 36B', 37A', 37B' formed therein. In the exemplary embodiment shown, the ports may be disposed in a generally symmetrical arrangement, (for example ports may be formed in both side walls as shown, allowing vacuum and vent plumbing attachments to either side of the module). Accordingly, each load lock chamber may have for example, four available ports for connection of vacuum and vent plumbing, such as two ports on either side. In alternate embodiments, each load lock chamber may have any suitable number of ports having any suitable spatial relationship with each other. In the exemplary embodiment, the mating interface 38A', 38B', 39A', 39B' for the ports 36A', 36B', 37A', 37B' may be similar to allow, for example, the interchangeability of the modules 40A', 40B'. In alternate embodiments, one or more of the mating interfaces may be dissimilar to allow for selective interchangeability between the interfaces and respective modules having corresponding interfaces. As seen in FIG. 7B, the mating interfaces 38A', 38B', 39A', 39B' may be arranged in port pairs disposed one above the other (e.g. port). For example, ports 36A' and 36B' may be located in the same module wall, one above the other and may share a mating interface 39A'. In this exemplary embodiment each valve module 40A', 40B', may be interchangeably mated to any port pair mating interface 38A', 38B', 39A', 39B'. The valve module 40A', 40B', may be configured to communicate with each port (e.g. 36A', 36B') of a port pair when mated to the chamber module 10' (as shown in FIGS. 7A-7B). In the exemplary embodiment, the valve module 40A', 40B' may have a module body 41B' that may form a mating interfacing configured to mate with the module 10', where the mating interface of the module body 41B' includes respective vent (exhaust) and vacuum (inlet) ports. A vacuum control valve 40V may be mounted to the module body 41B' in fluid communication with the vacuum port. Similarly a vent valve(s) 42VB' may be included in the module body 41B' in fluid communication with the vent port. In the exemplary embodiment, the valve module arrangement results in one module 40A', 40B' operating to vent a given load lock chamber 14A', 14B' and the other module 40A', 40B' operating to pump down the load lock chamber 14A', 14B'. The valve modules 40A', 40B' may include a vent diffuser, for example located in a manner as previously described. As can be seen in FIGS. 7A and 7B, the modules 40A' and 40B' are configured so that each module communicates with both the chambers 14A', 14B'. For example, module 40B' may be coupled to the module 10' such that module 40B' vents chamber 14A' and pumps (e.g. evacuates via vacuum) chamber 14B'. Module 40A' is coupled to the module 10' so that module 40A' vents chamber 14B' and pumps chamber 14A'. As may be realized, where the load lock module includes a single load lock chamber, the single load lock chamber may have a pump/vent interface having vent and vacuum port pairs substantially similar to those described above. The port pairs may be configured to interface with a pump/vent module substantially similar to modules 40A', 40B' so that the single chamber can be vented and pumped with a single module to reduce or minimize, for example, the complexity, size and cost of the single load lock module.

Figure 5B:
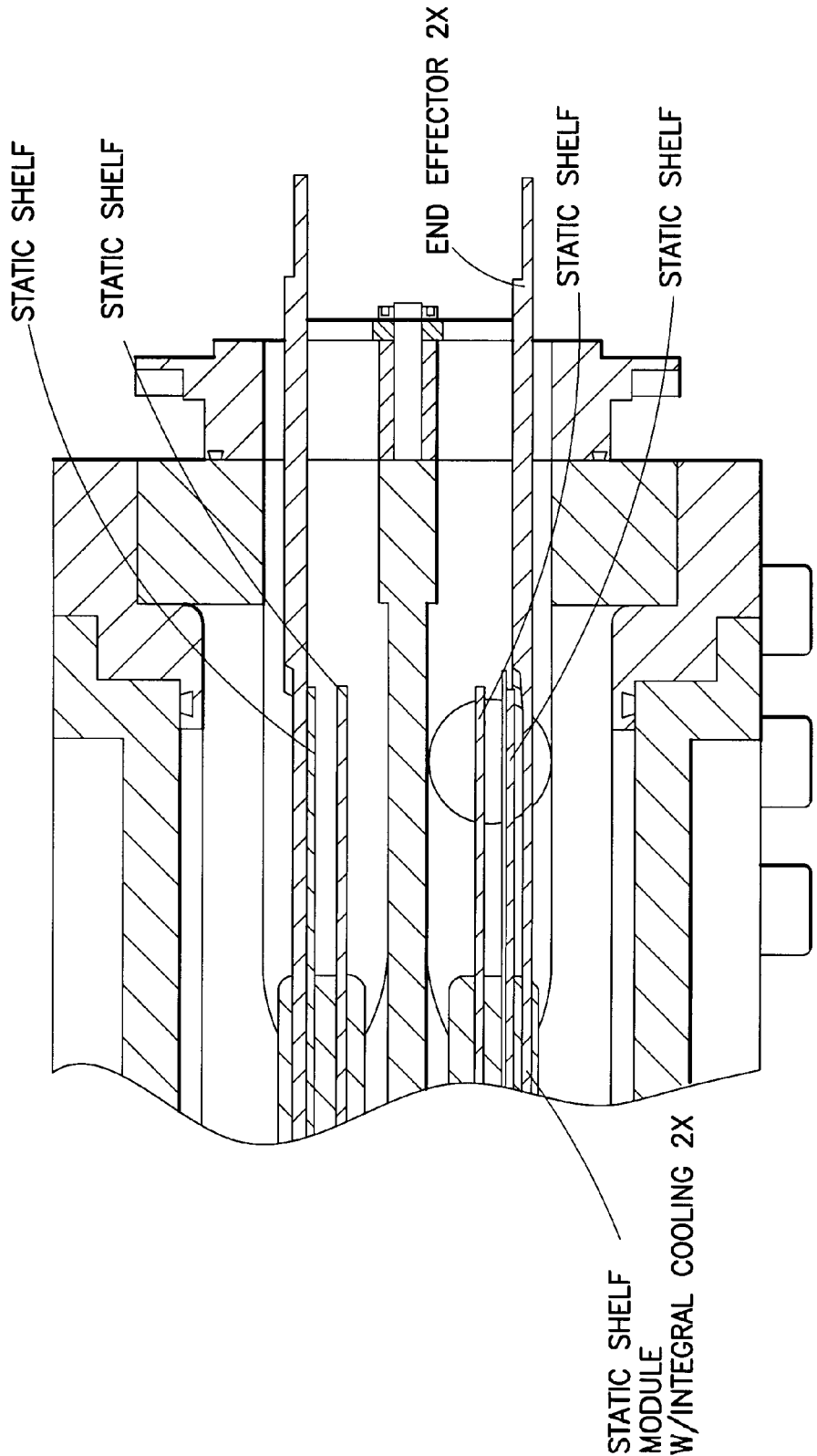
Figure 9:
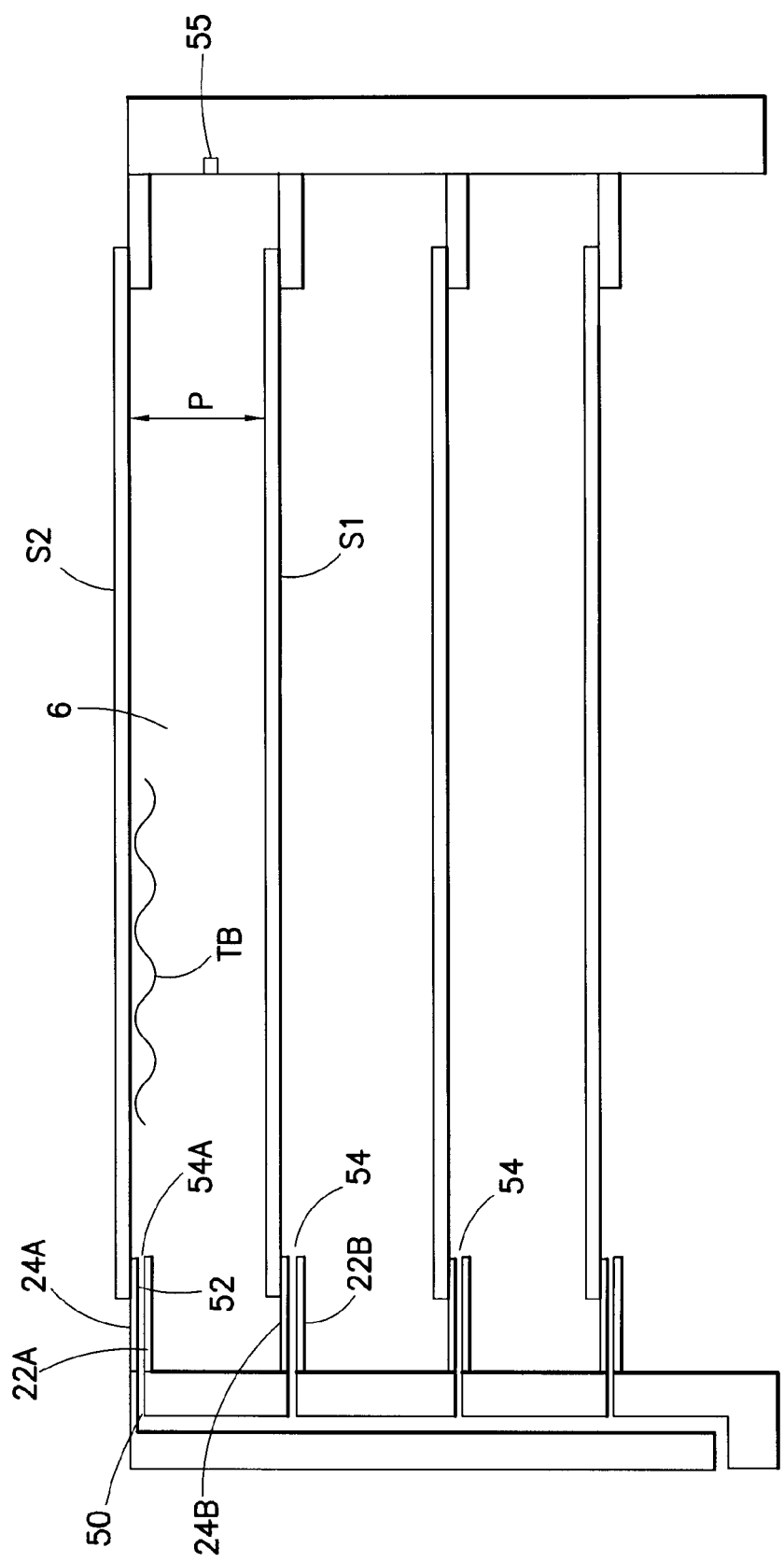
FIG. 9 is a schematic cross-sectional view of a portion of the module in accordance with another exemplary embodiment.

Referring now to FIG. 9, there is shown a cross sectional view of the substrate support shelves 22A, 22B of the load lock module in accordance with another exemplary embodiment. Although there are four support shelves shown in FIG. 9 (e.g. two shelves in each chamber as described above), only two shelves 22A, 22B will be described for example purposes. It is noted that the remaining substrate support shelves may be substantially similar to shelves 22A, 22B. The support shelves 22A, 22B in the exemplary embodiment shown in FIG. 9, may be generally similar to the support shelves previously described and shown in FIGS. 5A and 5B. The support shelves 22A, 22B may be static and may be arranged at a desired pitch P (e.g. 10 mm or any other suitable distance more or less than 10 mm) to support substrates S in a stack. In one exemplary embodiment, the support shelves 22A, 22B may be adjustable and configured to allow adjustment of the pitch P. In still other exemplary embodiments the shelves 22A, 22B may be movable relative to each other as will be described in greater detail below. In alternate embodiments the support shelves 22A, 22B may be modular so that additional shelves can be added (or removed) depending on, for example, a desired pitch P. In the exemplary embodiment, each support shelf 22A, 22B may have a cooling surface 24A, 24B for conduction cooling substrate(s) S1, S2 seated against a respective one of the shelf cooling surfaces 24A, 24B. In the exemplary embodiments, shown in FIG. 9, each substrate support 22A, 22B (the number of support shelves shown is exemplary and in alternate embodiments there may be more or fewer support shelves) may have gas ports 54. The gas ports 54 are illustrated schematically in FIG. 9, and may comprise any number of ports, distributed along the support shelves, of any desired size. The gas ports 54 may be configured so that the gas passing through the ports has a laminar flow to, for example, minimize particle formation. In one exemplary embodiment the ports 54 may include any suitable diffusers while in other exemplary embodiments diffusers may be located up stream of the ports 54. In alternate embodiments the diffuser(s) may have any suitable spatial relation with a respective port(s). As seen in FIG. 9, the gas ports 54 are positioned between the respective lower and upper surfaces of corresponding upper and lower substrates S1, S2 seated on the cooling surfaces 24A, 24B of the support shelves 22A, 22B. The ports 54, may be connected via suitable passages, that may be integrally formed within the support shelves 22A, 22B for example, to a suitable supply of gas suitable for the vent atmosphere in the load lock chamber (e.g. vent gas). In alternate embodiments the passages may not be integrally formed within the support shelves. As seen in FIG. 9, the gas port(s) 54 are configured to exhaust gas into the gap 6 between exposed substrate surfaces (e.g. adjacent cooling substrates S1, S2 (see also e.g. FIGS. 7 and 9)). For example, one or more of the support shelves 22A, 22B may have a gap or aperture 6 (such as to allow end effector access similar to gap 26 as shown in FIG. 5B) that may expose an upper substrate (at a raised temperature) on, for example, shelf 22A which is being cooled to another lower substrate on, for example, shelf 22B also having a raised temperature and being cooled. The gas exhausted from the ports 54, in gap 6, may form a thermal break or barrier TB (the size and location of which is shown in the Figures for exemplary purposes only) between the heated lower substrate S1 and uncovered surface of the upper substrate S2 to minimize or eliminate any convectional heating of the upper substrate S2 by the lower substrate S1. The circulating gas may also provide convectional cooling with respect to the substrates in addition to the conduction cooling. As may be realized, and by way of example, gas exhausted from ports 54A, 54 may flow within gap 6, disrupting stagnant gas within gap 6 and hence disrupting undesired heat transfer via convection between the hot lower substrate S1 to the exposed surface of the hot upper substrate S2. As may also be realized, the gas introduced by ports 54A, 54 may be removed or caused to flow (creating gas circulation) by, for example, suitable vacuum or gas removal ports suitably located within the chamber (e.g. in the gap 6 or other suitable location). In one example, the vacuum ports may be incorporated into the support shelves 22A, 22B in a manner substantially similar to that described above with respect to ports 54. In other examples, the vacuum ports may be located in the chamber walls between the support shelves as shown in FIG. 9 with respect to vacuum port 55. Hence, this results in lowered cooling times for the substrate stack, as cooling distribution of the stacked substrates may be maintained substantially constant across the substrate stack. As may be realized the gas exhausted from ports 54, 54A may have defined Reynolds (Re) number for low speed laminar flow and to avoid particulate deposition on the upper surface of lower substrates as described above.

Figure 10A:
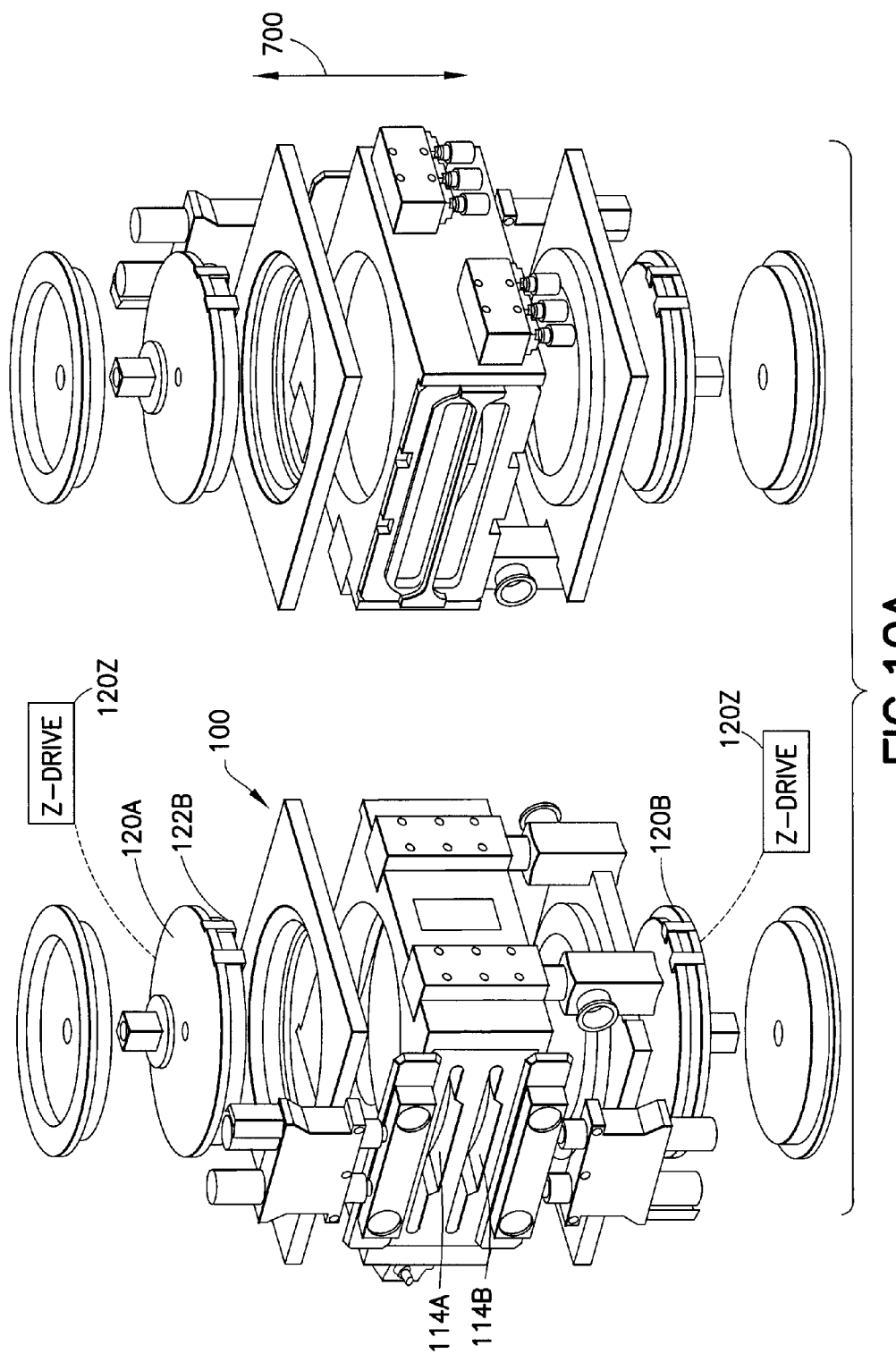
FIG. 10A is an exploded perspective view of a chamber module in accordance with another exemplary embodiment.
Figure 10B:
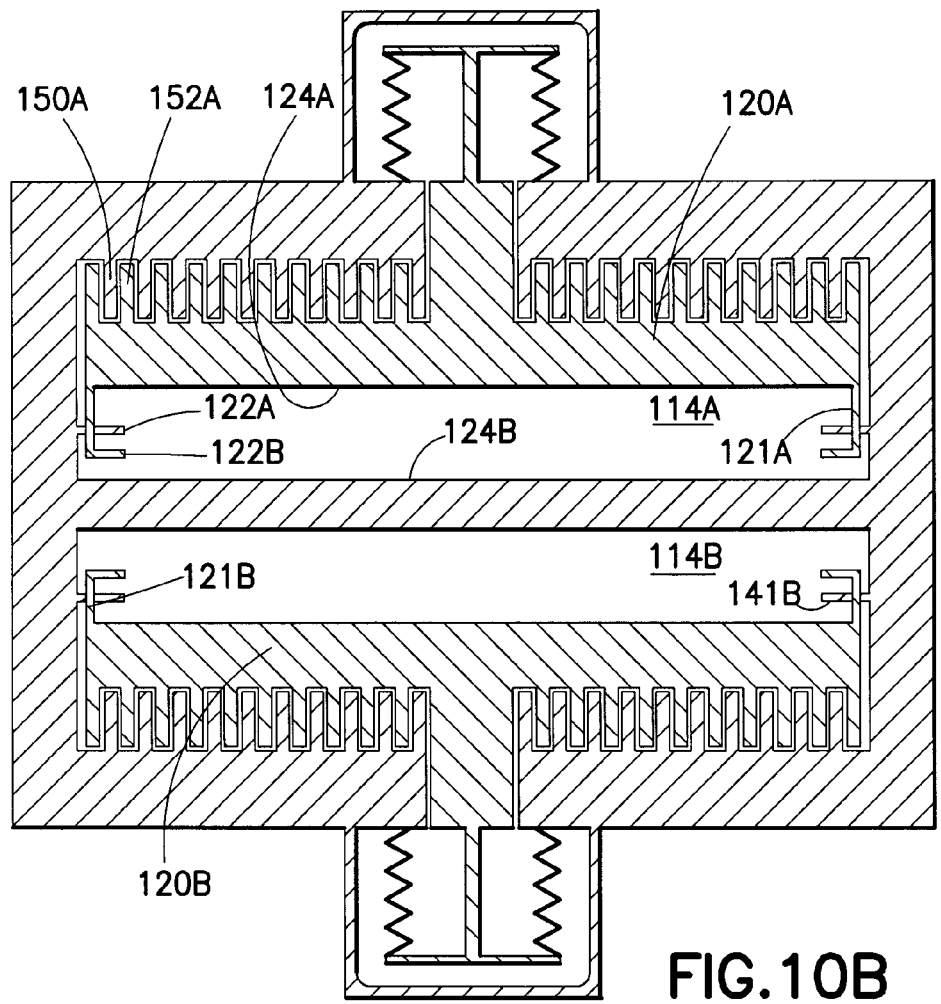
FIG. 10B is a cross-sectional view of the module.
Figure 11C:
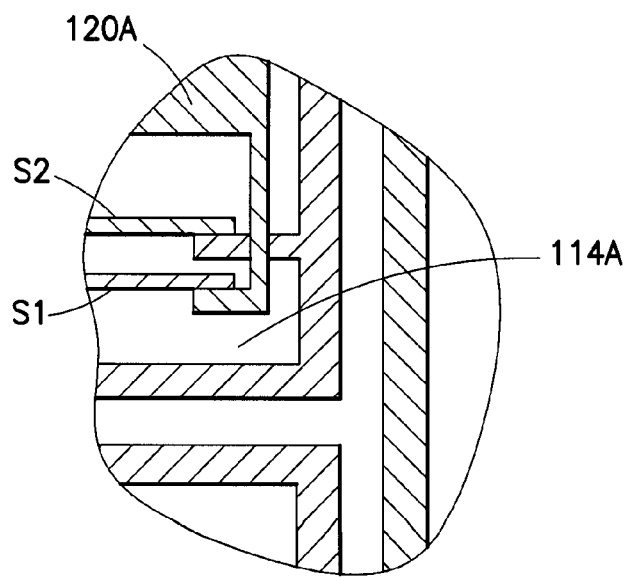
FIG. 11C is a partial cross-section view of a portion of the modules and substrates.

Referring now to FIGS. 10A and 10B there is shown an exploded perspective view of a load lock module 100 in accordance with another exemplary embodiment. Module 100 may be substantially similar to load lock module 10 described before. In the exemplary embodiment, module 100 may also have two load lock chambers 114A, 114B stacked over each other, but in alternate embodiments the load lock module may have any suitable number of stacked chambers. Module 100 may also include cooling chucks 120A, 120B. Each load lock chamber 114A, 114B has a cooling chuck located therein. The cooling chucks 120A, 120B are capable of z axis motion, driven by suitable z-drives 120Z. In alternate embodiments, the chuck may also be capable of horizontal (e.g. X and Y) movement. The chucks 120A, 120B are generally arranged in a generally opposing configuration as shown so that the chucks move toward or away from each other when actuated in, for example, the direction of arrow 700. Referring to FIG. 10B, which shows a cross-section of the module 100 with the load locks in what may be referred to as a ready position, each load lock chamber 114A, 114B may have support shelves 122A, 122B to support two substrates S1, S2 in each load lock chamber 114A, 114B (more or fewer substrates may be provided in alternate embodiments)(see also FIG. 11C). In the exemplary embodiment, support shelves 122A may be static, (e.g. fixed to the chamber structure or any other suitably fixed structure within the chamber) and support shelves 122B may be movable (e.g. dependent from the movable chuck 120A, 120B or any other suitable movable shelf support). In alternate embodiments, both of the support shelves may be static, while in other alternate embodiments both support shelves may be movable. In one exemplary embodiment, the shelves 122B may be supported by and connected to the chuck 120A, 120B by extensions or shelf supports 121A, 121B. The extensions 121A, 121B may be of unitary construction with a respective one of the chucks 120A, 120B and/or the shelves 122B. In alternate embodiments the shelf supports 121A, 121B may have any suitable configuration. As can be seen in FIG. 10B the extensions 121A, 121B extend away from the surface 124A of the chuck 120A, 120B so that the fixed shelves 122A are located between the surface 124A and shelves 122B (which depend from the extensions 121A, 121B). As may be realized when the chuck 120A, 120B is in the retracted position there is sufficient clearance between the shelves 122A, 122B to allow placement of a substrate on the shelves 122B by, for example, an end effector of a substrate transport.

Figure 11A:
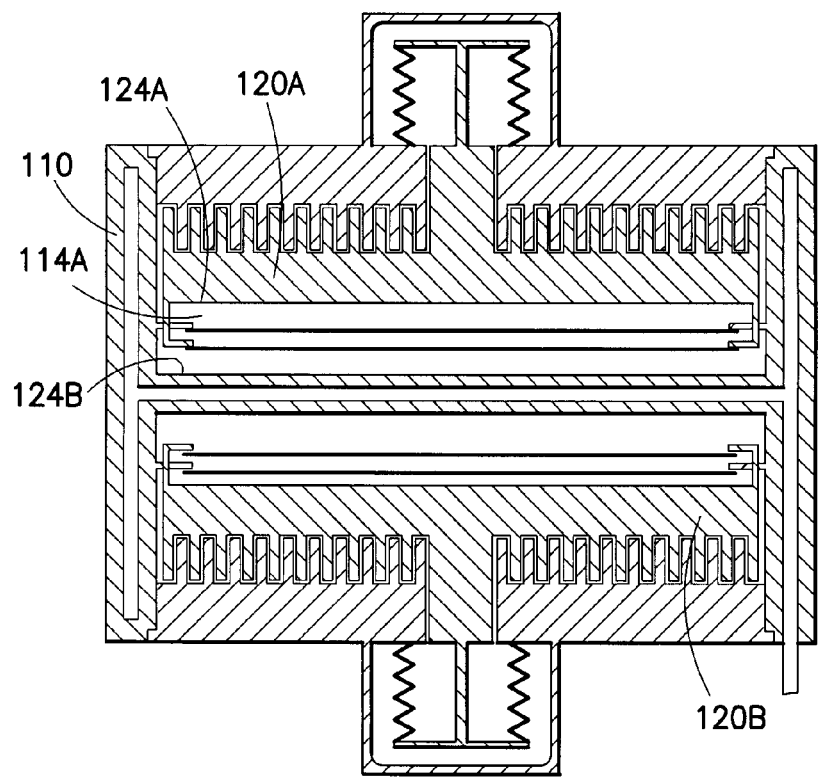
FIGS. 11A-11B respectively are other cross-sectional views of the module in different position.
Figure 11B:
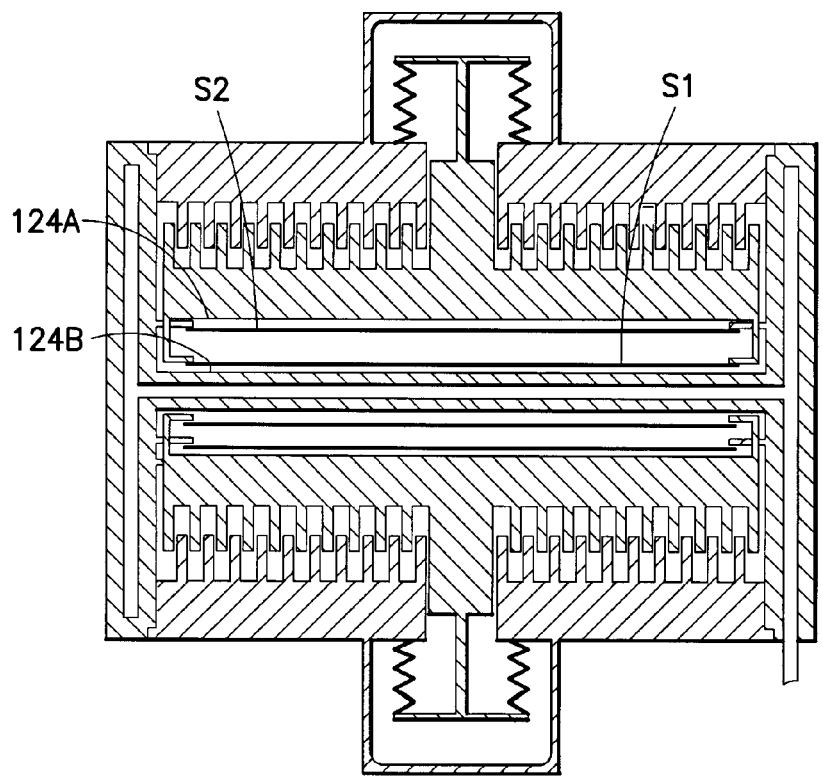
Figure 11D:
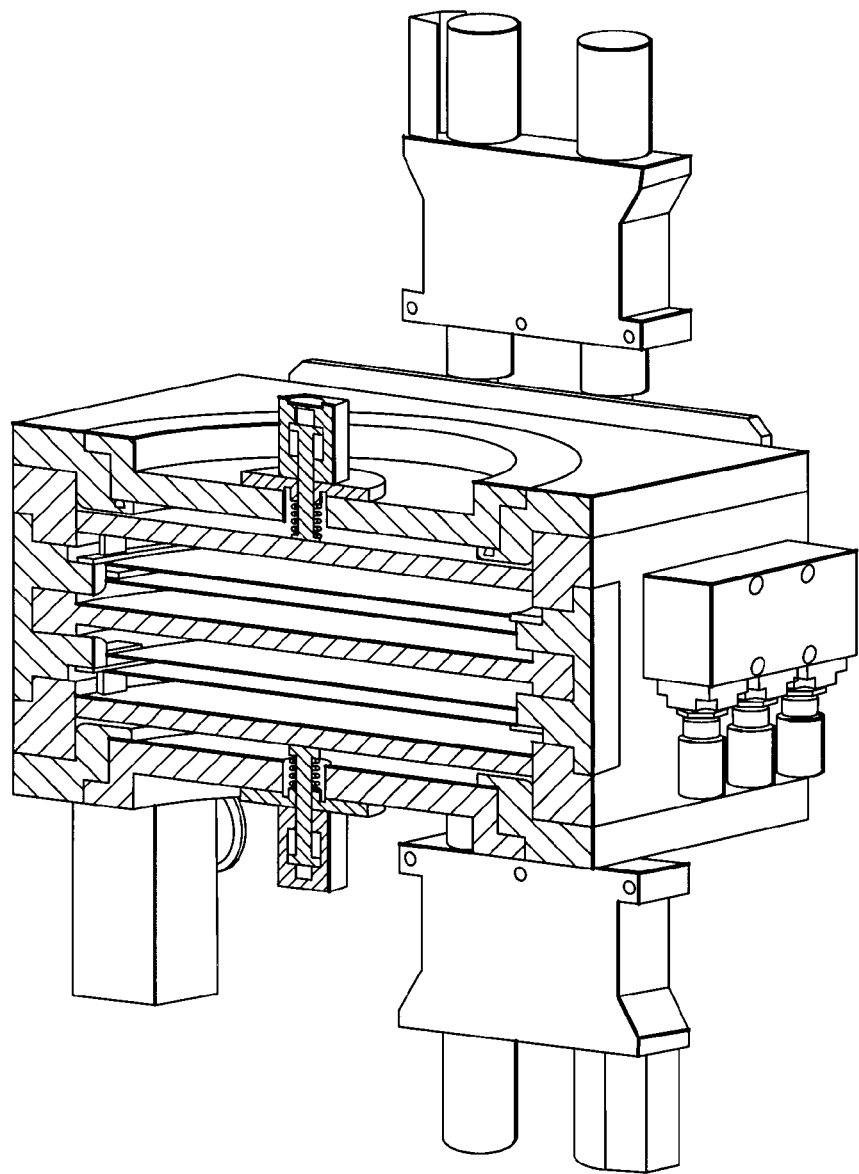
FIGS. 11D-11E are perspective cross-sections of the module in different positions.
Figure 11E:
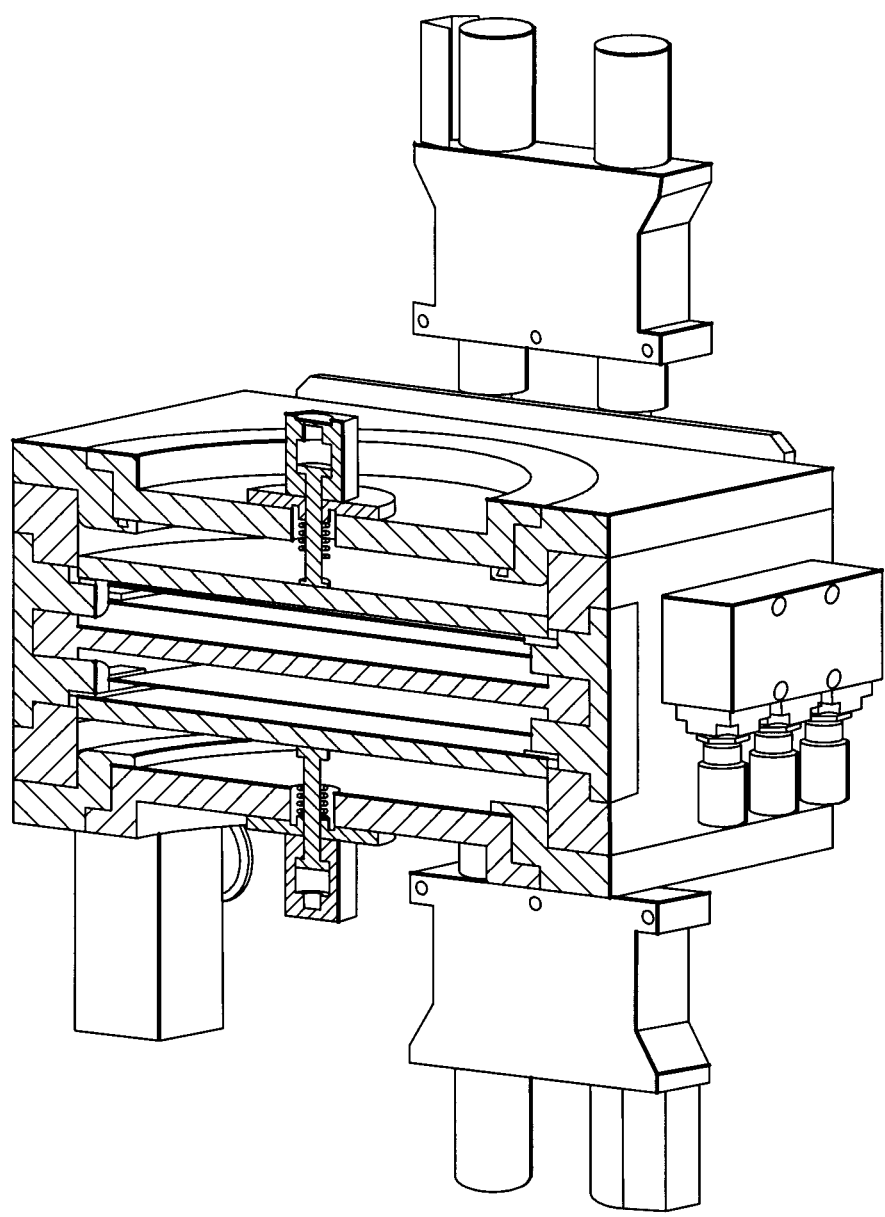

The support shelves may be arranged in the exemplary embodiment so that substrates may be picked or loaded substantially onto the respective support shelves 122A, 122B by, for example, z-motion of the transfer arm end effector. In alternate embodiments, the support shelves and or chambers may be moveable to lift substrates off of the end effector. The chuck 120A, 120B may be located in a battery, opened, retracted position, as shown in FIG. 10B (see also FIG. 11D), for loading and unloading substrates from/to the load lock chamber 114A, 114B. In the exemplary embodiment, the position of the chuck 120A, 120B may be altered (in the z axis (i.e. the direction of arrow 700), for example, to what may be referred to as a closed position, see also FIG. 11E) to effect substantially simultaneous cooling of the substrates on the support shelves 122A, 122B of the load lock chambers 114A, 114B. In alternate embodiments, the chuck may be capable of effecting heating of the substrates, or both cooling and heating. In the exemplary embodiment shown in FIG. 10B, the chuck 120A, 120B may have a thermal transfer contact surface 124A (e.g. a conductive cooling surface). The thermal transfer surface 124A on the chuck 120A, 120B, may be communicatively connected thermally to a suitable thermal sink 152A. In the exemplary embodiment shown in FIG. 10B, this thermal communication is schematically illustrated as interfacing radiator fins 150A, 152A respectively on chuck and chamber that are configured to allow freedom of movement of the chuck in the z-direction. In alternate embodiments the thermal sink may have any suitable configuration. As seen in FIG. 7B, each chamber 114A, 114B may have a static thermal transfer contact surface 124B, (e.g. cooling surface) that may be located generally opposite the chuck 120A, 102B. Referring also to FIG. 11A, the module 100 is shown with the cooling chuck 120A, 102B in the opened position, and substrates S1, S2 loaded on respective support shelves of the load lock chamber 114A, 114B. As noted before, to cool the substrates, the chuck 120A may be moved (in z direction) to the closed position. For example as shown in FIG. 11B (see also FIGS. 11D-11E, which are perspective cross-sections respectively showing the chuck in opened and closed positions). It is noted that the operation of chuck 120B may be substantially similar to that of chuck 120A. Each of the chucks 120A, 120B may be independently operable, and chucks 120A, 120B are shown closed in FIG. 11B merely for exemplary purposes. In alternate embodiments, the chuck 120A, 120B in one load lock chamber 114A, 114B may be opened and the other chuck 120A, 120B in the other load lock chamber 114A, 114B may be closed or in any other desired position between opened and closed. As seen in FIG. 11B, motion to the closed position moves the chuck borne substrate S1, S2 (e.g. the substrate on shelves 122B) toward and into substantial contact with stack cooling surface 124B, and moves the chuck cooling surface 124A into substantial contact with a respective substrate S1, S2 on static shelves 122A. Thus, differential motion between chuck 120A, 120B and load lock chamber 114A, 114B effects substantial simultaneous cooling of multiple substrates. The chuck 120A, 120B may be returned to the opened position to unload the substrates S1, S2. In alternate embodiments, the chuck may be configured to allow removal (and insertion) of the substrates S1, S2 without returning to the open position.

Figure 12A:
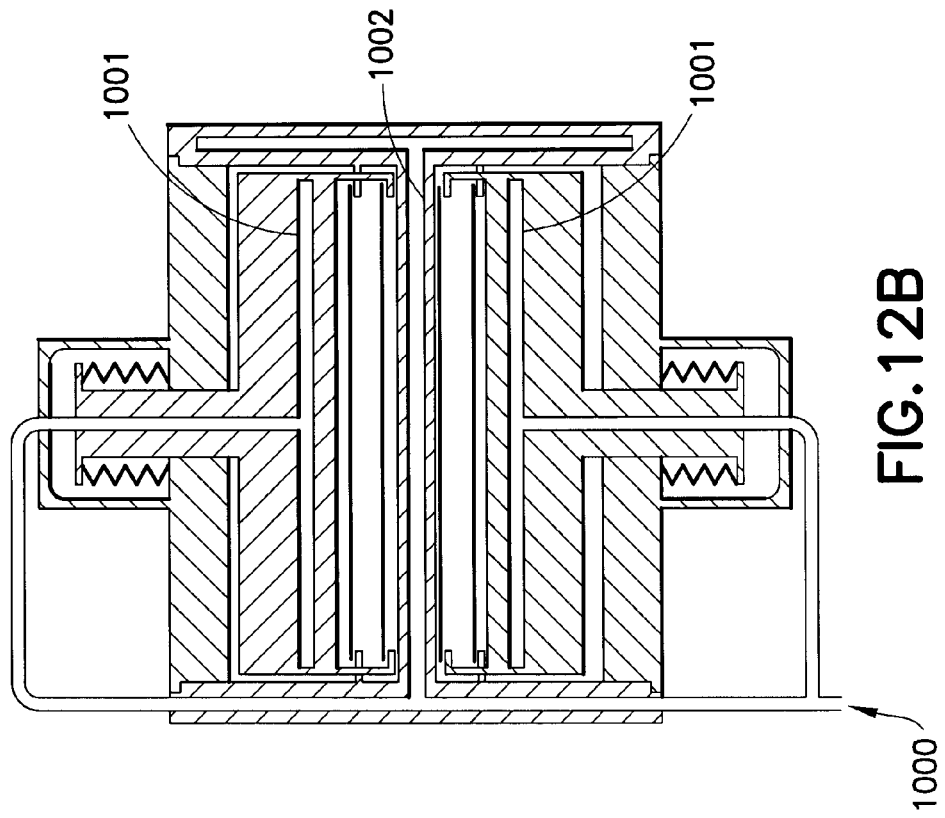
FIGS. 12A-12B are other cross-section views of the module in accordance with still another exemplary embodiments.
Figure 12B:
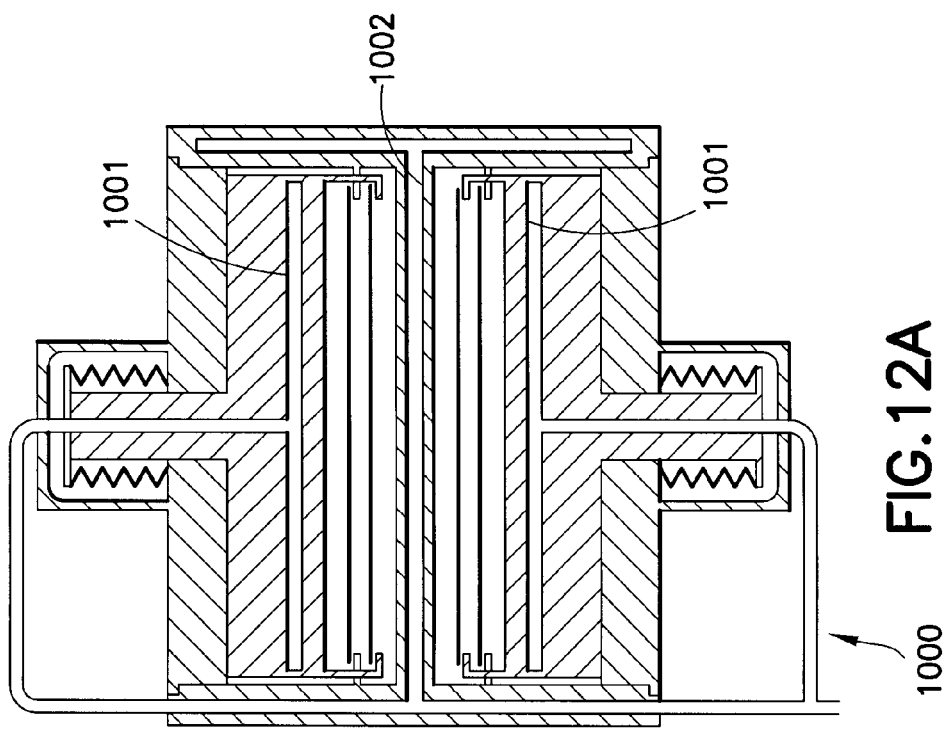

FIGS. 12A-12B are cross-sections of the module showing a cooling chuck heat exchanger arrangement 1000 in accordance with another exemplary embodiment, in which suitable conduits 1001 direct heat exchanging fluid into the head of the chuck 120A, 120B to maintain the thermal transfer plate at a desired temperature. The fluid conduit 1001 may be flexible to allow, for example, 3-axis motion of the chuck as previously described. In alternate embodiments, the interface between the fluid conduit 1001, which may be rigid or semi-rigid, and the chuck 120A, 120B may be a sliding or telescoping interface/coupling having suitable sealing members for sealing the interface while allowing relative movement between the conduit 1001 and the chuck 120A, 120B.

As can also be seen in FIGS. 12A and 12B, the heat exchanger arrangement may also include conduits 1002 for directing heat exchanging fluid into the static thermal transfer surface 124B. The cooling fluid may be any suitable fluid including but not limited to, water, oil, air or any other suitable fluid capable of transferring heat from the chuck 120A, 120B and static thermal transfer surface 120B. The cooling chuck heat exchanger arrangement may include any suitable fluid temperature regulating device (not shown) such as, for example, a radiator having suitable feed and return lines for cooling the fluid during circulation into and out of the chuck 120A, 120B and/or static thermal transfer surface 120B. It is also noted that only the cooling fluid feed lines are (e.g. the lines transporting the cooling into the chuck and static thermal transfer surface) are shown for exemplary purposes only. In alternate embodiments, the chuck 120A, 102B and the static thermal transfer surface 124B may be fed by separate cooling lines and/or separate heat exchanger systems.

Figure 13:
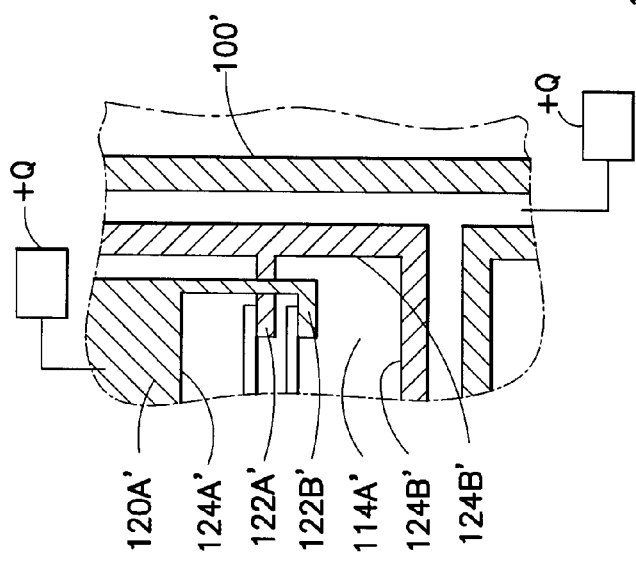
FIG. 13 is a partial cross-section view of the module in accordance with still another exemplary embodiments.

Referring now to FIG. 13, there is shown a partial cross-section view of a load lock chamber 114A', of module 100' in accordance with another exemplary embodiment. Module 100' may be similar to module 100, and may include a movable chuck 120A'. Chuck 120A' may have substrate support shelves dependent therefrom in a manner substantially similar to that described above. The load lock chamber 114A' may have substrate support shelves 122A' dependent therefrom. The chuck 120A' may have a thermal transfer surface 124A'. The load lock chamber 114A' may have a thermal transfer surface 124B' disposed thereon. The thermal transfer surface 124B' may be communicably connected, via suitable heat exchanger means, to heat sources +q. In the exemplary embodiment, during pump down of the load lock, the chuck may be actuated to decrease a gap between, for example, the substrate on the load lock support shelves 122A' and the chuck surface 124A', or between the substrate on the chuck support shelves 122B' and load lock surface 124B'. The decreased gap between substrate and adjoining surface operates to increase gas temperature to mitigate particulate creation at pump down.

Further, thermal surfaces 124A', 124B', may be heated to direct heat into the gas, such as in combination with chuck motion, or alone, to further mitigate particular formation at load lock pump down.

Referring now to FIGS. 14A-14E, an exemplary load lock 10100 is shown in accordance with an exemplary embodiment. Although the exemplary embodiments will be described with respect to atmospheric doors or slot valves, it should be realized that the disclosed embodiments can be equally applied to vacuum doors or slot valves used in the substrate processing equipment.

In this example the load lock 10100 is configured as a stacked load lock having a first load lock chamber 10140 and a second load lock chamber 10150. In alternate embodiments the load lock may have any suitable configuration. Each of the load lock chambers 10140, 10150 may have any suitable configuration including, but not limited to, those described above. For example, the load lock chambers 10140, 10150 may be configured as dual load lock chambers (i.e. each load lock is configured to hold two substrates) or single load lock chambers (i.e. each load lock is configured to hold one substrate). In alternate embodiments each of the load lock chambers 10140, 10150 may be configured to hold more than two substrates. Each of the load lock chambers 10140, 10150 may have an atmospheric load lock door 10130, 10120 and a vacuum load lock door or slot valve 10160, 10161. In this example, atmospheric load lock door 10130 and vacuum slot valve 10160 are respectively the atmospheric and vacuum doors for load lock chamber 10140 and load lock door 10120 and slot valve 10161 are respectively the atmospheric and vacuum doors for load lock chamber 10150. The atmospheric doors 10130, 10120 may allow the load lock to be coupled to an atmospheric processing unit including, but not limited to an Equipment Front End Module (EFEM) while the slot valves 10160, 10161 allow the load lock to be coupled to a vacuum module including, but not limited to processing modules as described above with respect to FIGS. 2 and 3, for example.

Figure 14A:
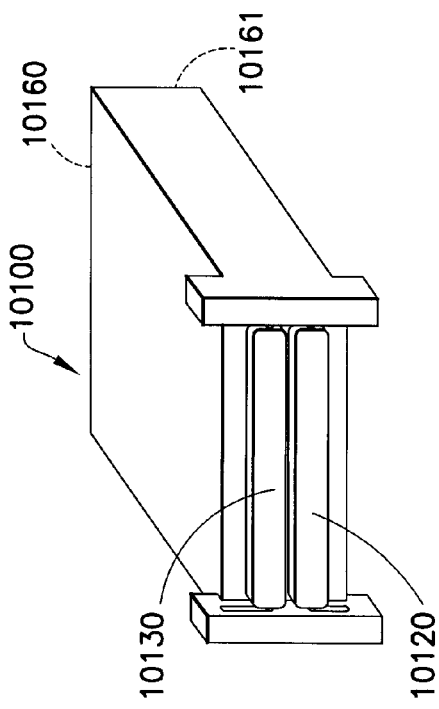
FIGS. 14A, 14B illustrate load lock in two configurations in accordance with an exemplary embodiment.
Figure 14B:
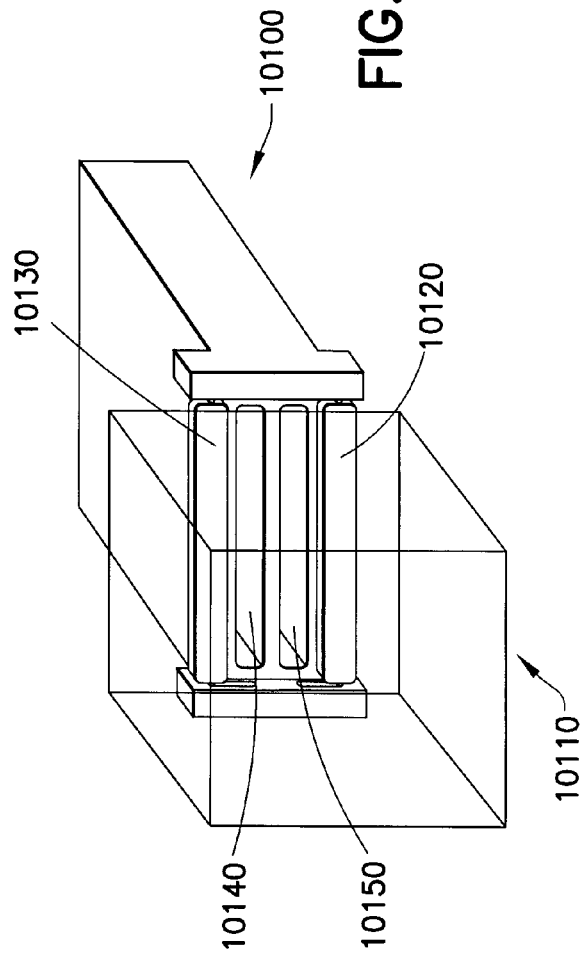
Figure 14C:
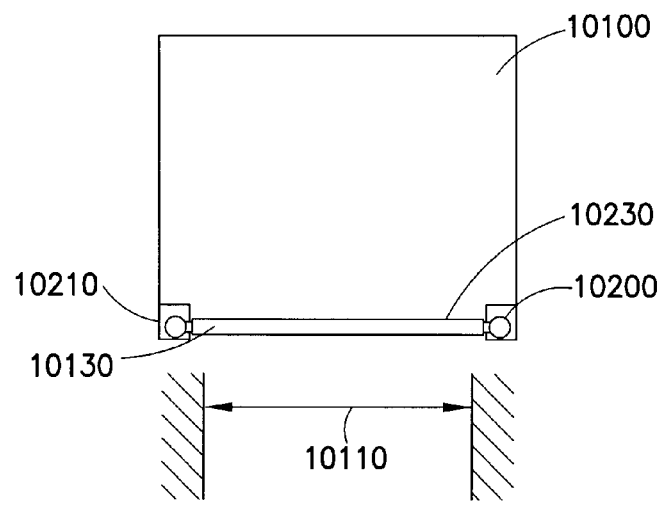
FIG. 14C illustrates a top view of a load lock in accordance with an exemplary embodiment.
Figure 14D:
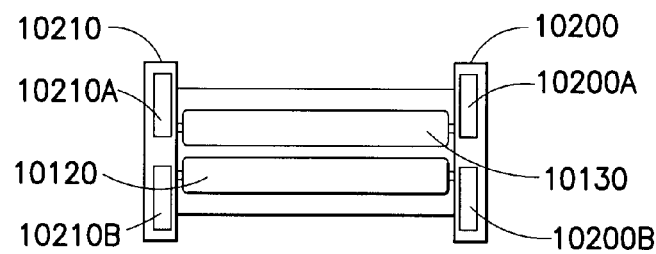
FIGS. 14D and 14E illustrate front views of a load lock in two configurations in accordance with an exemplary embodiment.
Figure 14E:
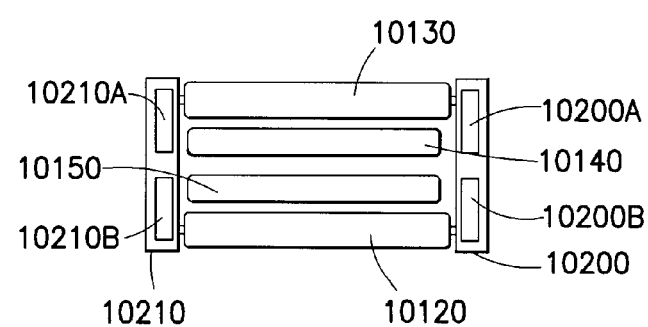
Figure 15:
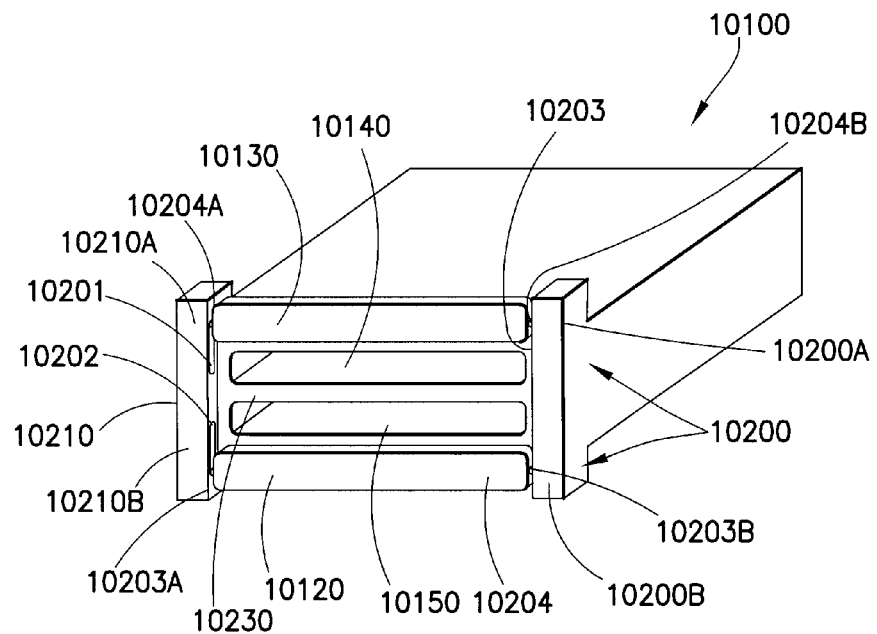
FIG. 15 shows a load lock incorporating features of the exemplary embodiments.

The load lock 10100 is shown in FIGS. 14A and 14D with the atmospheric doors 10130, 10120 in a closed position while FIGS. 14B and 14E show the atmospheric doors 10130, 10120 in an open position for allowing the passage of substrates into or out of the respective load lock chambers 10140, 10150. Referring also to FIG. 15, the load lock doors are operated through one or more drive modules such as drive modules 10200, 10210. The drive modules 10200, 10210 are shown in this example being on either side of the doors 10130, 10120 for exemplary purposes. In other exemplary embodiments there may be only one drive module located on either side of the doors 10130, 10120 while a suitable bearing module may be located on the other side of the door for suitably supporting the doors as will be described below. In still other alternate embodiments, there may be any suitable number of drive modules located in any suitable position relative to the doors. It is noted that the drive modules 10200, 10210 are located outside of the substrate transfer zone 10110 as can be seen in FIGS. 14B and 14C. Positioning the drive modules 10200, 10210 outside of the substrate transfer zone may allow for the removal of protective bellows or particulate shields that are used to protect the substrate from particles generated by moving parts positioned above the substrates.

The drive modules 10200, 10210 may be located at least partially in front of a sealing contact surface 10230 of the load lock chambers with respect to a direction of substrate travel into the load lock chamber through an opening of the load lock chamber. In alternate embodiments the drive modules may be suitably configured for placement in front of or behind the sealing contact surface 10230 in any suitable manner. The sealing contact surface 10230 may be the surface of the load lock 10100 that interacts with the atmospheric doors 10130, 10120 to form a seal to prevent leakage to or from an atmosphere within the load lock chambers 10140, 10150. In one exemplary embodiment, the drive modules 10200, 10210 may be modular units that are coupled to a surface of the load lock 10100 by for example, mechanical fasteners, chemical fasteners, adhesives or welding. As may be realized the drive modules 10200, 10210 may be permanently coupled or removably coupled to the surface of the load lock 10100. In other exemplary embodiments the drive units may be integral to the load lock 10100 such that the drive modules form part of the load lock housing. In the exemplary embodiment shown in the figures, the drive modules 10200, 10210 are shown as being partially embedded in the load lock housing. The drive modules 10200, 10210 may include suitable access panels or covers for allowing access to the drives 10210A, 10210B, 10200A, 10200B located within the drive modules as will be described below. In alternate embodiments, access to the drives 10210A, 10210B, 10200A, 10200B may be provided in any suitable manner.

The drive modules 10200, 10210 may each include upper drive actuators 10200A, 10210A and lower drive actuators 10200B, 10210B respectively. The drive actuators 10210A, 10210B, 10200A, 10200B may be any suitable drives including, but not limited to, hydraulic drives, pneumatic drives, pressure differential drives, electrical rotary or linear drives and magnetic drives. The drive actuators may be configured as 10210A, 10210B, 10200A, 10200B one axis or two axis drives. In alternate embodiments the drives may have more than two axes. The drives may be configured to move the doors 10130, 10120 away from the contact surface 10230 as the doors are opened to minimize particle generation and substrate contamination. The drives may also be configured to move the doors 10130, 10120 into contact with the sealing contact surface 10230 in a manner such that particle generation is minimized.

The upper drive actuators 10200A, 10210A may work in conjunction with each other to open and close door 10130 while lower drive actuators 10200B, 10210B may work in conjunction with each other to open and close door 10120. In this example, the doors 10130, 10120 are individually operable in that, for example, one door may open and close while the other remains closed or one door may open while the other is closed. In alternate embodiments, there may be one drive in each drive module 10200, 10210 that is coupled to a respective door such that both doors open at the same time and both doors close at the same time. In still other alternate embodiments the single drive within each of the drive modules 10200, 10210 may be differentially coupled to a respective door such that as one door opens the other door is closed. In still other alternate embodiments only one of the drive modules 10200, 10210 may include one or more drives while the other one of the drive module 10200, 10210 may be passively driven by the first drive module. For example, drive module 10210 may suitably support and drive the doors 10130, 10120 while drive module 10200 includes suitable linear bearings for supporting and allowing movement of the doors 10130, 10120.

Still referring to FIG. 15 each of the drive modules 10200, 10210 may include openings located in front of the contact surface 10230 that are configured to allow each of the atmospheric doors 10130, 10120 to be coupled to their respective drives. For example, drive module 10200 may include opening 10203 to allow door 10130 to be coupled to upper drive 10200A and opening 10204 to allow door 10120 to be coupled to lower drive 10200B. In this example the opening is substantially orthogonal to the door contact surface 10230 but in alternate embodiments the opening may be substantially parallel to the contact surface 10230. In other alternate embodiments the opening may have any suitable spatial relationship with respect to the contact surface 10230. Drive module 10210 may include opening 10201 to allow door 10130 to be coupled to upper drive 10210A and opening 10202 to allow door 10120 to be coupled to lower drive 10210B. In one exemplary embodiment, the openings 10201-10204 may include any suitable seals including, but not limited to, bellows seals such that any particulate generated by the drives are contained and do not contaminate any substrates entering or exiting the load lock 10100. The doors 10130, 10120 may be coupled to their respective drives in any suitable manner. For example, door 10130 may be coupled to upper drive 10210A by link 10204A and to upper drive 10200A by link 10204B. As can be seen in the Figures the links 10204A, 10204B run substantially parallel with the contact surface 10230 but may be suitably spaced apart from the contact surface 10230 to, for example, avoid particle generation. In one exemplary embodiment, the links may extend from a respective door 10130, 10120 and be of unitary construction with the door. In other exemplary embodiments the door and their respective links may be an assembly where the links are coupled to the doors in any suitable manner. The door 10120 may be coupled to lower drive 10210B by link 10203A and to lower drive 10200B by link 10203B. It is noted that the links 10204A, 10204B, 10203A, 10203B are located in front of the contact surface 10230 such that sufficient clearance exists between the contact surface 10230 and the links to substantially prevent or minimize particle generation and substrate contamination. In alternate embodiments the links 10204A, 10204B, 10203A, 10203B may have any suitable spatial relationship with the contact surface 10230 and be configured to minimize particle generation. The links 10204A, 10204B, 10203A, 10203B may be coupled to their respective drives 10210A, 10210B, 10200A, 10200B such that as the doors are opened and closed the doors remain parallel to the contact surface 10230 of the load lock 10100. In alternate embodiments the links 10204A, 10204B, 10203A, 10203B may be coupled to their respective drives to allow the doors to rotate with respect to the contact surface 10230 as the doors are opened and closed.

Figure 15A:
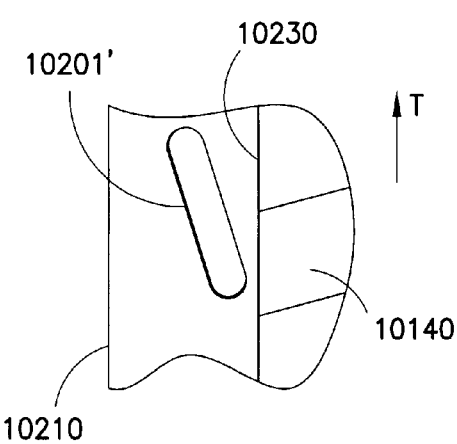
FIGS. 15A, 15B illustrate portions of a door drive system in accordance with exemplary embodiments.
Figure 15B:
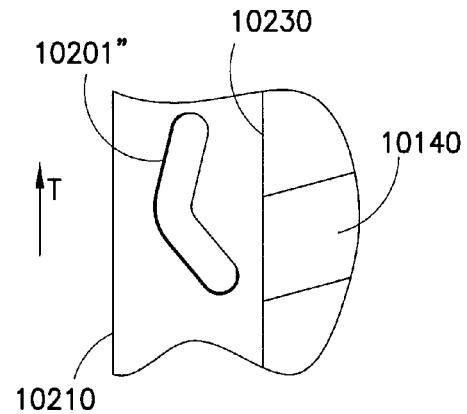

It is noted that the openings 10201-10204 are shown in the Figures as being substantially straight such that the doors 10130, 10120 travel in a substantially straight line that is substantially parallel to the contact surface 10230 of the load lock. In other exemplary embodiments the openings 10201-10204 may have any suitable shape as will be described in greater detail below. Any suitable seal may be provided between the doors 10130, 10120 and the contact surface 10230 to prevent leakage to or from an internal atmosphere of the load lock chambers 10140, 10150. The seal in this exemplary embodiment may be configured to minimize friction and particulate generation as the doors are opened and closed. In other exemplary embodiments, the openings 10201-10204 may be angled or configured as can be seen in FIGS. 15A, 15B such that as the doors 10130, 10120 are opened, the doors 10130, 10120 are moved away from the contact surface 10230 to prevent rubbing of the doors and/or seal against the contact surface 10230. In FIG. 15A the opening 10201' is shown as being angled away from the contact surface 10230 such that as the door is moved in the direction of arrow T the opening 10201' guides the door away from the contact surface 10230 and vice versa. FIG. 15B shows the opening 10201" having a cam configuration that guides the door away from the contact surface 10230 as the door is moved in the direction of arrow T and towards the contact surface 10230 as the door is closed in the direction opposite arrow T to effect the seal between the door and the contact surface 10230. The drives 10210A, 10210B, 10200A, 10200B may be suitably coupled to the links 10204A, 10204B, 10203A, 10203B to allow the camming movement of the doors 10130, 10120 as described with respect to FIGS. 15A, 15B. In other exemplary embodiments the doors may be driven within the openings shown in the Figures by two axis drives such that there is substantially no contact between the links 10204A, 10204B, 10203A, 10203B and their respective openings. In alternate embodiments the doors may be driven in any suitable manner.

Figure 16:
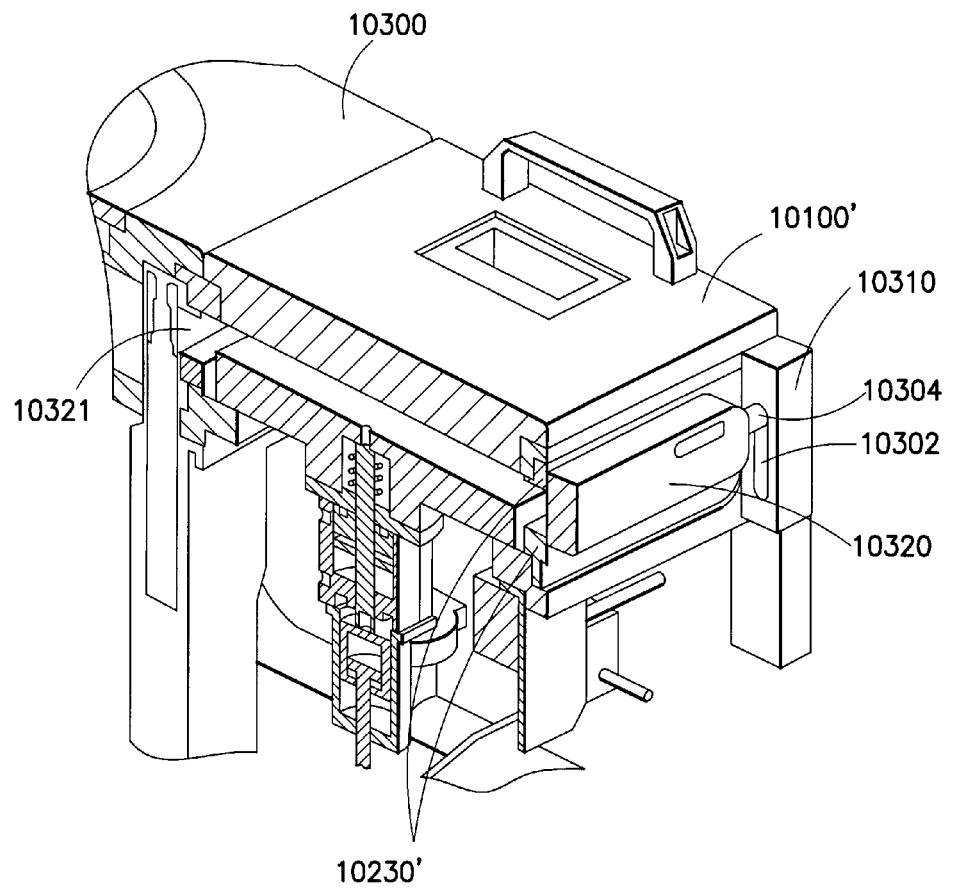
FIG. 16 illustrates a sectional view of a processing system incorporating features of exemplary embodiments.
Figure 16A:
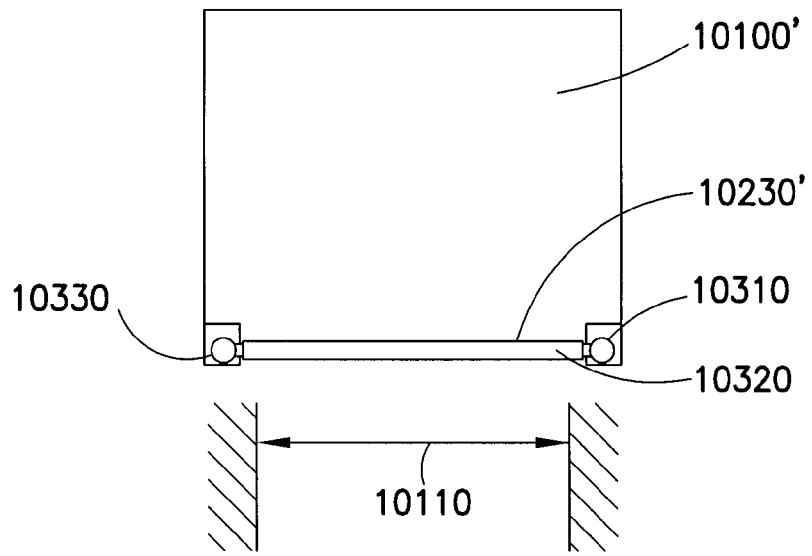
FIG. 16A illustrates a top view of the load lock of FIG. 16 in accordance with an exemplary embodiment.
Figure 16B:
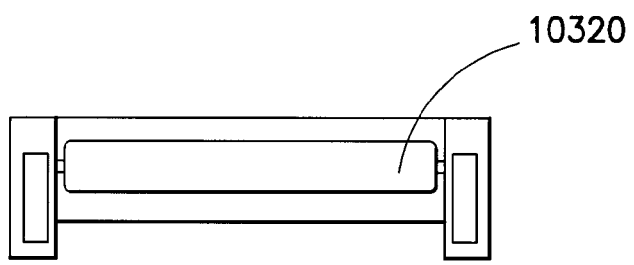
FIGS. 16B and 16C illustrate front views of the load lock of FIG. 16 in two configurations in accordance with an exemplary embodiment.
Figure 16C:
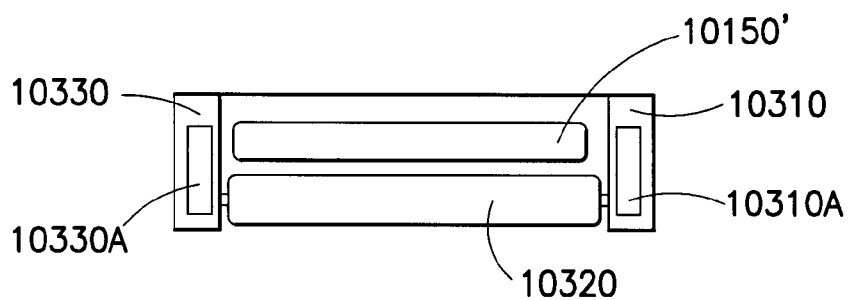

Referring now to FIGS. 16 and 16A-16C, an exemplary load lock 10100' is shown in accordance with an exemplary embodiment. In FIG. 16 the load lock may be substantially similar to load lock 10100 described above (unless otherwise noted) and is shown in part of a substrate processing system where the load lock 10100' is coupled to a processing module 10300. In this example the load lock 10100' is configured as a single chamber load lock. In alternate embodiments the load lock 10100' may have any suitable number of chambers. The load lock 10100' may include chamber 10150', seal contact surface 10230', an atmospheric door 10320 and drive modules 10310, 10330. As noted above the drive modules 10310, 10330 are located outside of the substrates transfer zone 10110 as can be seen in FIG. 16A. The drive modules 10310 and 10330 may include drives 10310A, 10330A and openings 10302. The drives 10310A, 10330A may be substantially similar to drives 10200A, 10200B, 10210A, 10210B described above. It is noted that in other exemplary embodiments, as described above with respect to FIGS. 14A-E and 15, the load lock 10100' may have one drive on either side of the door that supports and effects movement of the door 10320 while a passive bearing may be located on the other side of the door for supporting and allowing movement of the door 10320. The openings 10302 may be substantially similar to openings 10201-10204 described above. In this example, the links 10304, which are substantially similar to links 10204A, 10204B, 10203A, 10203B described above, may couple the atmospheric door 10320 to the drives 10310A, 10330A through the slots 10302 in any suitable manner, such as in the manner described above. In alternate embodiments the door 10320 may be coupled to the drives 10310A, 10330A in any suitable manner. It is noted that the load lock 10100' may also include a vacuum valve or door 10321 that may be substantially similar to door 10320 and operate in a substantially similar manner as that described with respect to door 10320. In alternate embodiments, the vacuum valve or door 10321 may have any suitable configuration.

Figure 17:
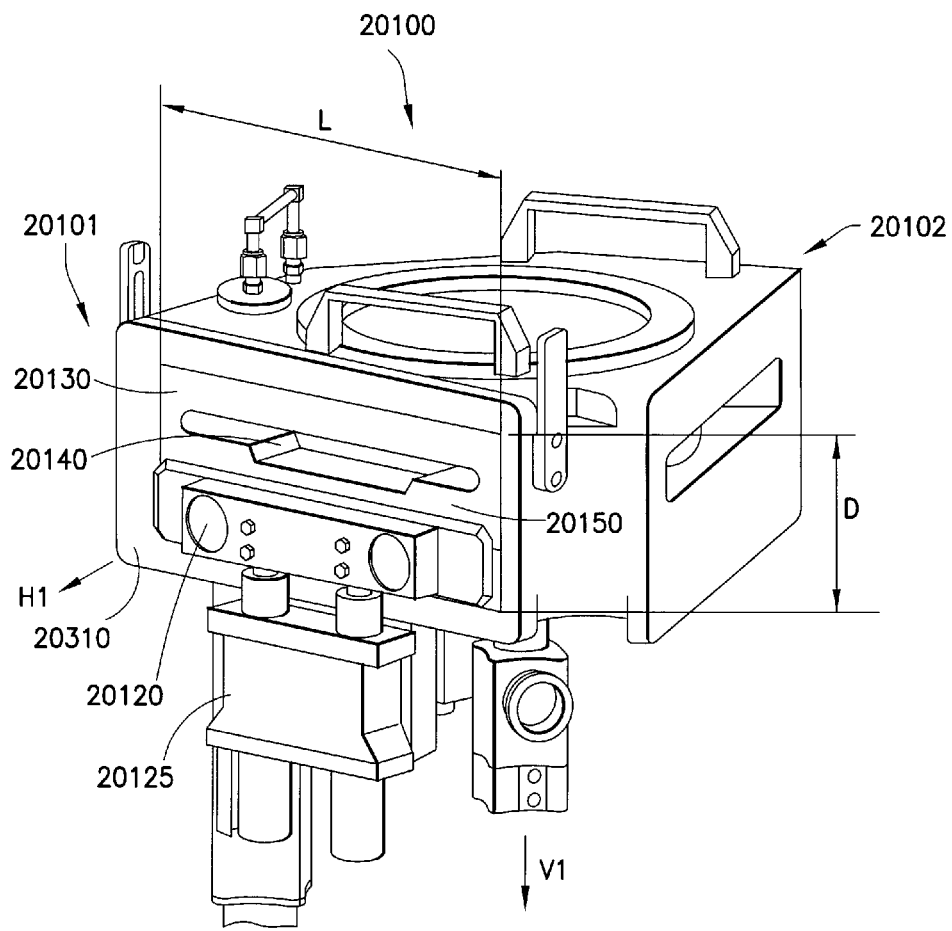
FIG. 17 shows an isometric view of a load lock incorporating features of an exemplary embodiment.
Figure 18:
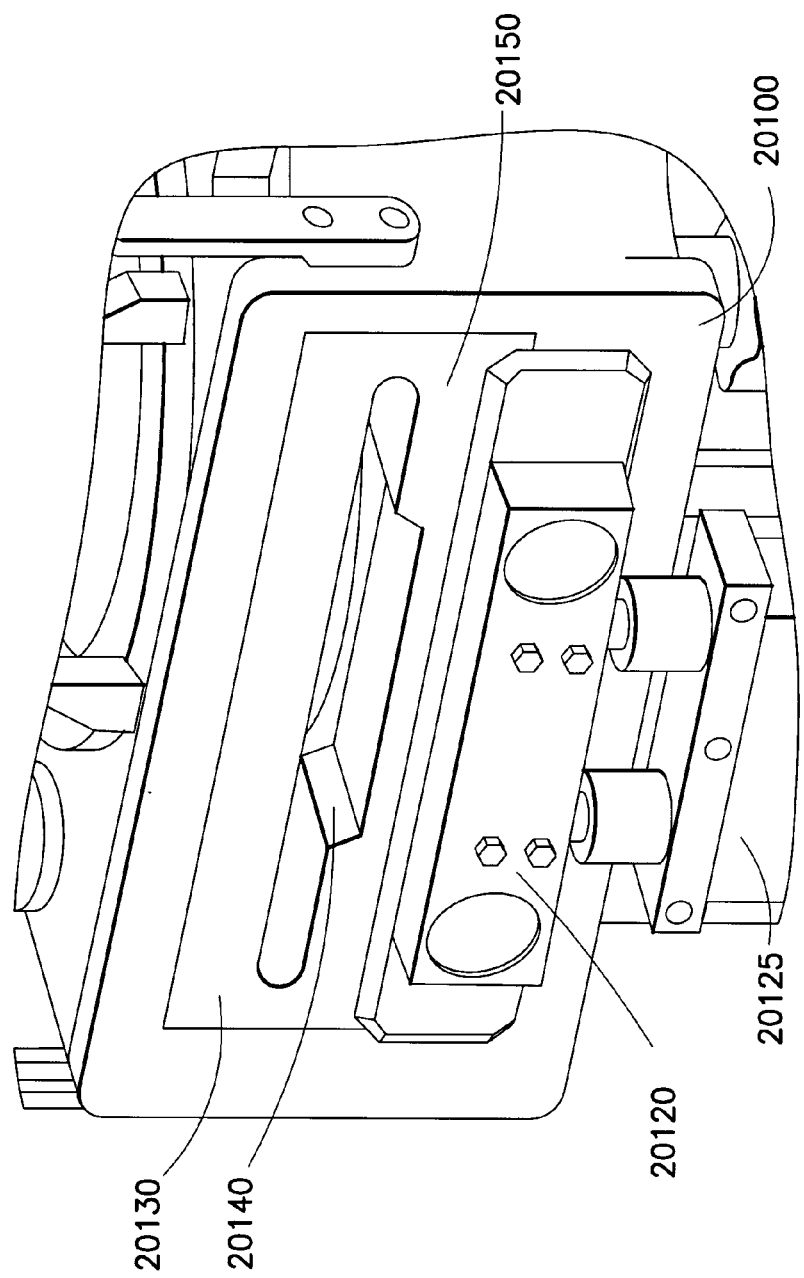
FIG. 18 shows an isometric view of a load lock/door interface in accordance with an exemplary embodiment.
Figure 19:
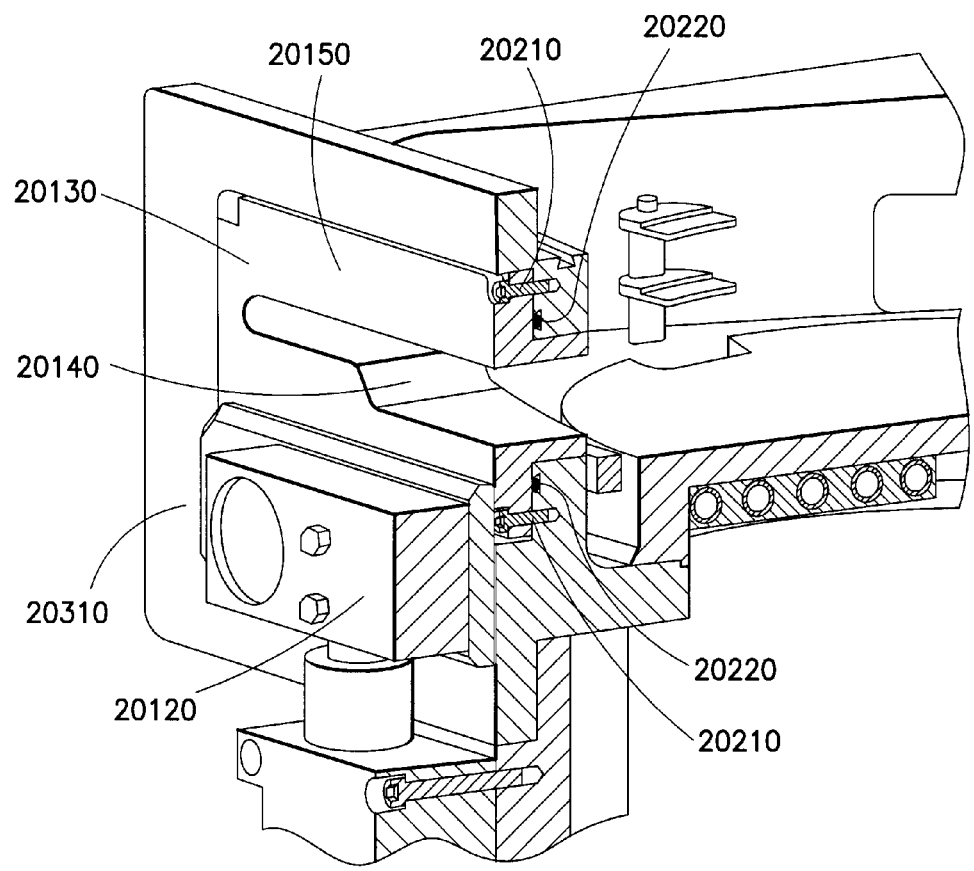
FIG. 19 illustrates a sectional view of a load lock/door interface in accordance with an exemplary embodiment with the door in a first position.

Referring now to FIGS. 17 and 18 an exemplary load lock 20100 is shown in accordance with an exemplary embodiment. In this example, the load lock 20100 is configured as a right angle load lock in that the atmospheric interface 20101 is located at substantially ninety-degrees in relation to the vacuum interface 20102. In alternate embodiments the load lock may have any suitable configuration where the atmospheric interface 20101 has any suitable angular or spatial relationship with the vacuum interface 20102.

Figure 20:
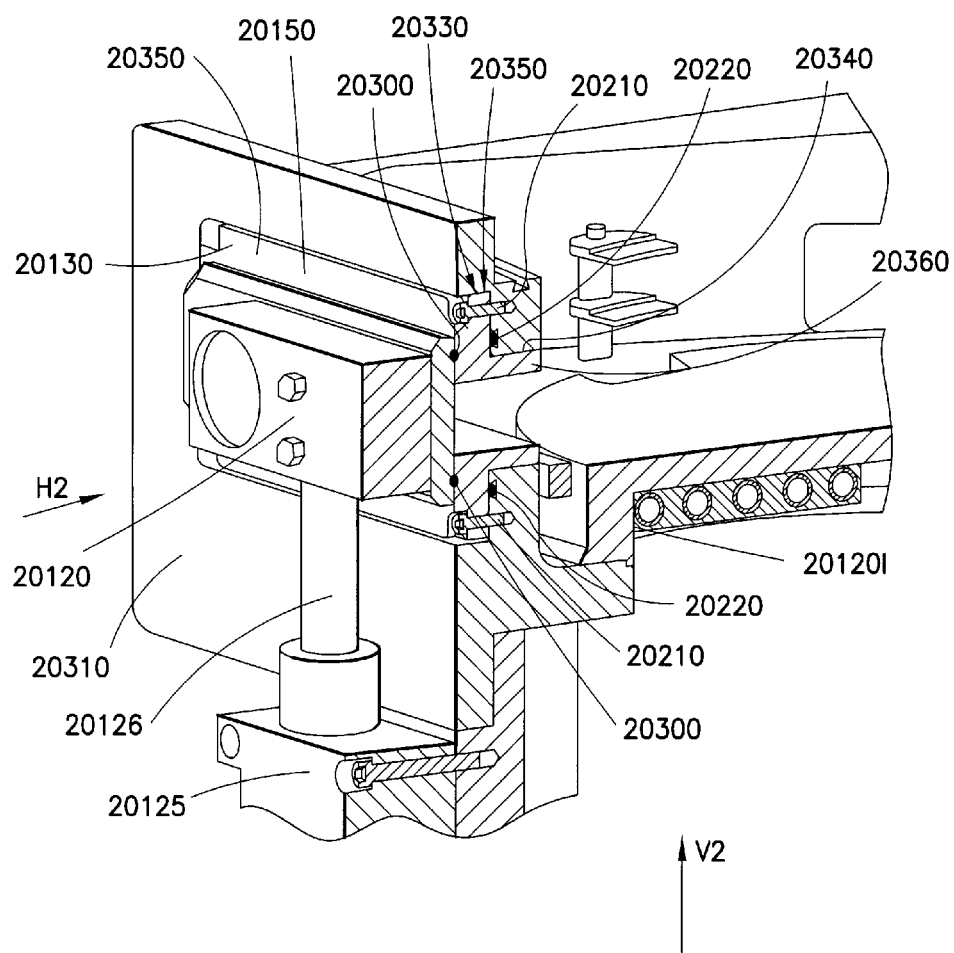
FIG. 20 illustrates a sectional view of a load lock/door interface in accordance with an exemplary embodiment with the door in a second position.

In this exemplary embodiment, the atmospheric interface 20101 of the load lock 20100 includes a load lock door insert 20130, an atmospheric door 20120 and a door drive unit 20125. It is noted that the vacuum interface of the load lock 20100 may be configured in a substantially similar manner to that described with respect to the atmospheric interface 20101. In alternate embodiments, the vacuum interface may have any suitable configuration. The door drive unit 20125 is configured to, for example open the atmospheric door 20120 by moving the door away from the insert face 20150 substantially in the direction of arrow H1 and then away from the substrate opening 20140 substantially in the direction of arrow V1. Referring also to FIG. 20, the drive unit 20125 may be configured to close the atmospheric door 20120 in substantially the opposite manner. For example, the drive unit may move the door 20120 substantially in the direction of arrow V2 such that the door is inline with the substrate opening 20140 and then substantially in the direction of arrow H2 to position the door 20140 over the opening 20140. As can be seen in FIG. 17, the drive unit 20125 for the door 20120 is located below the door 20120 but in alternate embodiments the drive may have any suitable location relative to the door including, but not limited to, being located on the sides of the door as described above with respect to FIGS. 14A-16C. The drive unit 20125 may be any suitable drive unit including, but not limited to, pneumatic, electrical, hydraulic and magnetic drives. A seal is formed between the door 20120 and the door insert face 20150 when the door is brought over the opening by virtue of a compression of the door seal 20300 against the insert face 20150.

Referring still to FIG. 17 and also to FIG. 20, the atmospheric door 20120 may be suitably connected to the drive unit 20125 in any suitable manner such as by, for example, one or more drive shafts 20126. The door 20120 may be suitably sized to fit over the substrate opening 20140 such that a portion of the door overlaps the insert face 20150 so that a seal may be made around the substrate opening 20140. Any suitable seal 20300 may be coupled to a perimeter of the door surface 201201 that interfaces with the insert face 20150. The seal 20300 may be constructed of any suitable material for providing a seal between the door surface 201201 and the insert face 20150.

Figure 21:
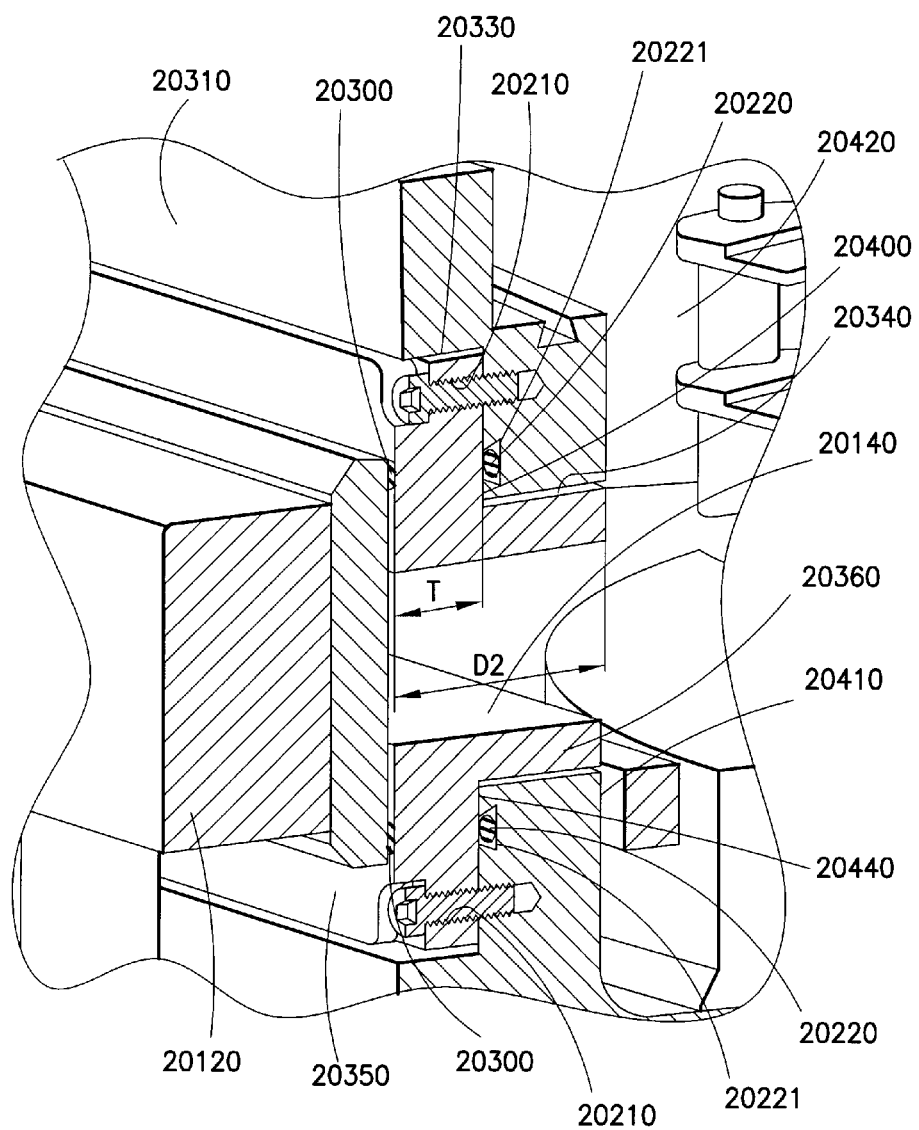
FIG. 21 shows another sectional view of the load lock/door interface of FIG. 203.

The door insert 20130 may be inserted into a correspondingly shaped opening 20330 in the surface 20310 at the atmospheric interface 20101 of the load lock 20100. Referring now to FIGS. 17-21 the door insert 20130 may be constructed of any suitable material including, but not limited to, metals, plastics, ceramics, composites or any combination thereof. The insert 20130 includes an outer peripheral portion 20350 and an inner channel portion 20360. The outer peripheral portion 20350 may have any suitable thickness T for providing wear resistance and protection to the atmospheric interface 20101 of the load lock 20100. The outer peripheral portion 20350 may have a length L and height D (see FIG. 17) of any suitable size such that the outer peripheral portion extends past the edges of the door 20120 when the door is in the closed position as can be seen in FIGS. 20 and 21. In other exemplary embodiments, the length L and height D of the outer peripheral portion 20350 of the insert 20130 may be of a suitable size such that the insert extends past the door seal 20300 but not past the door edges. In alternate embodiments the outer peripheral portion 20350 of the insert may have any suitable dimensions. The outer peripheral portion 20350 may have openings 20210 spaced around, for example, its outer periphery. The openings may be any suitable openings that allow the passage of, for example, removable fasteners including, but not limited to, bolts and screws for removably coupling the insert 20130 to the load lock 20100. In alternate embodiments the insert 20130 may be coupled to the load lock 20100 in any suitable manner including, but not limited to, chemical, magnetic and vacuum couplings.

The inner channel portion 20360 may form the substrate opening 20140 for the passage of substrates into and out of the load lock 20100. As can be seen best in FIG. 17 the opening 20140 formed by the inner channel portion 20360 may have any suitable shape configured to allow the substrate and at least an end effector (or a portion thereof) of a transport robot carrying the substrate to pass through the opening 20140. In one exemplary embodiment the channel portion 20360 may be sized such that minimal clearance is provided between walls of the channel portion 20360 and the substrate and at least the end effector. The inner channel portion 20360 may project past a back surface 20400 of the outer peripheral portion 20350 any suitable distance D2 as can best be seen in FIG. 21. In this example the inner channel portion 20360 extends to an inner surface 20410 of the load lock chamber 20420. In alternate embodiments the inner channel portion 20360 may extend beyond or in front of the inner surface 20410 of the load lock chamber 20420. In other alternate embodiments the channel portion 20360 may not extend past the back surface 20400 of the outer peripheral portion 20350.

The corresponding opening in the surface 20310 of the load lock atmospheric interface 20101 may have an outer recess 20330 and an inner channel opening 20340. The outer recess 20330 may have a depth substantially equal to the thickness T of the outer peripheral portion 20350 of the insert 20130 and a length and height larger than the length L and height D of the insert 20130 such that sufficient clearance exists around the outer peripheral portion 20350 of the insert 20130 and the recess 20330 to allow for insertion and removal of the insert 20130 in the recess 20330. In alternate embodiments the outer recess may have any suitable dimensions. In still other alternate embodiments the outer recess may be configured for press or interference fit with the insert 20130. The inner channel opening 20340 may be suitably sized so that suitable clearance exists between the inner channel opening 20340 and the inner channel portion 20360 of the insert 20130 to allow for easy removal and insertion of the insert 20130. In alternate embodiments the clearance may be minimized such that an interference or press fit is created when the insert 20130 is inserted in to the outer recess 20330 and inner channel opening 20340. As may be realized, although the Figures show the insert 20130 being located in the recess 20330, in alternate embodiments the back of the insert 20440 (See FIG. 21) may interact with surface 20310 of the load lock 20100 (e.g. the insert is not recessed in the surface 20310).

As can be seen best in FIG. 21, the back surface 20400 of the outer recess 20330 includes a channel 20221 that circumscribes the inner channel opening 20340. In this example the channel 20221 is located between inner channel opening 20340 and the openings 20210 for the removable fasteners. In alternate embodiments the channel 20221 may be located in any suitable relation with respect to the inner channel opening 20340 and the openings 20210 for the removable fasteners. In still other alternate embodiments the channel may be located between inner channel portion 20360 and inner channel opening 20340. The channel 20221 may be configured to accept and retain, for example, an O-ring or any other suitable seal 20220. The seal 20220 may be made of any suitable material for effectuating a seal between the back surface 20400 of the recess 20330 and the insert 20130 when the fasteners, for example, compress the seal 20420 as the insert 20130 is coupled to the load lock 20100. The seal 20420 may allow the vacuum or other controlled atmosphere inside the load lock 20100 to be maintained when the load lock 20100 is pumped down or vented. In alternate embodiments where there is no recess in the surface 20310 the seal 20420 may be located in, for example, the surface 20310 for sealing between the insert 20130 and the load lock frame. In other alternate embodiments the vacuum inside the load lock 20100 may be maintained in any suitable manner.

In operation, as the load lock is used, the substrates and/or transfer robots may impact the sealing surface 20150 of the insert 20130 causing scratches in or otherwise damaging the surface 20150. Debris on the door seal 20300 or worn door seals 20300 may also damage the surface 20150. Faulty door motion may also cause the door to impact the surface 20150 causing damage. These scratches and other damage to the surface 20150 may cause leakage of the atmosphere within the load lock 20100. Rather than dismantle the load lock 20100 from the substrate processing system and sending the load lock to, for example a machine shop to be repaired, a user of the load lock can remove the damaged insert 20130 and replace it with a new insert to minimize downtime of the load lock and its associated processing equipment. The damaged insert may be constructed so that the surface 20150 can be machined or otherwise repaired so that the inserts may be reused.

The removable inserts 20130 described herein provide a fast cost effective way to maintain the atmospheric interface 20101 of, for example, a load lock 20100 without having to machine or replace the load lock because of damaged sealing surfaces. The seal 20220 between the insert 20130 and the load lock 20100 maintains the vacuum or other atmosphere within the load lock chamber 20420. As may be realized, the removable inserts described herein may be incorporated into any suitable door of a substrate processing system.

Figure 22:
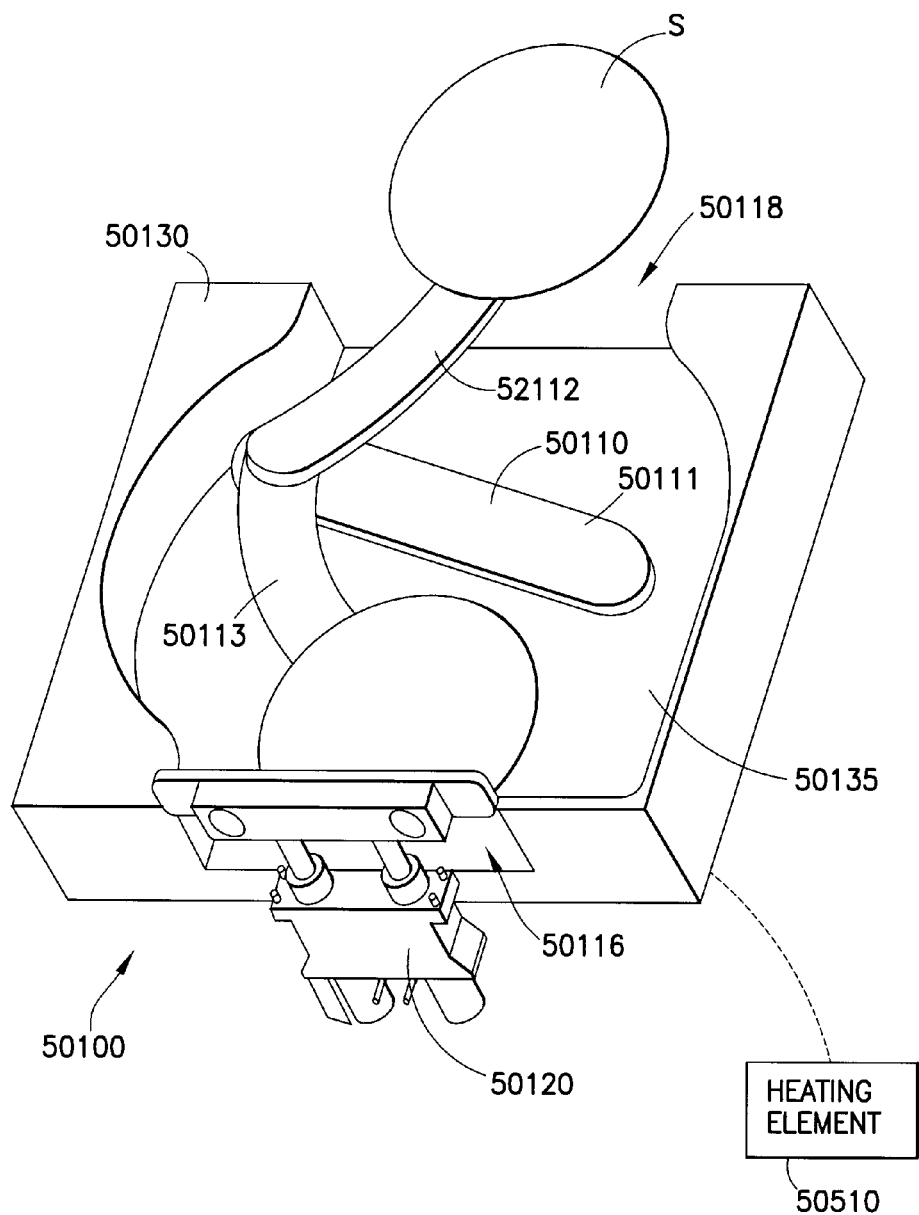
FIG. 22 is a schematic perspective view of a portion of load lock module, incorporating features in accordance with an exemplary embodiment.

As can be seen in FIG. 22 the load lock module 50100 may include a frame or housing 50130 that forms a chamber 50135 (the top of the chamber is removed for illustrative purposes). In one embodiment the chamber 50135 may be isolatable from an external atmosphere and may be capable of holding, for example, a vacuum or any other suitable controlled or clean atmosphere. The chamber 50135 may have substrate transport opening(s) 50116, 50118 on the sides of the load lock module 50100. The location of the transport openings 50116, 50118 shown in the figures is merely exemplary, and in alternate embodiments the chamber may communicate with openings in any other desired sides of the modules (such as the adjacent sides). Each transport opening of the chamber (s) may be independently closable by any suitable door/slot valve(s) 50120 (only one of which is shown) for sealing and isolating the chamber 50135 from an external atmosphere(s). In one exemplary embodiment, a substrate transfer apparatus 50110 may be located at least partly within the chamber 50135 for transporting substrates S through the module 50100. In other exemplary embodiments, as will be described below with respect to FIGS. 1A and 1B, the load lock module 50100 may not have a substrate transport where substrates are placed in and removed from the load lock module by substrate transports located in other parts of the processing tool or system such as, for example, an equipment front end module and/or vacuum back end. In still other exemplary embodiments the load lock module 50100 can include any suitable substrate processing apparatus including, but not limited to, aligners, heaters, coolers and metrology tools.

In this example the transfer apparatus 50110 is shown as having an upper arm 50111 rotatably coupled to a drive section (not shown). In alternate embodiments, the transfer apparatus may have any suitable number of upper arms. Two forearms 50112, 50113 are rotatably coupled to an end of the upper arm 50111 at an elbow joint. In alternate embodiments, the transfer apparatus may have more or less than two forearms coupled to the upper arm(s). As may be realized each of the forearms 50112, 50113 includes an end effector or substrate holder 50410 (See FIG. 23A) configured for holding one or more substrates. Examples of suitable transfer apparatus can be found in U.S. patent application Ser. No. 11/179,762, entitled "Unequal Link Scara Arm" and filed on Jul. 11, 2005; U.S. patent application Ser. No. 11/104,397, entitled "Fast Swap Dual Substrate Transport For Load Lock" and filed on Apr. 12, 2005; and U.S. Pat. No. 6,918,731, the disclosures of which are incorporated by reference herein in their entirety. In alternate embodiments the transfer apparatus 50110 may be any suitable transfer apparatus having any suitable arm link configuration including, but not limited to, transfer apparatus having bearing drives, self-bearing drives and magnetically levitated arm segments or links.

As will be described in greater detail below, the module 50100 may be configured to maximize the throughput of substrates S that can be passed through the module 50100 and the processing tool, of which the module 50100 is coupled to, while at the same time minimizing the generation of particles that may contaminate those substrates during pump down and venting cycles of the load lock module 50100.

As noted above, the load lock module 50100 may communicate between different sections (not shown) of a processing tool each for example with different atmospheres (e.g. inert gas on one side and vacuum on the other, or atmospheric clean air on one side and vacuum/inert gas on the other. In this example, the load lock module 50100 may define one chamber 50135 therein for holding substrates. In alternate embodiments, the load lock module 50100 may have more than one chamber where, for example each chamber may be capable of being isolated and capable of having chamber atmosphere cycles that match atmospheres in the tool sections adjoining the module. In the exemplary embodiment the load lock module chamber 50135 is compact allowing for rapid cycling of the chamber atmosphere.

Figure 23A:
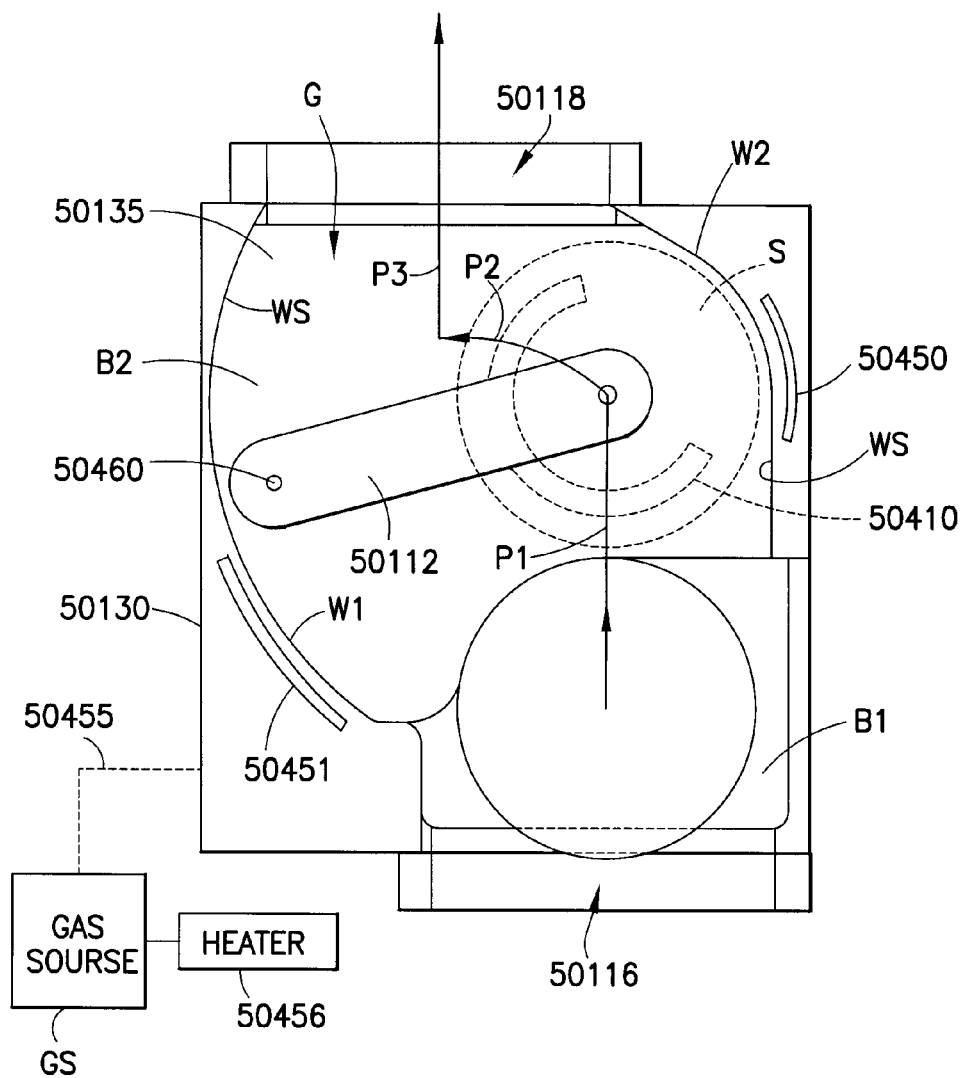
FIGS. 23A-23C illustrate a load lock module in accordance with an exemplary embodiment.
Figure 23B:
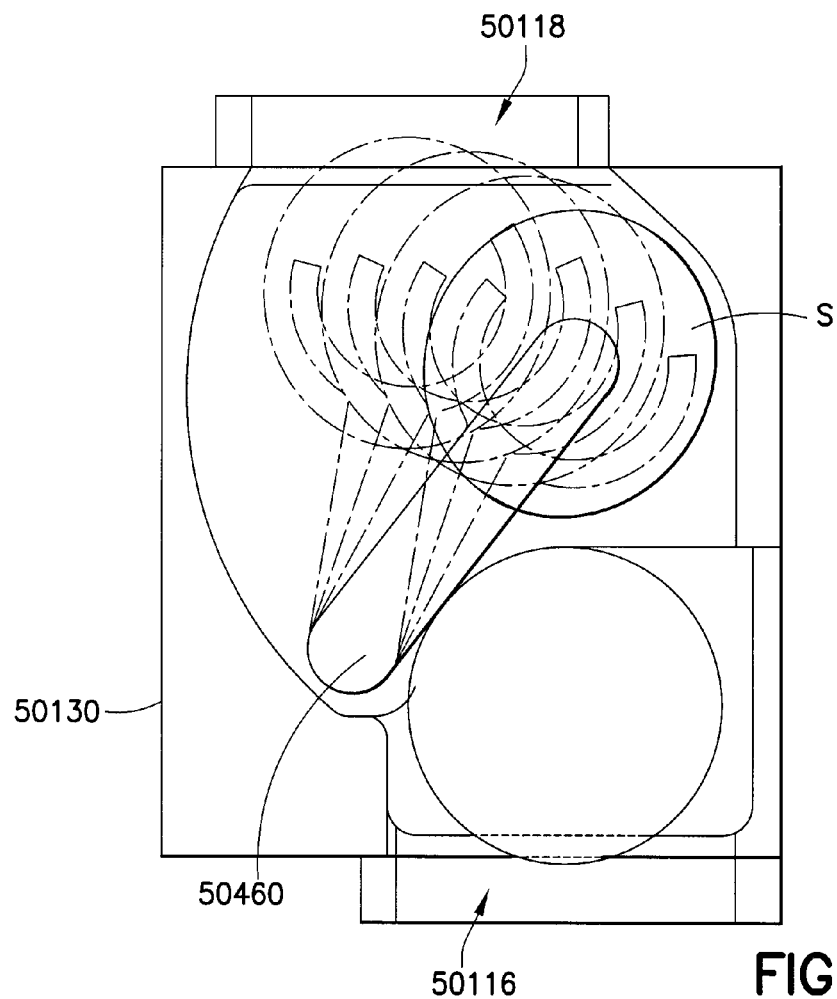

Referring now to FIGS. 23A and 23B the load lock module 50130 will be described in greater detail. In one aspect the chamber 50135 is configured to have a minimized internal volume with respect to, for example, the paths of motion of the components within the chamber 50135 and/or the path of substrate(s) S passing though the chamber 50135. In one exemplary embodiment the side walls W1, W2 of the chamber 50135 may be contoured to follow a path of the substrate S and/or arm link(s) 50112 of the transfer apparatus while allowing only a minimal clearance between the substrate and/or arm link and the walls W1, W2. As can be seen in FIGS. 23A and 23B, wall W1 is contoured to follow the arcuate motion of the elbow joint 50460 connecting the upper arm 50111 and forearm 50112 of the transfer apparatus 50110. Wall W2, in this example, is contoured to follow a path of an edge of the substrate S as the substrate is carried through the load lock module 50130 by the transfer apparatus 50110.

Figure 23C:
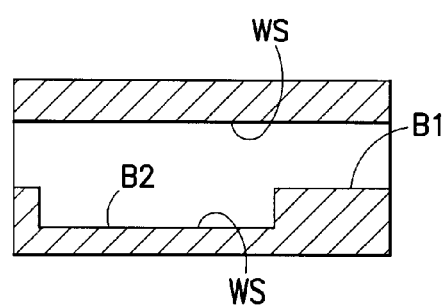

In this example, the bottom and/or top of the chamber 50135 may also be contoured to provide only a minimal clearance between the movable components of the load lock module 50100 and the top and/or bottom of the chamber 50135. For example, surface of section B1 of the bottom of the chamber 50135 may be raised relative to the surface of section B2 of the bottom of the chamber 50135 (See FIG. 23C). For example, section B1 may only provide clearance for the end effector and substrate seated thereon while section B2 provides clearance for the upper arm 50111 and forearms 50112, 50113 of the transfer apparatus 50110 in addition to providing clearance for the end effector and substrate seated thereon. As may be realized the top of the chamber may also be contoured in a manner similar to that described above with respect to the bottom of the chamber 50135. Suitable examples of load lock chambers with contoured internal surfaces include U.S. patent application Ser. No. 11/104,397, entitled "Fast Swap Dual Substrate Transport For Load Lock" and filed on Apr. 12, 2005; and U.S. Pat. No. 6,918,731, previously incorporated by reference and U.S. Provisional Patent Application No. 60/938,913, entitled "Compact Substrate Transport System With Fast Swap Robot" and filed on May 18, 2007, the disclosure of which is incorporated by reference herein in its entirety. In alternate embodiments the chamber may have any suitable shape and contour for minimizing the internal volume. As may be realized this minimized internal volume of the chamber 50135 minimizes the volume of gas moved into or out of the chamber 50135 during the pump down and vent cycles. This reduced volume of gas G may reduce the cycle times for transferring a substrate(s) through the load lock module 50100 as less gas G has to be evacuated or introduced into the chamber 50135.

In one exemplary embodiment, still referring to FIGS. 23A and 23B, as described above, the internal surfaces of the chamber 50135 (i.e. top, bottom and side walls) may be configured to include one or more heating elements (or surfaces) 50450, 50451. In one embodiment the heating elements 50450, 50451 may be embedded within one or more walls of the chamber 50135 such that the gas G within the chamber is heated. In this example, the gas G within the entire chamber may be heated to, for example, a substantially uniform temperature. In alternate embodiments gas G within any suitable portion of the chamber may be heated. In other alternate embodiments the gas G may not be uniformly heated. As may be realized, in other exemplary embodiments, the heating elements may also maintain a temperature of the gas G within the chamber 50135. For example, the gas G may be introduced to the internal volume of the chamber through, for example, any suitable flow lines 50455 at a predetermined elevated temperature. In one exemplary embodiment a gas source GS connected to the chamber through the flow lines 50455 may include a gas heater 50456 for raising the temperature of the gas G to a predetermined temperature before the gas G is introduced in the chamber 50135. In alternate embodiments the gas G may be heated in any suitable manner before it is introduced in the chamber 50135.

While only two heating elements 50450, 50451 are shown for exemplary purposes, it should be realized that the load lock module may include any suitable number of heating elements. In this example, the heating elements are suitably located or embedded within the chamber walls for heating the walls of the chamber and hence the gas G therein. In other exemplary embodiments the walls of the chamber 50135 themselves may be the heating elements. For example, the surface WS (or any other suitable portion) of one or more walls of the chamber 50135 may be configured as a heating element for transferring heat into the gas within the chamber 50135. In alternate embodiments the one or more heating elements may be modular heating elements that are removably inserted within the chamber walls. In other alternate embodiments the one or more heating elements may be affixed to the surfaces of the chamber 50135 in any suitable manner. For example, the walls of the chamber may be constructed of a conductive material such as aluminum alloy (or any other suitable material for example). The heating elements may be affixed to a surface (interior or exterior) of one or more walls for conductively heating the walls to a predetermined temperature.

In one exemplary embodiment, the heating elements 50450, 50451 may be located around the chamber to provide any suitable heating distribution. In one exemplary embodiment the heating elements 50450, 50451 may be located such that the temperature of the gas G within the chamber is substantially uniform throughout the chamber 50135. In alternate embodiments the heating elements may be located such that a temperature gradient is created. For example, the temperature at the bottom of the chamber may be higher than the temperature at the top of the chamber so that any particles that may be generated within the transport are carried to the bottom of the chamber. As may be realized a suitable filtering system may be provided at the bottom of the chamber 50135 to contain the particles as they flow to the bottom of the chamber via the effects of the temperature gradient.

The heating elements 50450, 50451 may be any suitable heating elements having any suitable configuration. For example, in one exemplary embodiment the heating elements may be any suitable electric heating elements. In other exemplary embodiments the heating elements may include conduits within the chamber walls for passing a hot fluid through the walls. These heating elements may raise the temperature of the walls of the chamber 50135 so that the walls suitably increase the temperature of the gas within the chamber to minimize particle generation during, for example, pump down of the chamber 50135. The gas temperature within the chamber 50135 the during pump down cycle can be described as:

$$T_{GAS} = T_0 + (T_{convection} - T_{adiabatic}) \quad [1]$$

Where $T_0$ is an initial gas temperature, $T_{adiabatic}$ is the temperature drop due to the gas expansion and $T_{convection}$ is the temperature rise due to heat transfer from the walls of the chamber. The rate of change of the adiabatic temperature drop can be written as:

$$\frac{dT_{adiabatic}}{dt} = \frac{T_{GAS}S_{eff}}{V}(\gamma - 1) \qquad [2]$$

where $T_{GAS}$ is the current gas temperature, $S_{eff}$ is the effective pumping speed, V is the load lock volume and $\gamma$ is the gas heat capacity ratio. In alternate embodiments any suitable equation can be used to define the adiabatic temperature drop. As can be seen from equation [2], to decrease the rate of change of the adiabatic temperature drop either the pumping speed is decreased or the volume of the chamber is increased both of which may result in an increase in pumping time.

Figure 24:
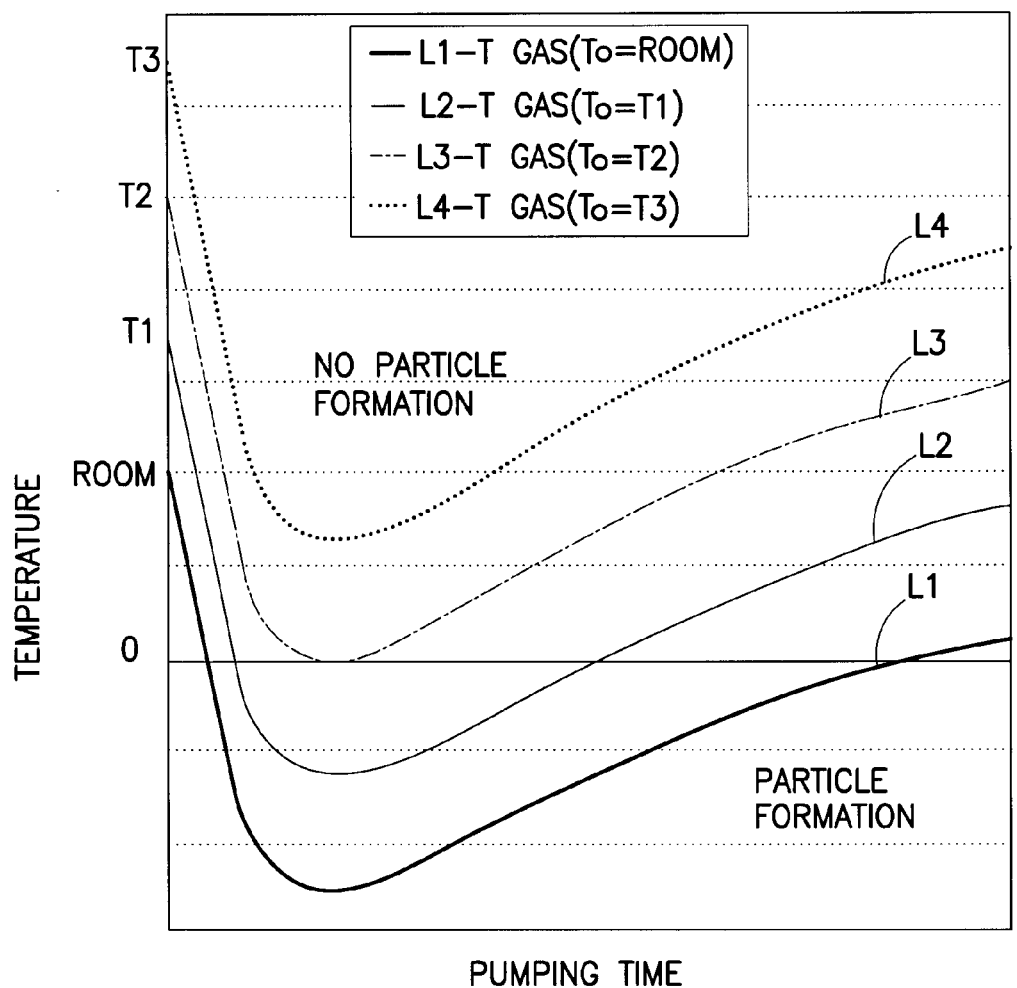
FIG. 24 illustrates a graph showing aspects of an exemplary embodiment.

Referring now to FIG. 24, an increase in the chamber wall temperature increases the amount of heat generated by convection. The rate of change of the convectional temperature can be described as:

$$\frac{dT_{convection}}{dt} = \frac{hS}{\rho C_V V}(T_0 - T_{GAS}) \qquad [3]$$

where h is the convective heat transfer coefficient, S is the load lock surface area, $\rho$ is the gas density and $C_V$ is the gas heat capacity. In alternate embodiments any suitable equation can be used to define the rate of change of the convectional temperature. For exemplary purposes only, if the gas temperature within the chamber during a pump down cycle remains at 20° C., the gas will remain in a zone where no particles are generated. As can be seen in FIG. 24, in accordance with another exemplary embodiment, the initial gas temperature within the chamber during a pump down cycle may be increased by, for example, convectional heat transfer between the walls of the chamber 50135 and the gas G so that as the gas temperature decreases during adiabatic expansion, the gas temperature does not fall into the zone of particle formation during pump down at increased or maximized pumping speeds. As can be seen in FIG. 24, the lines L1-L4 represent the gas temperature relative to the pumping time of a pump down cycle for a load lock chamber, such as for example chamber 50135. As can be seen in FIG. 24, raising the initial gas temperature or otherwise maintaining the gas temperature above the particle formation temperature (via e.g. the convectional heat transfer between the chamber walls and the gas) allows for maximized pumping times while remaining in the particle free zone.

As may be realized, in some instances it may be impractical to have very high chamber wall temperatures. In this example, the surface area to volume ratio of the load lock chamber 50100 may be maximized (in a manner substantially similar to that described above with respect to e.g. FIGS. 23A and 23B) so that optimal convectional heat transfer from the heated walls to the gas can occur. Having a maximized surface area to volume ratio of the chamber 50100 and the heated chamber walls may allow for a load lock having a minimized pump down cycle time while preventing the formation of particles within the chamber 50100.

In one exemplary embodiment the load lock chamber 50135 may also be configured for a minimized venting cycle time. In one example, the formation of particles and contamination within the load lock chamber 50135 during venting may be minimized or prevented by keeping a non-turbulent or laminar flow of gas into the load lock chamber 50135. In one example, the Reynolds number Re for the gas flow may be below about 2300. In alternate embodiments, any suitable Reynolds number or flow characteristic may be used. The Reynolds number for any specific venting manifold can be calculated using the following equation:

$$Re = \rho \frac{\upsilon \ell}{\eta} \qquad [4]$$

where $\rho$ is the density of the gas, $\upsilon$ is the gas velocity, l is the diameter of the flow channel and $\eta$ is the gas viscosity. In alternate embodiments any suitable equation(s) can be used to determine the Reynolds number. In one example the ratio of the gas flow to the maximal gas flow should not be more than 0.5 to 0.6 but in alternate embodiments the ratio may have any suitable value. As may be realized the cross over pressure from a soft vent to a fast vent within the chamber 135 may be geometry dependent and could be in the range from about a few torr to about several hundred torr and may be determined in any suitable manner such as, for example, experimentally.

Referring back to FIGS. 1A and 1B another exemplary load lock 100 is shown. The load lock 10 in this example, includes stacked load lock chambers 14A, 14B (two load lock chambers are shown for exemplary purposes but in alternate embodiments the load lock 10 may have more or less than two chambers). Each of the load lock chambers 14A, 14B may be substantially similar to the chamber 50135 described above such that each chamber includes one or more heating elements and has a maximized internal surface to volume ratio for effectively heating a gas located in each of the chambers. In this example, the load lock chambers 14A, 14B do not include a substrate transport, however in alternate embodiments one or more of the chambers 14A, 14B may include a substrate transport. In accordance with an exemplary embodiment, as can be seen in FIGS. 1A and 1B the load lock module 10 may have any suitable number of vent valves 42A, 42B. While two vent valves 42A, 42B are shown in the Figures it should be realized that there may be more or less than two vent valves. Each of the vent valves 42A, 42B may be modular vent valves as described above. In alternate embodiments the vent valves may have any suitable configuration. The vent valves 42A, 42B may be configured so that high volumetric flow rates of gas can flow through the valves into the chamber (s) 14A, 14B with low uniform gas velocities. As may be realized the gas exhausted from ports 50650A, 50650B (which may be substantially similar to ports 36A'-37B' as described above with respect to FIG. 7B) may have defined Reynolds number for low speed laminar flow and be configured to avoid particulate deposition on substrate(s) within the load lock module 10. In one exemplary embodiment, each of the vent valves 42A, 42B may include a diffuser/filter 651 installed at an entrance of a venting line to a respective one of the chamber 698, 699. In this example the diffuser 651 is shown as being located at the ports 650A, 650B but in alternate embodiments the diffuser may be located at any suitable location relative to the respective chambers 14A, 14B. The diffuser/filter 50651 may be any suitable diffuser/filter. In one example, the diffuser/filter 50651 may be configured to reduce the inlet particle concentration by about nine orders of magnitude with a removal rating of greater than about 0.003× $10^{-6}$ m diameter. As may be realized, minimized venting time of the chamber(s) 14A, 14B may be dependent on the internal volume of the respective chamber(s) 14A, 14B. In one exemplary embodiment, the internal volume of the chamber(s) 14A, 14B may be optimized for maximized throughput in a manner substantially similar to that described above with respect to FIGS. 23A and 23B.

Figure 25:
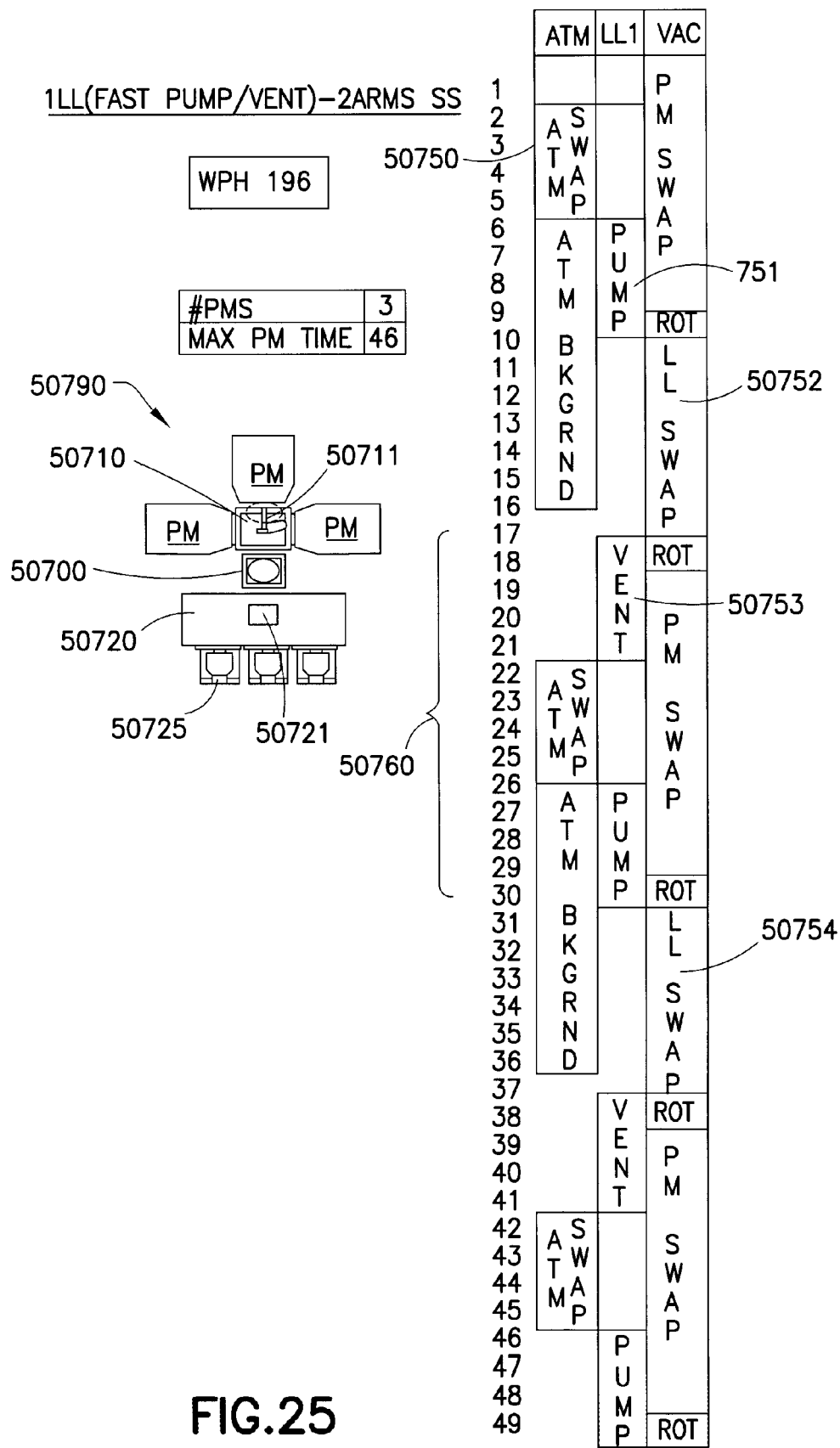
FIG. 25 illustrates a processing tool and associated flow chart in accordance with an exemplary embodiment.

Referring now to FIG. 25, an exemplary operation of a load lock module 50700 having optimized pumping and venting cycle times will be described. The load lock module 50700 may be substantially similar to load lock module 50100 described above and may include any suitable combination of the minimized internal load lock volume, heated load lock chamber walls and optimized vent valves as also described above. In this example, the load lock module 50700 connects front end module 50720 with the vacuum back end, which includes vacuum chamber 50710 and processing modules PM. Here, the load lock module 50700 does not include a substrate transport but in alternate embodiments the load lock module 50700 may include substrate transport. For exemplary purposes, substrates may be transferred from load ports 50725 by a transport 50721, located within the equipment front end module (EFEM) 50720, into the load lock module 50700. The substrates are removed from the load lock module 50700 by, for example, a transport 50711 in the vacuum back end 50710 and transferred to one or more of the processing modules PM. As may be realized transferring the substrates from the processing modules PM back to the load ports 50725 may occur in substantially the opposite manner. The transports 50721, 50711 in this example, may be configured for the fast swapping of substrates and may include, for example, multiple transport arms. Suitable transports include, but are not limited to those described in U.S. patent application Ser. Nos. 11/179,762; 11/104,397; and U.S. Pat. No. 6,918,731 previously incorporated by reference. Other suitable transfer apparatus include those described in U.S. Pat. Nos. 5,720, 590, 5,899,658, United States Publication No. 2003/0223853 and U.S. patent application Ser. No. 12/117,355, entitled "Substrate Transport Apparatus" and filed on May 8, 2008, the disclosures of which are incorporated by reference herein in their entirety.

Figure 26:
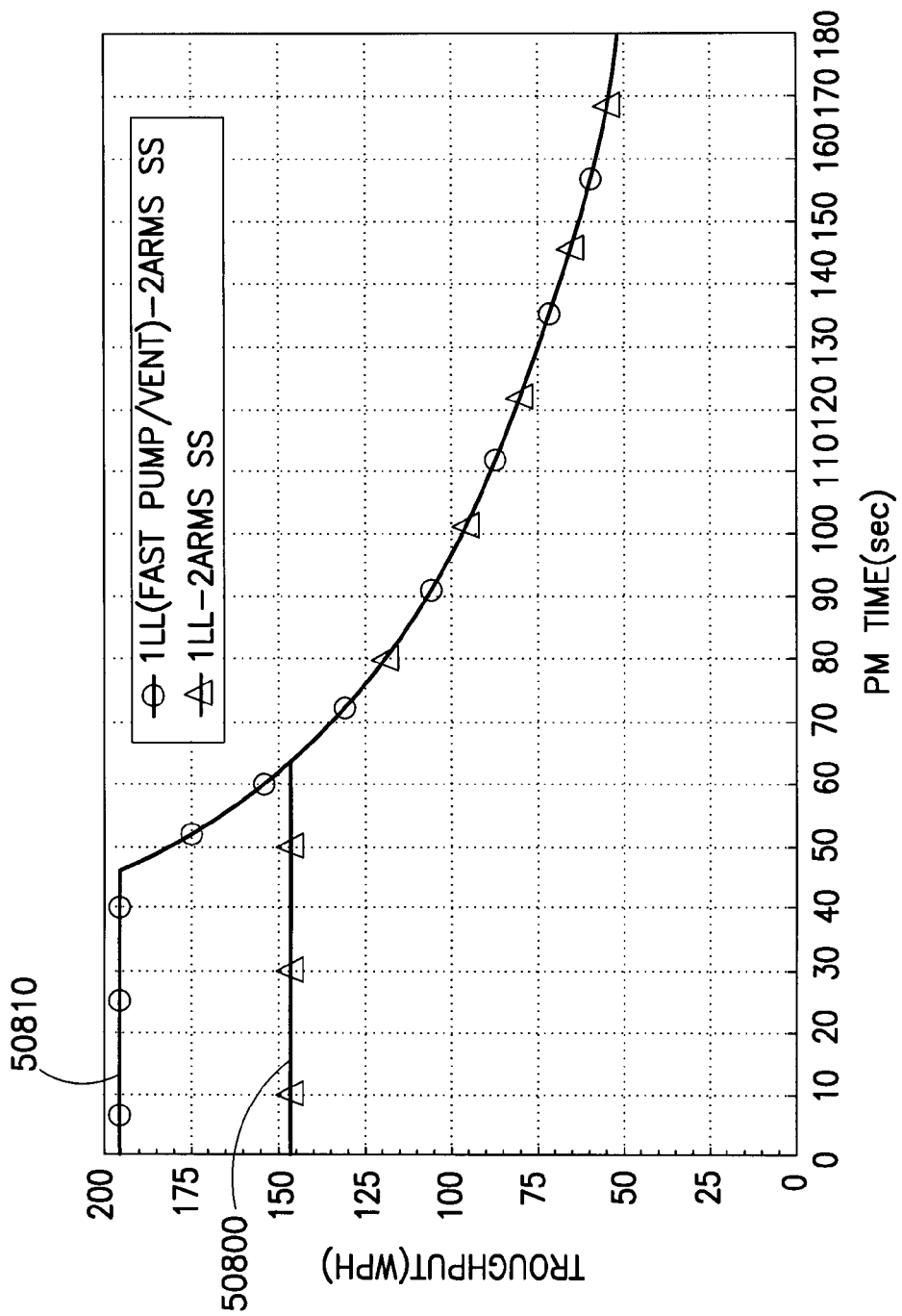
FIG. 26 illustrates a graph regarding substrate throughput in accordance with an exemplary embodiment.

In operation the transport 50721 transfers a substrate(s) into load lock module 50700 through an open atmospheric valve coupling the EFEM 50720 and load lock module 50700 (Block 50750). The load lock module 50700 is isolated from the EFEM 50720 and is pumped down to vaccum for interfacing with the vacuum back end 50710 (Block 50751). A slot valve coupling the load lock module 50700 and the back end 50710 is opened allowing transport 50711 to swap substrate (s) in to/out of the load lock module 50700 (Block 50752). The load lock module 50700 is isolated from the back end 50710 and is vented for interfacing with the EFEM 50720 as described above (Block 50753). While the load lock module 50700 is interfacing with the EFEM 50720 the transport 50711 in the back end 50710 swaps substrate(s) in to/out of the processing modules PM. The processed substrates are returned to the load lock module 50700 while unprocessed substrates are taken from the load lock module 50700 in subsequent load lock swap cycles (e.g. Block 50754). As can be seen in FIG. 25, the load lock module 50700 is configured such that the venting and pumping cycle time 50760 is substantially the same as (or less than) the cycle time for processing a substrate in the back end 50710 which, for example, maximizes substrate throughput through the processing tool 50790. In accordance with the exemplary embodiments, the substrates removed from the processing modules may not have to be buffered before they are passed through the load lock 50700 and transported back to, for example, the load ports (or to any other suitable portion of the tool 50790). For example, referring to FIG. 26 a comparison is shown with respect to a processing tool having a conventional load lock module and a processing tool having a load lock module in accordance with the exemplary embodiments. It is noted that all other parts of the processing tools, other than the load lock modules, used for generating the chart in FIG. 26 are substantially identical. As can be seen in FIG. 26 and for exemplary purposes, throughput of wafers for the conventional processing tool with a conventional load lock module is about 150 wafers (substrates) per hour as represented by line 50800 whereas throughput of the processing tool having a load lock module in accordance with the exemplary embodiments is about 200 wafers per hour as represented by line 50810.

In accordance with the exemplary embodiments, the initial temperature of the gas within the load lock chamber, before pumping, may be sufficiently raised so that as the gas adiabatically expands the temperature does not fall below a predetermined point where particles form during pumping of the load lock chamber. The internal volume may also be optimized to allow for faster venting times as well as to increasing the convective heat transfer from, for example, the chamber walls to the gas within the load lock module to prevent or minimize particle generation during pump down. The vent valves of the load lock module 50100 may also be optimized to prevent particle formation during venting as described above. Any suitable combination of these features may allow for higher pumping speeds during the pump down and venting cycles, which may allow for a higher substrate throughput through the load lock module 100 as described herein.

In one aspect of the disclosed embodiment, a semiconductor processing tool is disclosed. The semiconductor processing tool having a frame forming at least one chamber with an opening and having a sealing surface around a periphery of the opening, a door configured to interact with the sealing surface for sealing the opening, the door having sides substantially perpendicular to the door sealing surface and substantially perpendicular to a transfer plane of a substrate transferred through the opening, and at least one drive located on the frame to a side of at least one of the sides that are substantially perpendicular to the door sealing surface and substantially perpendicular to the transfer plane of the substrate transferred through the opening, the at least one drive having actuators located at least partially in front of the sealing surface and the drive actuators being coupled to at least one of the sides of the door for moving the door to and from a sealed position. The at least one drive is located outside of a substrate transfer zone for transferring substrates into and out of the at least one chamber through the opening.

It should be understood that the exemplary embodiments may be used individually or in any combination thereof. It should also be understood that the foregoing description is only illustrative of the embodiments. Various alternatives and modifications can be devised by those skilled in the art without departing from the embodiments. Accordingly, the present embodiments are intended to embrace all such alternatives, modifications and variances that fall within the scope of the appended claims.

What is claimed is:

1. A semiconductor processing tool comprising:
   a frame forming at least one chamber with an opening and having a sealing surface around a periphery of the opening;
   a door configured to interact with the sealing surface for sealing the opening, the door having lateral sides substantially perpendicular to the door sealing surface and substantially perpendicular to a transfer plane of a substrate transferred through the opening; and
   at least one drive located on the frame at least partially laterally alongside of at least one of the lateral sides that are substantially perpendicular to the door sealing surface and substantially perpendicular to the transfer plane of the substrate transferred through the opening, the at least one drive having actuators located at least partially in front of the sealing surface and the drive actuators being coupled to at least one of the sides of the door for moving the door to and from a sealed position;

wherein the at least one drive is located outside of a substrate transfer zone for transferring substrates into and out of the at least one chamber through the opening.

2. The semiconductor processing tool of claim 1, wherein drive links couple the door to the actuators, the drive links being located in front of and substantially parallel to the sealing surface.

3. The semiconductor processing tool of claim 1, wherein the actuators comprise modular assemblies configured to be removably mounted on the frame.

4. The semiconductor processing tool of claim 1, wherein the actuators comprise one or two axes of motion and are configured to move the door away from the sealing surface for moving the door from the sealed position.

5. The semiconductor processing tool of claim 1 wherein the door is an atmospheric door or vacuum slot valve.

6. The semiconductor processing tool of claim 1, wherein the sealing surface is removable from the frame.

7. The semiconductor processing tool of claim 1 further comprising a removeable insert coupled to the frame and at least one insert seal wherein
the frame has a recess and the opening of the at least on chamber is located within the recess for accessing a respective one of the at least one chamber,
the removable insert having an outer peripheral portion configured to fit within the recess and an inner channel portion being of unitary construction with the outer peripheral portion and configured to fit at least partially within the opening of the at least one chamber, the outer peripheral portion forming the sealing surface, and
the least one insert seal being located in the recess and circumscribing each opening of the at least one chamber, least one the at least one insert seal being distinct from the insert and configured to interact with the insert and form a seal between the insert and the frame.

8. The semiconductor processing tool of claim 7, wherein the at least one chamber is configured to hold a controlled environment, the insert seal being configured to seal the controlled environment from an external environment different from the controlled environment.

9. The semiconductor processing tool of claim 7, wherein the outer peripheral portion extends beyond the periphery of the door.

10. The semiconductor processing tool of claim 7, wherein the opening of the at least one chamber one her is sized to provide minimal clearance for passage of at least one substrate and at least a portion of a transport carrying the at least one substrate.

11. The semiconductor processing tool of claim 1, further comprising:
at least one heating element integrally embedded within walls of the at least one chamber and between inner and outer wall surfaces and configured to heat the chamber walls.

12. The apparatus of claim 11, wherein the walls of the at least one chamber are contoured to follow a path of a substrate through the isolatable chamber with minimized clearance between the substrate and the walls.

13. The apparatus of claim 11, wherein the walls are further configured to maintain an initial gas temperature of a gas within the at least one chamber during a pump down cycle such that a gas temperature decrease from adiabatic expansion during pump down remains above a predetermined point to minimize particle formation within the at least one chamber.

14. The apparatus of claim 11, further comprising a vacuum system configured to pump down the at least one chamber.

15. The apparatus of claim 11, further comprising at least one vent valve configured to maximize a volumetric flow of gas into the at least one chamber where the volumetric flow of gas has a low uniform gas velocity to minimize particle formation during a venting cycle of the at least one chamber.

16. The apparatus of claim 15, wherein the at least one chamber is configured such that a pump down cycle and the venting cycle occurs within a time for processing a substrate in a processing module connected to the at least one chamber.

17. The apparatus of claim 11, wherein an internal volume of the at least one chamber is configured to minimize venting cycle times of the isolatable chamber.

18. The apparatus of claim 11, further comprising a substrate processing apparatus located within the at least one chamber.

19. The apparatus of claim 11, further comprising a vent gas source configured to heat a gas to a predetermined temperature before introducing the gas into the at least one chamber.

20. The apparatus of claim 11, wherein the at least one heating element is arranged to form a temperature gradient within the at least one chamber to effect a predetermined direction of particle flow.

* * * * *